US006215408B1

(12) United States Patent
Léonard et al.

(10) Patent No.: US 6,215,408 B1
(45) Date of Patent: Apr. 10, 2001

(54) VIBRO-ACOUSTIC SIGNATURE TREATMENT PROCESS IN HIGH-VOLTAGE ELECTROMECHANICAL SWITCHING SYSTEM

(75) Inventors: François Léonard, Montréal; Marc Foata, Varennes; Claude Rajotte, Longueuil, all of (CA)

(73) Assignee: Hydro-Quebec, Montreal (CA)

( * ) Notice: Subject to any disclaimer, the term of this patent is extended or adjusted under 35 U.S.C. 154(b) by 0 days.

(21) Appl. No.: 09/302,287

(22) Filed: Apr. 30, 1999

(30) Foreign Application Priority Data

Jan. 22, 1999 (CA) ................................................. 2258223

(51) Int. Cl.$^7$ ..................................................... G08B 21/00
(52) U.S. Cl. ........................... 340/644; 340/683; 324/424; 324/415
(58) Field of Search ..................................... 340/683, 680, 340/644, 635, 511, 540; 324/424, 415

(56) References Cited

U.S. PATENT DOCUMENTS

| 4,159,446 | 6/1979 | Darrel et al. | 324/424 |
| 5,419,197 | 5/1995 | Ogi et al. | 73/659 |
| 5,629,864 | 5/1997 | Noe et al. | 364/506 |

FOREIGN PATENT DOCUMENTS

| 42 17 065 A1 | 11/1993 | (DE) . |
| 42 17 105 A1 | 11/1993 | (DE) . |
| 0 572 767 A2 | 12/1993 | (EP) . |
| WO 97/34161 | 9/1997 | (WO) . |

*Primary Examiner*—Daniel J. Wu
*Assistant Examiner*—Sihong Huang
(74) *Attorney, Agent, or Firm*—Foley & Lardner

(57) ABSTRACT

In the present method and apparatus for processing a vibro-acoustic signal emitted by a high-voltage switching system, the vibro-acoustic signal is converted into a digital signal. The digital signal is rectified and the resulting rectified signal is applied to a convolutional filter with a spectral window to produce a smoothed signal. The smoothed signal is decimated to produce a decimated signal representing an envelope of the vibro-acoustic signal. A time realignment of the decimated signal is carried out with respect to a reference signature to produce a realigned signal. Time deviation values generate an alarm if they exceed a limit threshold. The realigned signal is added as a factor of means providing a reference signature and an actualized signature. Variances of the realigned signal are calculated with respect to the reference and actualized signatures. The realigned signal is compared with the actualized and reference signatures to detect a gradual behavior change or a sudden defect, taking the variances into consideration.

64 Claims, 41 Drawing Sheets

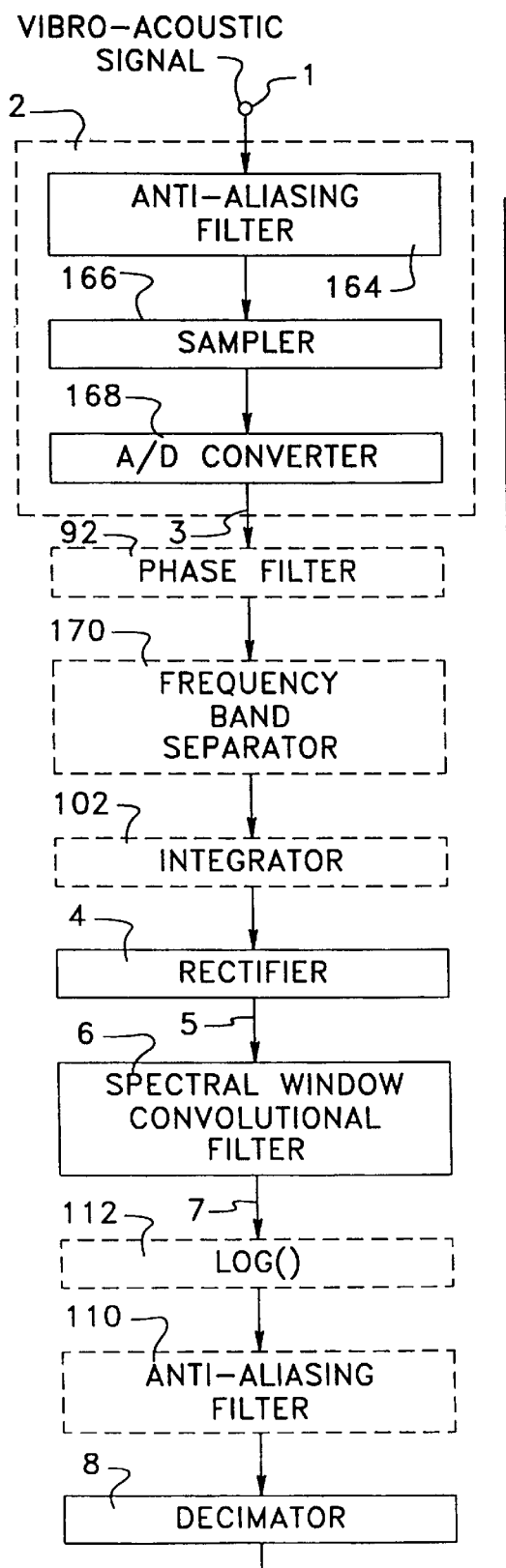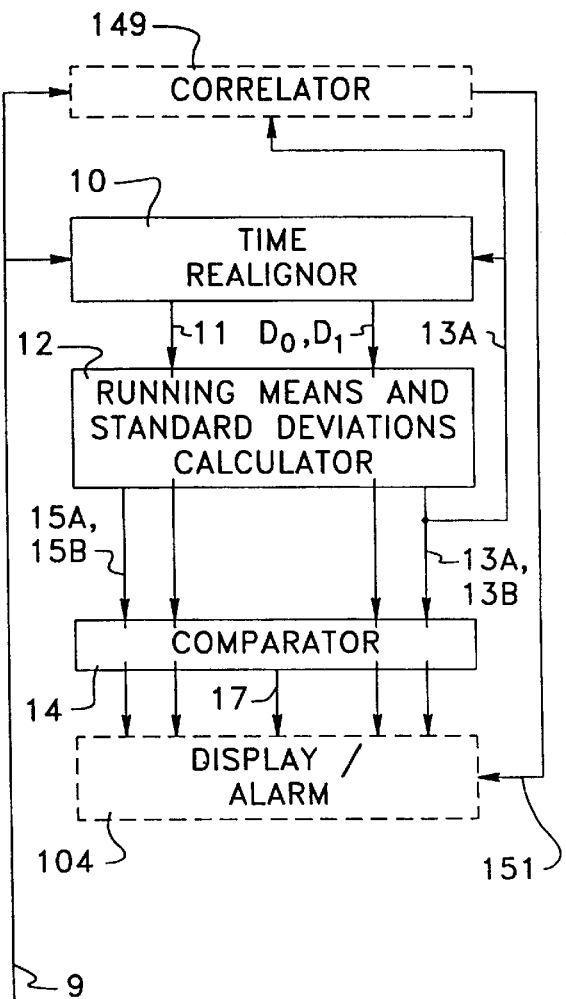
FIG. 1

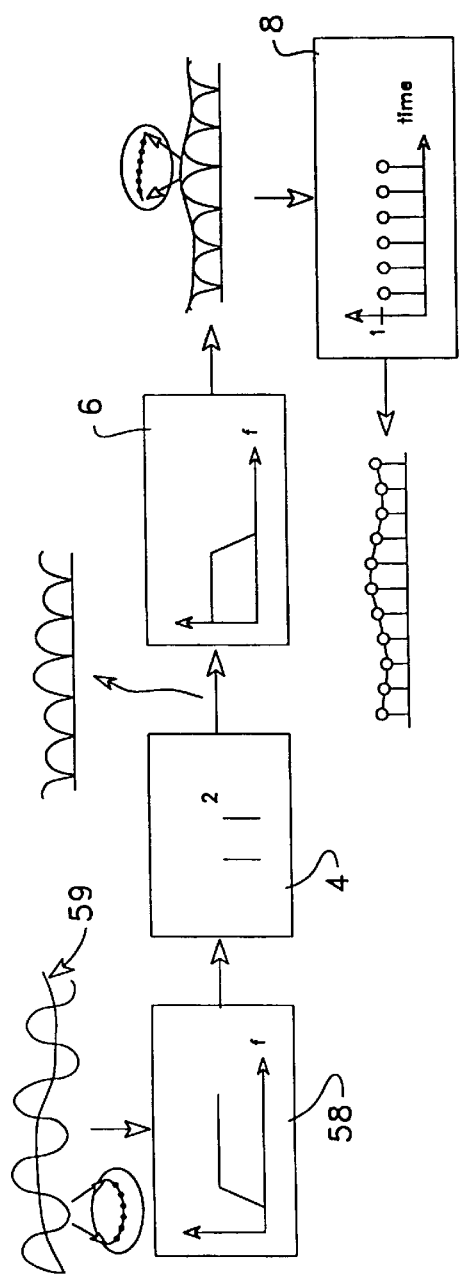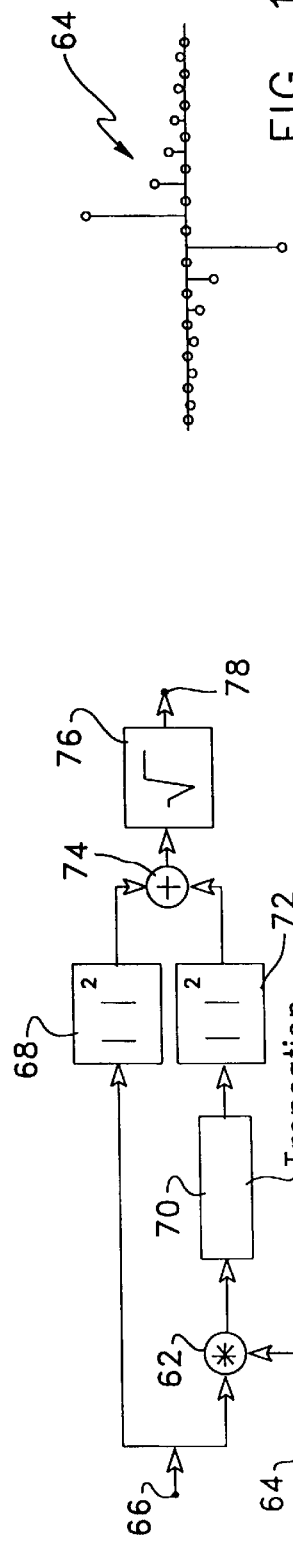

CUT THE BEGINNING AND THE END OF THE VECTOR TO NOT COMPARE A VALUE WITH ZERO OR A WRONG INTERPOLATED VALUE COMING FROM GIBB PHENOMENON AT EXTREMITIES.

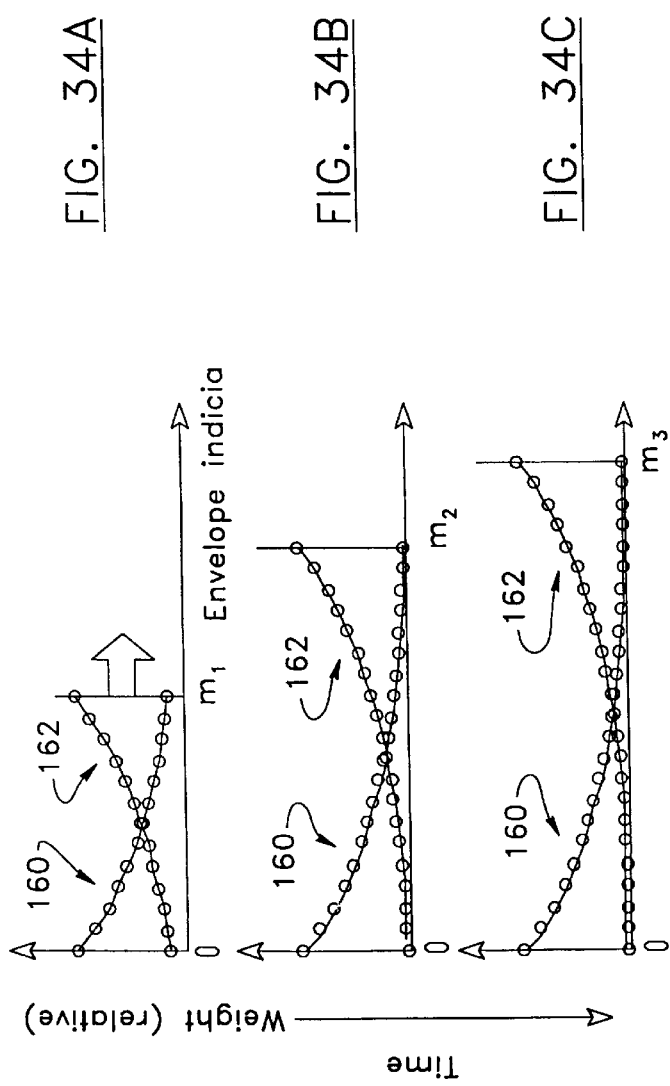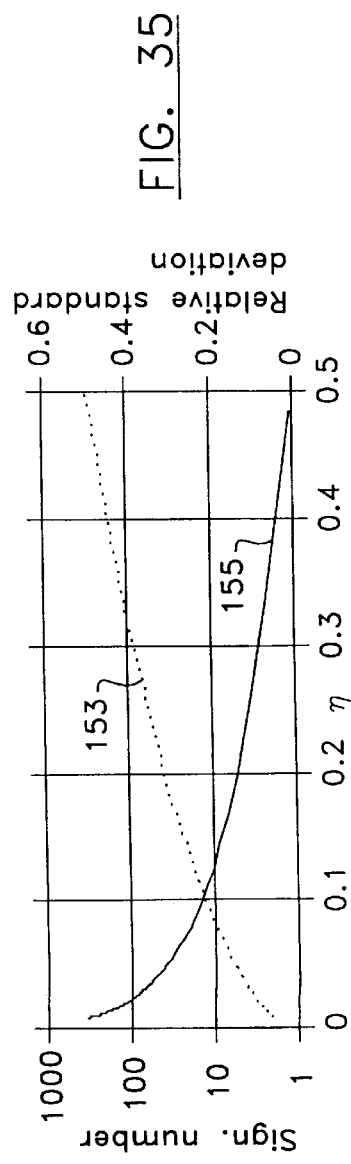

VIBRO-ACOUSTIC SIGNATURE TREATMENT PROCESS IN HIGH-VOLTAGE ELECTROMECHANICAL SWITCHING SYSTEM

FIELD OF THE INVENTION

The invention relates in general to the monitoring of high-voltage switching equipment in an electrical network, and more particularly to a method and an apparatus for processing a vibro-acoustic signal generated by a high-voltage switching system.

With the invention, it is possible to perform a monitoring in a continuous fashion in the case of a permanent system, or in a periodic fashion in the case of a portable system, or yet to perform a diagnosis, of tap changers, circuit breakers or electrical power transport interrupters.

BACKGROUND

There presently exist some products for performing the monitoring of equipment on an electrical network.

The system having the commercial denomination "MONITEQ" of the service company Hydro-Québec, and the one called "INSITE"® of the company Doble Engineering Company, are both monitoring systems for circuit breakers that use various sensors, among other things, for pressure and humidity measurements. The pressure measurement provides a part of the dynamic during the operation of the circuit breaker, but this measurement is very different from the acceleration: the approach used in both cases is not of a vibro-acoustic type (i.e. acoustic signature). The approach by the pressure measurement is not applicable on other switching equipments, such as tap changers or interrupters.

The product having the commercial denomination "LTC-MAP" of the company Harley™, and the one called "SENTRY"® of the company QualiTROL® are intended for the transformer market, including tap changers, but not circuit breakers or interrupters. If they monitor several parameters like the position of a tap changer, the temperature differential and the motor's current, they however do not rely upon a vibro-acoustic approach, thereby leaving away a very appreciable diagnostic information source.

The company Programma also proposes a variety of circuit breaker monitoring and testing apparatuses. The following parameters are often tested on a circuit breaker: the closing and opening times, the resistance of the main contacts and the synchronisation of the contact operation, the contact travel and speed, etc. For this purpose, the measured values are compared to limit values specified by the manufacturer or values that have been established through experience by the organization in charge of the maintenance. In many cases, a signature consisting of different measurements taken when the circuit breaker is new is compiled. This signature can then be used as a reference for the subsequent measurements. Any noticed change clearly indicates a change in the condition of the circuit breaker. The tests are performed power-off. The system is not a monitoring system as such. It uses accelerometers temporarily mounted, for the test, on top of a power-off circuit breaker and relies upon a vibro-acoustic approach. However, the accelerometers must be positioned down the equipment, at the ground voltage, for the continuous monitoring of an interrupter. Since the distance between the sensor and the vibration source modifies the signal processing issue, a phase filter can be required to correct the phase dispersion amplified by a long path. The system of Programma extracts the time distorsion on the signature during a comparison with a reference signature, and uses this information for diagnostic purposes. However, the processing achieved by the system is based on the DTW (Dynamic Time-Warping) algorithm, known in the speech processing field, and which adjusts the signatures locally and not globally. The use of this algorithm provides a poorly reliable and poorly tolerant system with respect to, for example, the randomness of the electric arcing that is present under power-on conditions and of course absent under power-off conditions. Furthermore, the system of Programma does not provide for the possibility to work out means or averages since it measures the time distorsion without removing it from the signal; the signatures are not time realigned. In the absence of a mean, it is the dispersion of a signature ($\approx$30%) that will be indicative of the sensitivity of the method and not the dispersion of a mean of signatures. The reference signature is thus a prior signature or a typical signature for the type of equipment subjected to a test. Since the system of Programma compares raw signals and not envelopes, it cannot correct the time distorsion of a raw signal without altering its frequency content.

The international application published under the number WO 97/34161 in the name of ABB Research Ltd. shows an envelope analog (and not digital) extraction method depending upon a dimensionless calculation of a statistical excess $T_i$ including the constants $N_0$ and $N_f$, for an envelope (and not a vibration signal) sampled between 0.1 and 100 kHz. The system is designed to observe the signal in a 0–10 kHz band. Phenomenons that occur from 10 kHz are thus ignored, notwithstanding that a time realignment would be more accurate over 10 kHz. Furthermore, the system only carries out a first order time realignment, that is, a global alignment on the position of the signature. The method does not perform any interpolation, which limits the resolution of the realignment to the time sampling rate of 0.1 ms. The original mean is fixed. The acquisition duration of the system is merely in the order of 0.25 s while a longer duration (e.g. of more than 25 s) would allow to catch a wider market in the tap changers and the interrupters.

None of the known systems or apparatuses embodies vibro-acoustic signature treatment processes for tap changers nor interrupters. The processes intended for the circuit breakers are expensive and invasive.

One of the problems of the art resides in optimizing the parametrization of the comparison algorithm as a function of the signatures from different equipments.

SUMMARY

An object of the present invention is to provide a method for processing a vibro-acoustic signal emitted by a high-voltage switching system, which allows to optimize the signature comparison and the parametrization of this comparison for different equipments.

Another object of the present invention is to provide a device suitable for the working of the method, the device having a competitive cost, an efficiency, a robustness and a functional simplicity advantageous with respect to the prior art devices.

The method according to the present invention comprises the steps of:

(a) converting the vibro-acoustic signal into a digital signal;

(b) rectifying the digital signal to produce a rectified signal;

(c) applying a convolutional filter with a spectral window on the rectified signal to produce a smoothed signal;

(d) decimating the smoothed signal according to a predetermined decimation factor to produce a decimated signal representing an envelope of the vibro-acoustic signal;

(e) performing a time realignment of the decimated signal with respect to a reference signature to produce a realigned signal;

(f) adding the realigned signal as a factor of a mean to produce a reference signature, the mean having a predetermined reference signal for initial factor;

(g) adding the realigned signal as a factor of a mean to produce an actualized signature, the mean having the first realigned signal produced by the step (e) for initial factor;

(h) calculating variances of the realigned signal with respect to the reference signature and the actualized signature; and (i) comparing the realigned signal with the actualized signature and the reference signature to detect a gradual behavior change or a sudden defect, taking the variances into consideration.

The apparatus according to invention comprises:

a converting means for converting the vibro-acoustic signal into a digital signal;

a rectifying means for rectifying the digital signal and producing a rectified signal;

a filtering means for applying a convolution filter with a spectral window on the rectified signal and producing a smoothed signal;

a decimating means for decimating the smoothed signal according to a predetermined decimation factor and producing a decimated signal representing an envelope of the vibro-acoustic signal;

a realigning means for performing a time realignment of the decimated signal with respect to a reference signature and producing a realigned signal;

a first calculating means for adding the realigned signal as a factor of a mean to produce a reference signature, the mean having a predetermined reference signal for initial factor;

a second calculating means for adding the realigned signal as a factor of a mean to produce an actualized signature, the mean having the first realigned signal produced by the realigning means for initial factor;

a third calculating means for calculating variances of the realigned signal with respect to the reference and actualized signatures; and a comparing means for comparing the realigned signal with the actualized and reference signatures to detect a gradual behavior change or a sudden defect, taking the variances into consideration.

The invention has the advantage of being non intrusive, low cost and highly sensitive. A single external sensor is required. The symptoms are present in the information carried by the vibro-acoustic signal.

BRIEF DESCRIPTION OF THE DRAWINGS

A detailed description of the preferred embodiments of the invention will be given hereinafter in reference with the following drawings, in which like reference numerals refer to like elements:

FIG. 1 is a schematic diagram providing a synthesis of the method and the apparatus for processing a vibro-acoustic signal emitted by a high-voltage switching system according to the present invention;

FIG. 10 is a schematic diagram illustrating a circuit for extracting an envelope from an instantaneous power, according to the invention;

FIG. 11 is a schematic diagram illustrating a circuit suited to form the rectifier in FIG. 10, according to the invention;

FIG. 12 is a graph of the typical coefficients of the Hilbert convolutional filter in FIG. 11, according to the invention;

FIGS. 34A–C are graphs illustrating the time evolution weightings associated to running means, according to the invention;

FIG. 35 is a graph of the standard deviation and the transient response of a mean in number of signatures as a function of the weight, according to the invention;

DETAILED DESCRIPTION OF THE PREFERRED EMBODIMENTS

Figure 2:
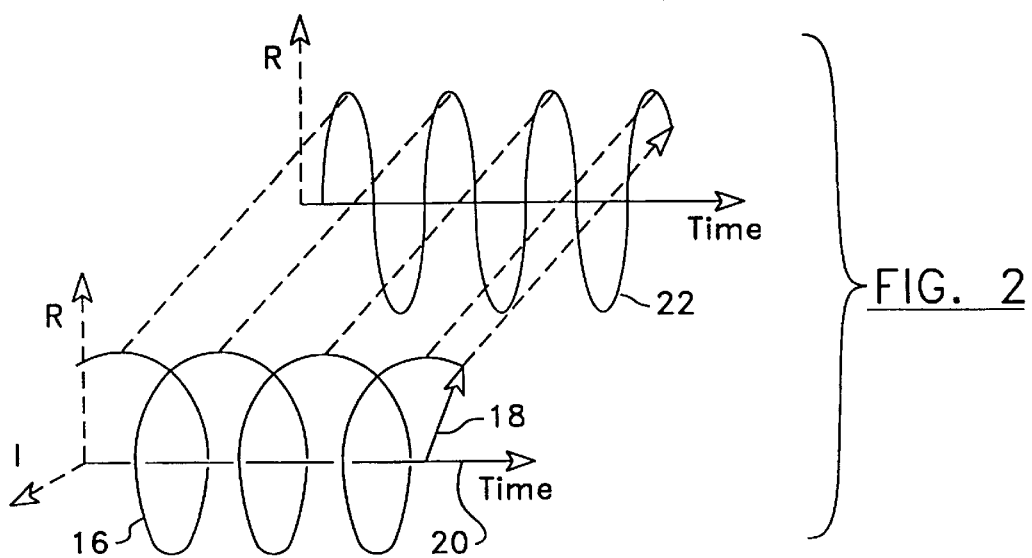
FIG. 2 is a schematic diagram showing the projection of an analytical signal and the envelope of the corresponding real signal.

Referring to FIG. 1, there is shown a schematic diagram that provides a synthesis of the method and the apparatus for processing a vibro-acoustic signal emitted by a high-voltage switching system, according to the present invention. The vibro-acoustic signal can be produced, for example, by an accelerometer (not illustrated in the figures) installed on the equipment to be monitored, or any other kind of sensors or transducers generating a signal representing a vibro-acoustic characteristic of the equipment subjected to the monitoring.

The blocks in dotted lines represent optional or facultative elements, or yet elements from an outer origin that can be combined to the apparatus circuit according to the invention.

In brief, the apparatus comprises at the input a conversion stage 2 to convert the vibro-acoustic signal 1 into a digital signal 3. A rectifying circuit 4 rectifies the digital signal 3 and produces a rectified signal 5. A filtering circuit 6 applies a convolutional filter with a spectral window on the rectified signal 5 and produces a smoothed signal 7. A decimation circuit 8 decimates the smoothed signal 7 according to a predetermined decimation factor and produces a decimated signal 9 representing an envelope of the vibro-acoustic signal, also called signature. A realigning circuit 10 performs a time realignment of the decimated signal 9 with respect to a reference signature 13A and produces a realigned signal 11. A calculating circuit 12 provides a first calculating means to add the realigned signal 11 as a factor of a mean to produce the reference signature 13A, the mean having a predetermined reference signal for initial factor. The calculating circuit 12 also provides a second calculating means to add the realigned signal 11 as a factor of a mean to produce an actualized signature 13B, the mean having the first realigned signal 11 produced by the realigning circuit 10 for initial factor. The calculating circuit 12 provides also a third calculating means to calculate variances 15A, 15B of the realigned signal with respect to the reference and actualized signatures 13A, 13B. A comparing circuit 14 compares the realigned signal 11 with the reference and actualized signatures 13A, 13B to detect a gradual behavior change or a sudden defect, taking the variances 15A, 15B into consideration, and to generate a warning signal 17.

The treatment method practiced with the above-mentioned apparatus follows the steps of:

(a) converting the vibro-acoustic signal 1 into a digital signal 3;

(b) rectifying the digital signal 3 to produce a rectified signal 5;

(c) applying a convolutional filter with a spectral window 6 on the rectified signal 5 to produce a smoothed signal 7;

(d) decimating the smoothed signal 7 according to a predetermined decimation factor to produce a decimated signal 9 representing an envelope of the vibro-acoustic signal;

(e) performing a time realignment of the decimated signal 9 with respect to a reference signature 13A to produce a realigned signal 11;

(f) adding the realigned signal 11 as a factor of a mean to produce the reference signature 13A, the mean having a predetermined reference signal for initial factor;

(g) adding the realigned signal 11 as a factor of a mean to produce an actualized signature 13B, the mean having the first realigned signal 11 produced by the step (e) for initial factor;

(h) calculating variances 15A, 15B of the realigned signal 11 with respect to the reference and actualized signatures 13A, 13B; and (i) comparing the realigned signal 11 with the reference and actualized signatures 13A, 13B to detect a gradual behavior change or a sudden defect, taking the variances 15A, 15B into consideration.

The calculation of the envelope of the vibratory signature appears among the first steps of the method. This function is fundamental and the precision of its execution has an impact on the precision of the execution of the other steps of the method; these other steps act as amplifiers that multiply the impact of the precision of the envelope calculation on the final result. It is a matter of finding the best envelope calculation, not for generating the true envelope of the signal, but for generating the most appropriate envelope in a monitoring context.

Referring to FIG. 2, mathematically, the envelope of an analytical signal $A(t) \, e^{-j\Theta(t)}$ represented by the numeral 16 corresponds to the amplitude $A(t)$. This amplitude is that of a vector 18 turning around a time axis 20. But this definition becomes more complicated for a real signal 22 where the latter will correspond to the projection of the corresponding analytical signal. Furthermore, in practice, the very low frequency signal is considered as the signal's drift and will not be considered in the envelope calculation. For example, the direct component has no practical use and should be discarded.

For some applications, one of the qualities of the envelope is to be independent from the phase relations between the various constituents of the original signal. However, for other applications, such as aging calculation on the mechanical components, it is the observed peak value, thus the phase coincidence of several waves of different amplitudes that must determine the envelope. The simple example of two superimposed wave packets is illustrative. In one case, an envelope equal to the sum of the envelopes of these wave packets is desired whereas in the other, the envelope of the sum of these packets is desired. In short, what is desired conditions the envelope calculation.

Figure 3:
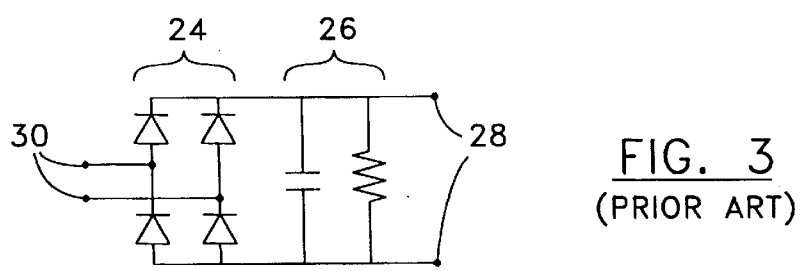
FIG. 3 is a simplified diagram of a prior art analog circuit providing the envelope of a signal.
Figure 4:
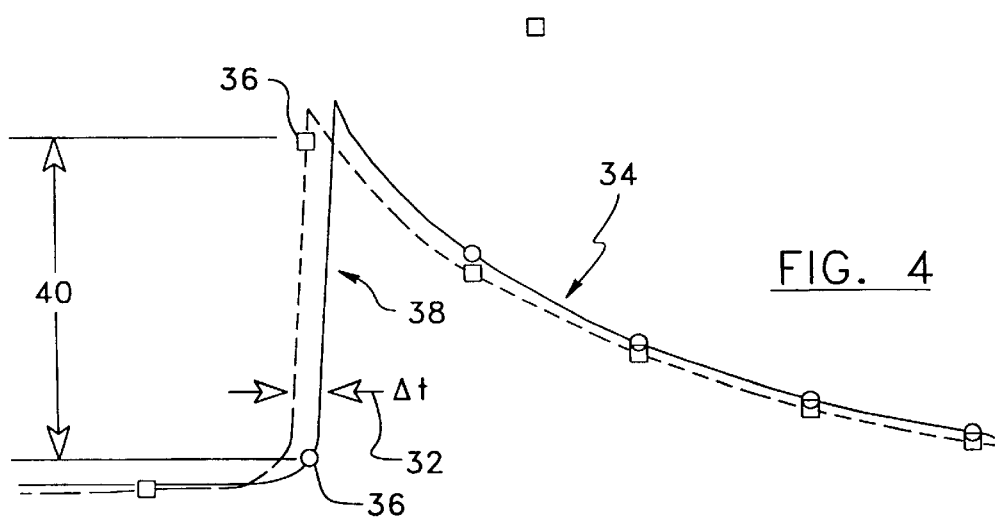
FIG. 4 is a schematic diagram showing the effect of a time displacement of a signal on a fraction of the sampling period.
Figure 5:
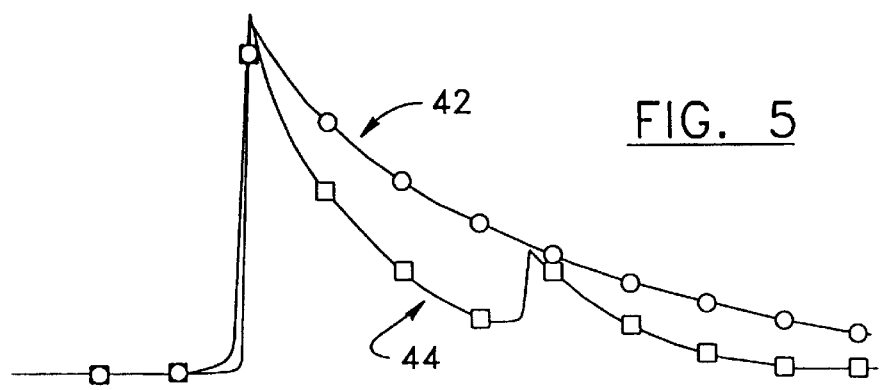
FIG. 5 is a schematic diagram showing the effect of two different time constants on transients.

Even before sampling a signal, an envelope can be analogically extracted thereof, like some prior art systems do, in order to minimize the processing burden on the digital circuit. FIG. 3 illustrates a simplified diagram of a prior art analog circuit for this purpose. The circuit comprises a diode bridge 24 coupled to a R-C circuit 26 in parallel, providing at the circuit's output 28 the envelope of the signal received at the circuit's input 30. In response to a pulse $a_0\delta(t-t_0)$, the circuit provides a voltage $a_0 e^{-(t-t_0)/RC} \cdot u_{-1}(t-t_0)$. In a real circuit, operational amplifiers are coupled to the diodes in order to limit the effect of the non-conduction thereof below 0.5 V. The equivalent digital function does not correspond exactly to an absolute value followed by an IIR ("Infinite Impulse Response") filter of first order; a comparator that only considers the amplitude signal exceeding the output voltage of the filter must be added in order to simulate the diodes. This choice has many drawbacks. The first concerns the non-respect of the sampling theorem. Indeed, the outputted envelope has a bandwidth similar to the original signal, with a content in the high frequencies slightly impaired. This signal cannot be sampled (if it is an analog signal) or decimated (if the signal is digital) without inducing spectral aliasing. Second, a transient attack located at the limit of decimation, will be sometimes present and sometimes absent from the content of the sample drawn after decimation. FIG. 4 shows that the slightest time displacement $\Delta t$ 32 of the signal 34 greatly affects the values of the samples 36 close to transients 38, the difference between two sample values 36 near the transient 38 being represented by the arrows 40. Third, referring to FIG. 5 illustrating the results for time constants respectively equal to R·C 42 and to 0.3 R·C 44, if the time constant of the R-C circuit 26 (illustrated in FIG. 3) is too long, events of smaller amplitudes will be hidden by the presence of a transient of a higher amplitude preceding them. Conversely, if the time constant is too short, there will be a risk for under-estimating the amplitude of a transient which appeared since the last sample drawn; this time constant must preferably be such that the amplitude of the response to a peak decreases only by some percentage from one sample to the other. Finally, a time constant too short amplifies the spectral aliasing.

The choice of the time constant R-C is related to the average damping of the measured vibrations. It is a matter of setting the time constant so that the associated decreasing exponential matches with the decrease of the vibration amplitude following a transient peak. This time constant will be shorter if it is high frequencies that dominate the vibrations, and conversely, it will be adjusted to be longer if it is low frequency modes that are perceived in the signal. When the low and high frequencies are simultaneously present, the average natural decrease is not exactly logarithmic; it is more important in nepers/s at the beginning and decreases with the dominance of the low frequencies at the end. In practice, the R-C constant will have to be adjusted for each installation as a function of the observed dampings, since the frequencies and dampings of the dominating modes vary from one equipment to the other. Typically, a choice between 3 and 10 ms must be expected for detection over a 0–10 kHz band.

Figure 6:
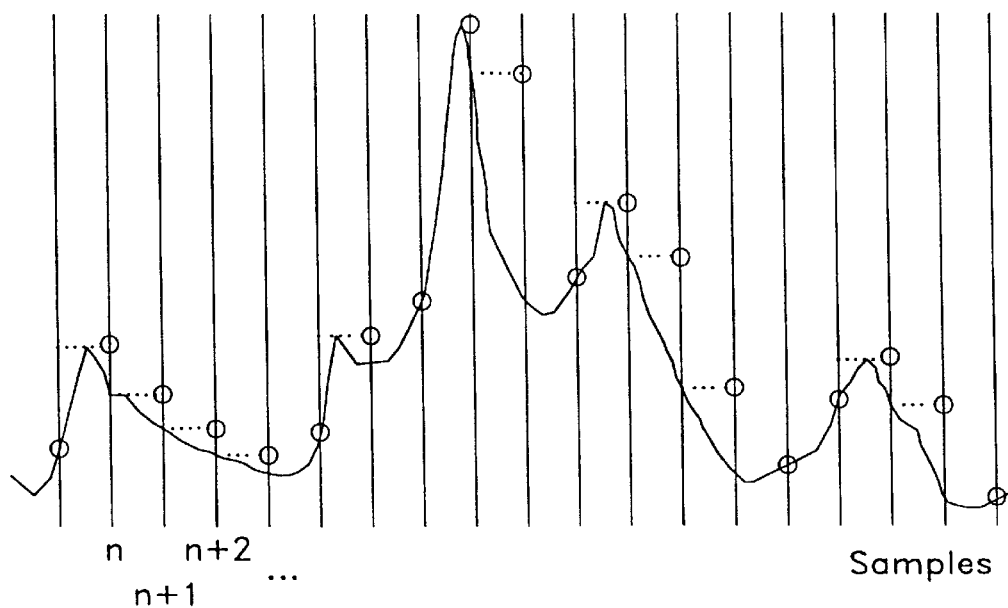
FIG. 6 is a graph showing an envelope extraction by carry of the peak value in the decimation interval.

Referring to FIG. 6, there is depicted an envelope extraction by carry over of the peak value in the decimation interval (digital processing) or in the interval of the sampling period (analog processing).

The envelope calculation from the signal peaks is basically asymmetrical, systematically spreading the transients toward the future. It is the presence of the R-C or IIR filter (26) that creates this non symmetrical spreading. However, in a digital approach, the filter can be easily removed and only the observed peak value in the decimation interval can be carried over. There also exists an analog circuit capable to perform this envelope extraction. More complex, this circuit uses a sample and hold arrangement that holds the observed peak value in the interval. This approach provides a peak envelope that contains more details and which eliminates the need to make a compromise on the time constant.

Figure 7A:
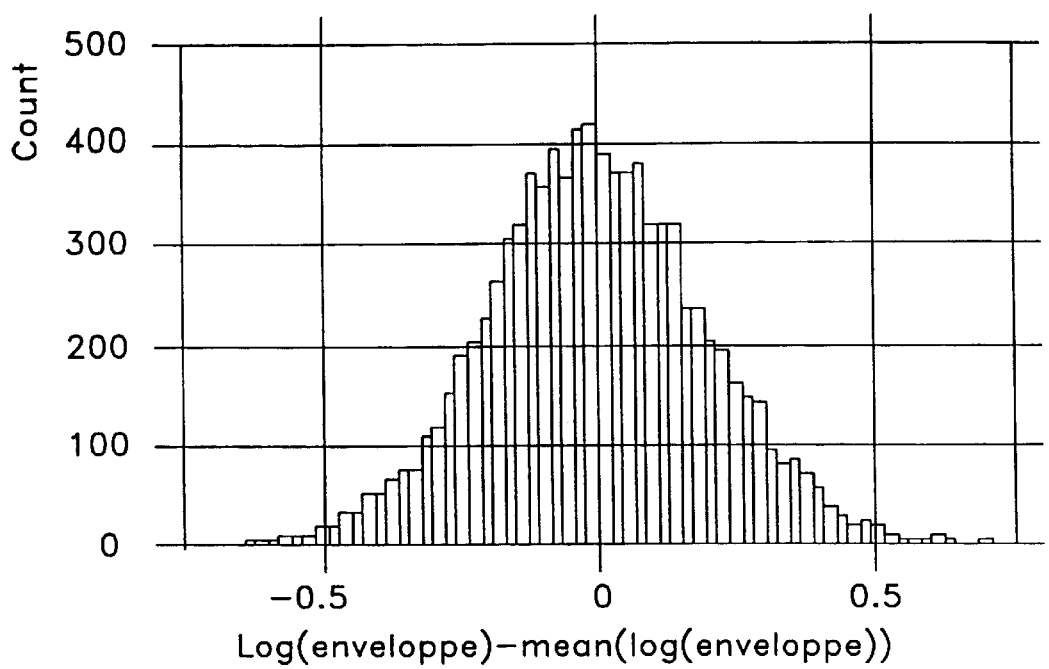
FIGS. 7A and 7B are histograms of the mean deviation for envelopes extracted from a peak value and an effective power (RMS) respectively.
Figure 7B:
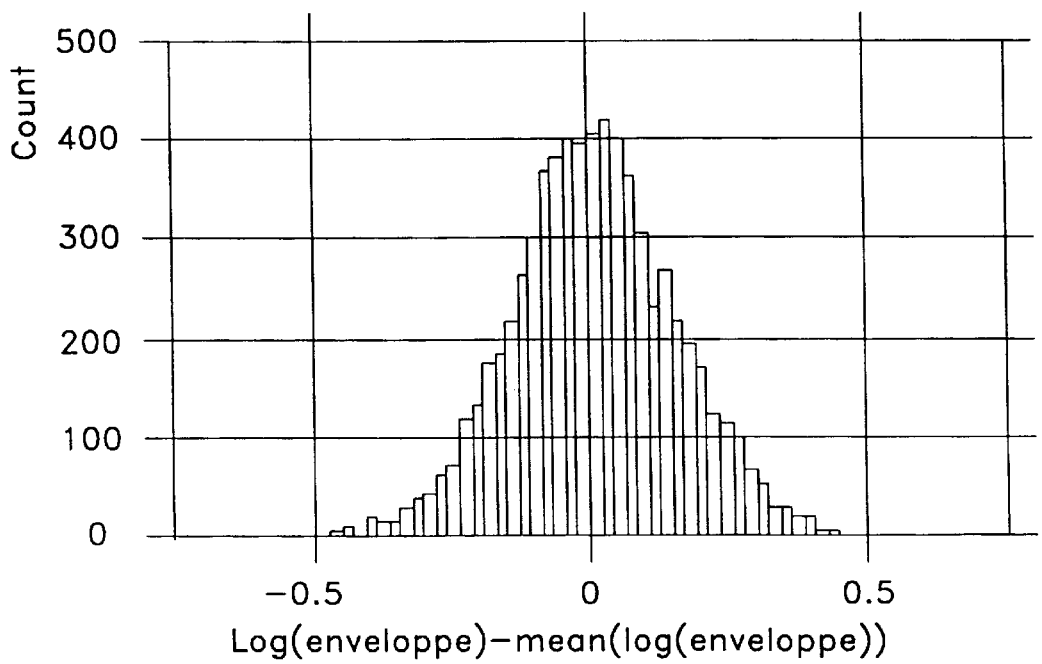

Referring to FIGS. 7A and 7B, there is shown histograms of the mean deviation for logarithms of envelopes extracted from the peak value (with RC=5 ms) and logarithms of envelopes extracted from the effective power (RMS), respectively. From a statistical standpoint, on a logarithmic scale, the peak envelopes and the RMS envelopes all present a distribution close to the one of Laplace-Gauss (normal law). For example, FIGS. 7A and 7B allow to compare the mean deviations for peak envelopes with the mean deviations for RMS envelopes obtained by Hilbert transform (discussed hereinafter). The standard deviation is slightly lower for the envelopes obtained by Hilbert transform (FIG. 7B). It should be noted that on a logarithmic scale, the difference between a peak and a RMS value appears as an additive constant and not a scale multiplicative factor; the reduction of the above observed standard deviation is thus independent from the type of measurement, RMS, peak value or peak-to-peak value.

Figure 8:
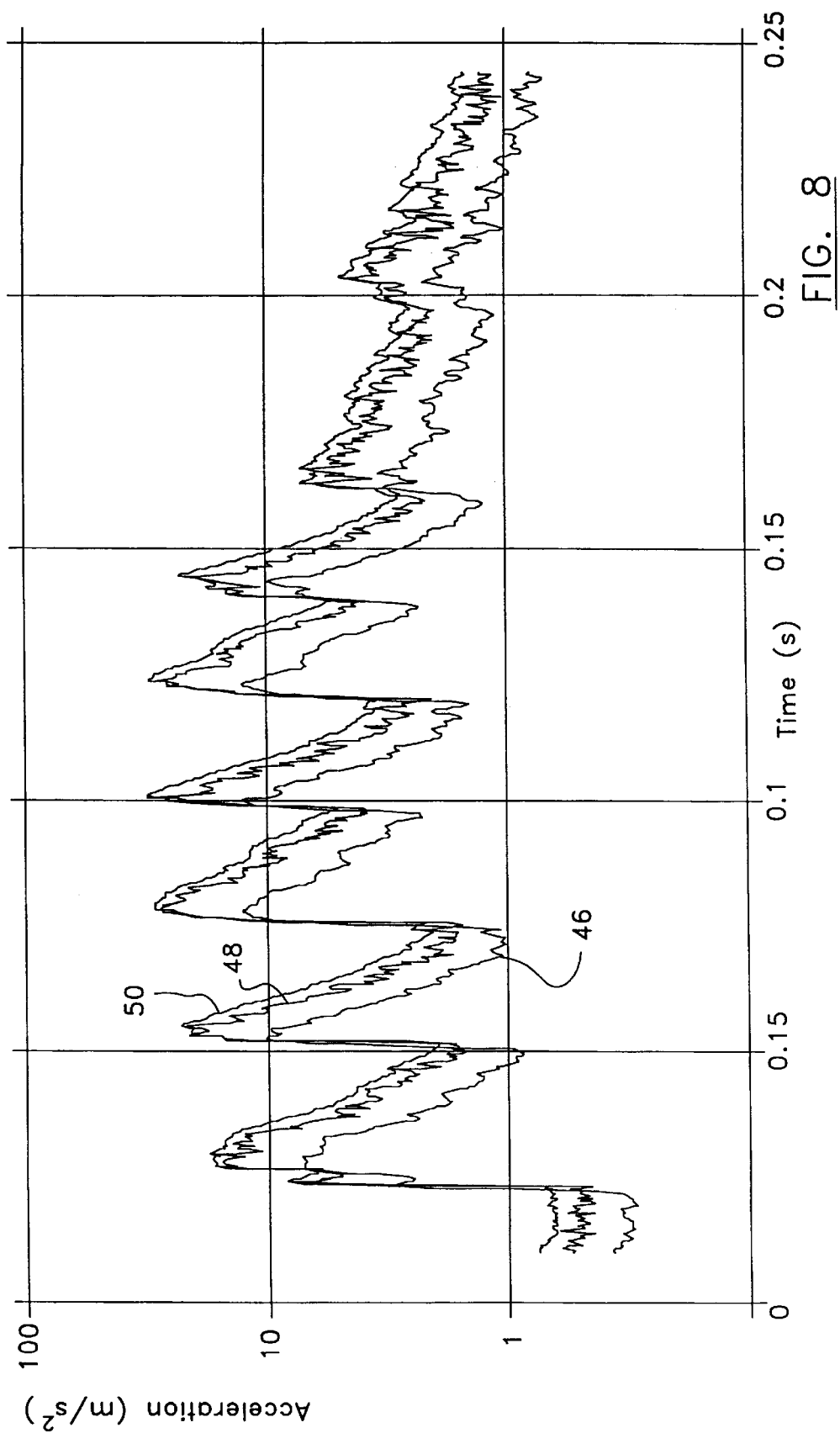
FIG. 8 is a comparative graph of the means of envelopes extracted from an effective power (RMS) and from an observed peak value and peak envelopes.
Figure 9:
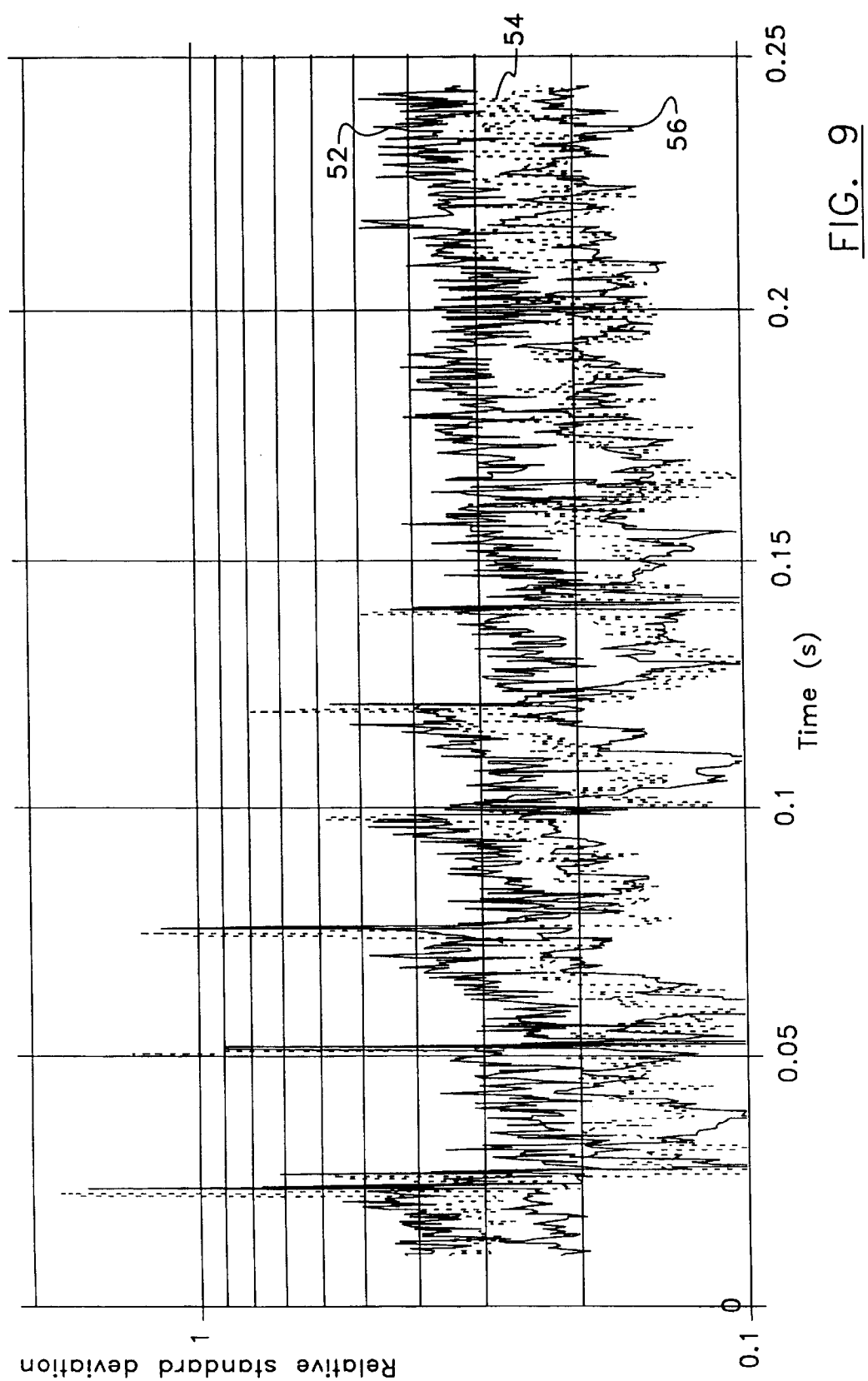
FIG. 9 is a comparative graph of the relative standard deviations between an envelope extracted from an effective power and from a peak value and a peak envelope.

Referring to FIG. 8, there is shown means of envelopes extracted from the instantaneous effective power (RMS) 46, envelopes extracted from the observed peak value 48 (for a decimation of 20) and peak envelopes 50 typically provided by a circuit such as the one illustrated in FIG. 3. The mean of peak envelopes 50 is the one that shows the less details and has the highest amplitude. The lack of details of the mean of peak envelopes 50 is more perceptible on a linear scale. The means of observed peak envelopes 48 and RMS envelopes 46 are similar notwithstanding a multiplicative factor, called peak factor. In the monitoring of rotating machines, this factor is well-known as a defect indicia and is defined as being the peak to RMS ratio. A sinusoidal wave provides 1.414, thus the square root of 2, for peak factor. However, for this vibro-acoustic signature, the peak factor is between 1.6 and 2.0. The resolution, the present details, and the dynamic (max/min of a transient) are also similar between these types of envelopes. However, a difference clearly appears when the relative standard deviations of each envelope are compared, as illustrated in FIG. 9, where there is shown the relative standard deviations on an observed peak envelope 52, on a RMS envelope 54 and on a peak envelope 56 resulting from a circuit as shown in FIG. 3 (with RC=5 ms). The dispersion of the envelope extracted from the peaks is 1.8 times higher in average whereas the two other types of envelopes show dispersions of same amplitude. In fact, in this example, the peak envelope obtained by the analog circuit of FIG. 3 has a dispersion slightly lower than the RMS envelope, the cost to pay for this low dispersion being a loss of details on the signature. A reduction of the time constant RC increases at the same time the detail and the dispersion of the peak envelope. It will be seen hereinafter that the RMS envelope presents the same behavior as a function of the bandwidth of the convolutional filter 6 (illustrated in FIG. 1) used to smooth the envelope after rectification of the wave.

The improved dispersion of the envelope extracted from the peak value results in part from its sensitivity to the phase between the vibro-acoustic wave packets and its sensitivity to noise. The other contribution to the dispersion results from transient attacks as illustrated in FIG. 4; moreover, the peak factor exceeds 3.0 on the straight part of the peaks . . . As presented hereinafter, this contribution can be reduced in most part with a time realignment, according to the invention.

The envelope extracted from the peak value, or from the analog type peak calculation, has not only a significatively higher dispersion for a same level of details, but, in addition, it cannot be contemplated in a multiband approach. Indeed, in multiband, the signal must be routed as a function of the frequency. A packet of waves may be found in a band whereas an other may be routed in another band. With an envelope extracted from the power, the sum of the squares of envelopes of each frequency band will give back the square of the envelope of the original signal, prior to multiband separation. However, the sum of the squares of envelopes extracted from observed peaks in each frequency band, will not give back the square of envelope extracted from the peaks in the original signal.

Three different calculations have been explored for the estimation of the envelope produced from the instantaneous power.

Referring to FIG. 10, there is shown an example of a circuit for the calculation of the envelope from the instantaneous power, according to an embodiment of the invention. The circuit comprises, in the order, a high pass filter 58, a rectifier 4, a low pass filter 6 (also designated as a convolutional filter with spectral window) and a decimator 8. The high pass filter 58 is used to withdraw the signal drift 59, i.e. the direct component and the low drifts of the instrumentation, and even the vibration harmonics at 120 Hz in an AC network application. At least three types of rectifiers 4 can be used: the absolute value, the square raising operation and the Hilbert transform. The absolute value provides a biased estimate of the RMS amplitude because the ratio "square root of two" is not obtained between the peak value and the RMS value. For a sinusoid, the raising to square operation, averaged by the low pass filter 6, provides a good estimate of the instantaneous power. It is a simple matter of multiplying this power by 2 and taking the square root to obtain a corresponding peak envelope, or yet, simply taking the square root to obtain the RMS amplitude envelope (as hereinbelow presented). Finally, the Hilbert transform allows to recover the magnitude of the instantaneous amplitude vector without generation of rectification harmonics. The processing from the instantaneous power of the signal is more accurate when it is carried out digitally on all these steps.

Referring to FIG. 11, there is shown, under a schematic diagram form, an example of a circuit suitable to embody the rectifier 4 illustrated in FIG. 10. The circuit uses a convolutional Hilbert transform 62, with Hilbert filter coefficients 64 as those illustrated in FIG. 12 for a parameter $N_{Hilbert}$ set to 6 (in practice, the value of this parameter is usually set between 10 and 20). These coefficients correspond to the ambiguity function (y=1/x) with intercalated zeros. In its synthetic form, the circuit exhibits a first circuit branch comprising an operator 68 that produces the square of the real part of the vibro-acoustic signal received at the input 66. A second circuit branch comprises the convolutional Hilbert filter 62, a truncation operator 70 and an operator 72 that produces the square of the imaginary part of the signal. An adder 74 adds both squares produced by the operators 68 and 72, the obtained sum being passed in a square root operator 76 that provides the instantaneous peak amplitude at the output 78. The Hilbert transform 62 allows to find the imaginary component corresponding to the real signal; the vectorial addition of the squares then provides an analytical signal where the magnitude of the vector corresponds to the instantaneous amplitude (see FIG. 2). In other words, if the signal is a cosinus, the Hilbert transform converts it into a sinus, which allows to find the amplitude since a= $\sqrt{(a \sin)^2 + (a \cos)^2}$. The truncation 70 allows to readjust the time frame after the convolution 62.

Figure 13:
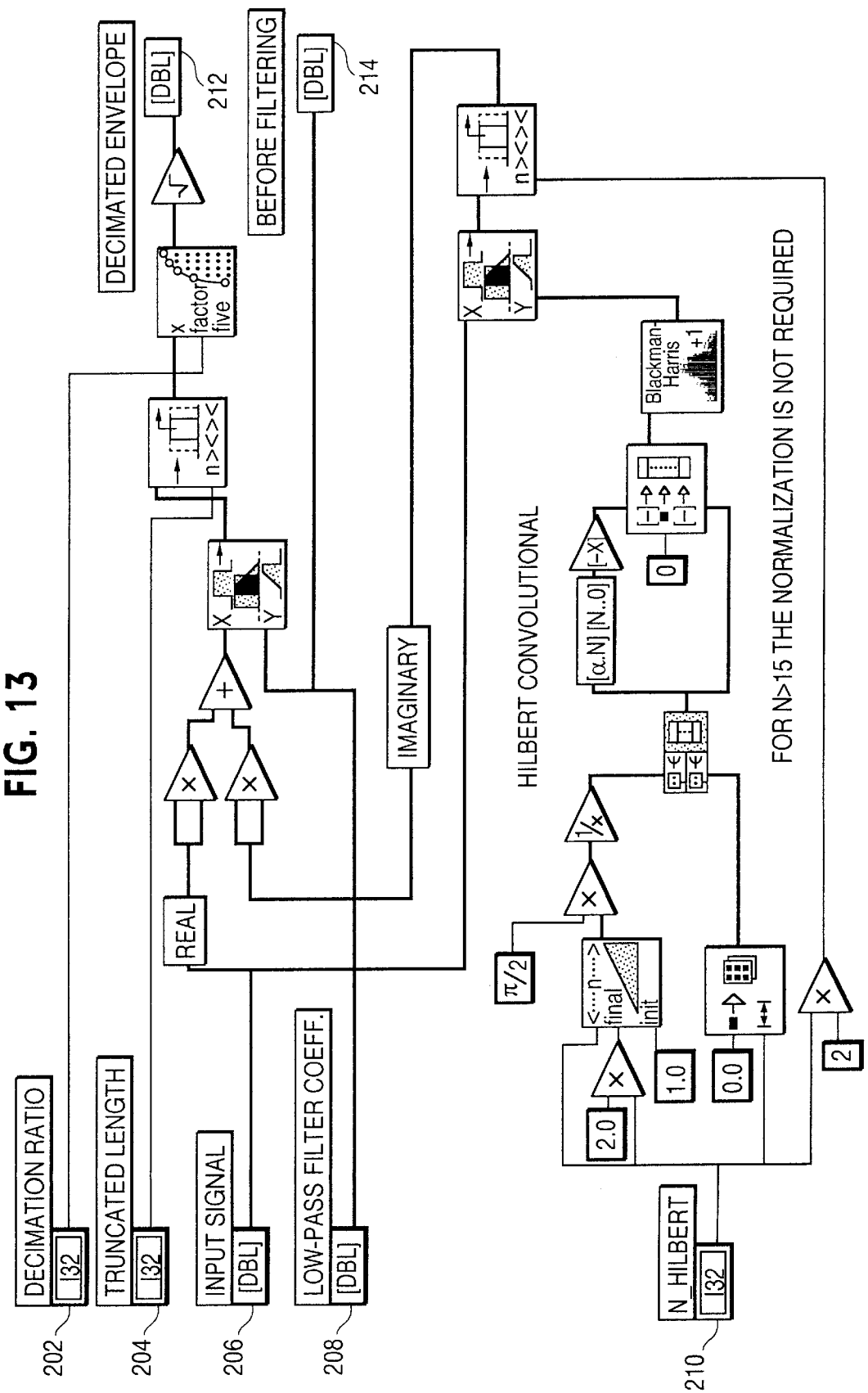
FIG. 13 is a block diagram illustrating a function carrying out a Hilbert transform envelope calculation, according to the invention.
Figure 14:
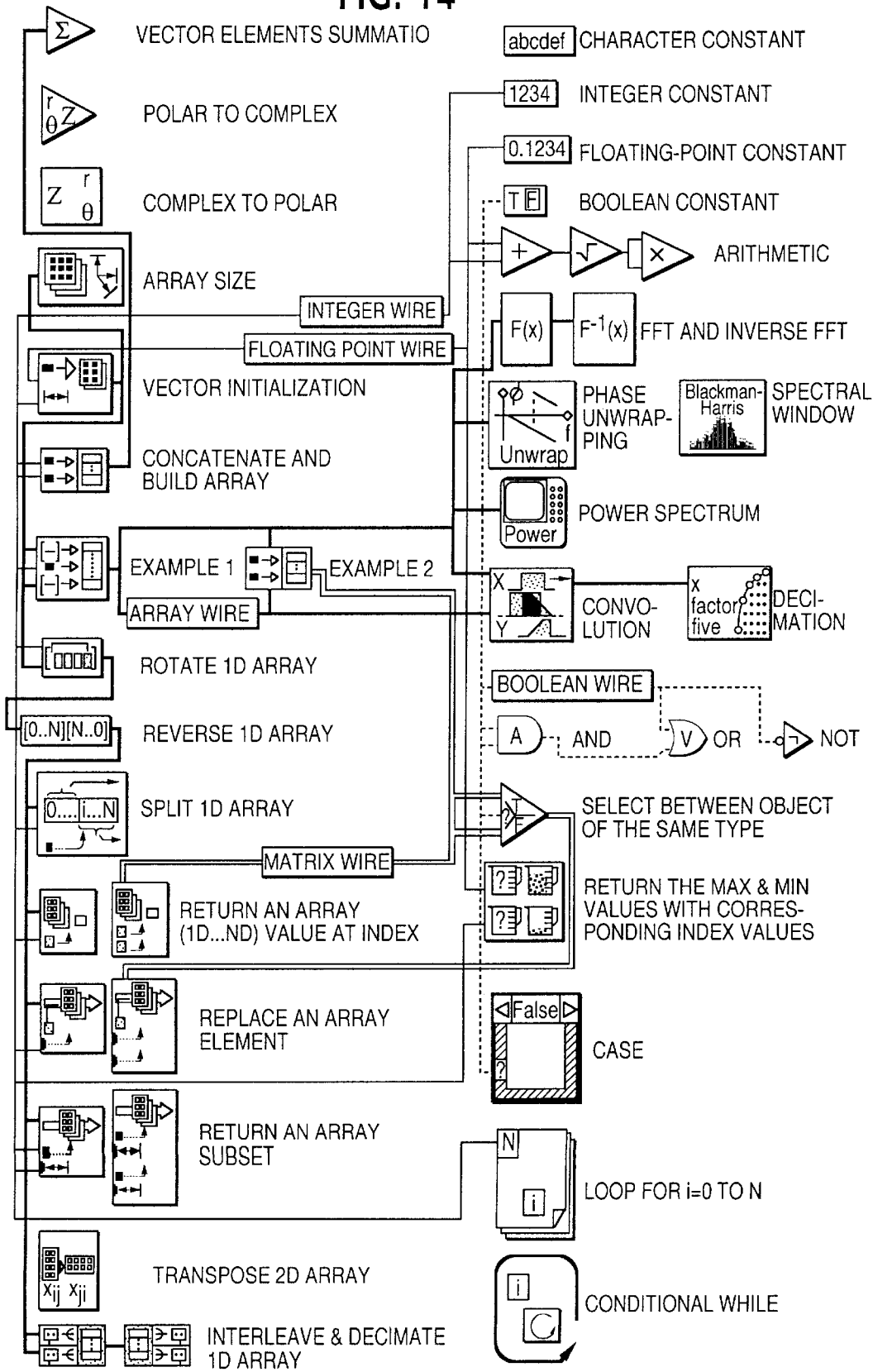
FIG. 14 is a summary legend of the symbols used in FIG. 13 and some other figures mentioned hereinafter.

Referring to FIG. 13, there is illustrated, under a block diagram form, an example of a function (hereinafter also referred to as "v.i." for "virtual instrument") carrying out an envelope calculation with a Hilbert transform in the graphical programming environment of the software LabVIEW™ of the company National Instruments Corporation. FIG. 14 is a summary legend of the LabVIEW™ symbols used in FIG. 13 and some other figures discussed hereinbelow. It must be noted that in FIG. 13, there is no normalization after the application of the spectral window on the Hilbert coefficients. In fact, it is not required for $N_{Hilbert}$>15 in the present precision context. The function receives at the input a decimation factor 202, a truncation length 204, the signal to be processed 206, the filter type to be applied 208 (low pass) and the $N_{Hilbert}$ parameter 210. The function provides at the output the instantaneous peak amplitude prior to 214 and after 212 the application of the low pass filter.

Referring to FIG. 10, the low pass filter 6 has three functions. A first one is to smooth the harmonics generated by the raising to square rectifier 4. Indeed, in this type of rectifier 4, the raising to square operation produces a discontinuous wave that must be smoothed (this is not required when the rectifier 4 is of the Hilbert convolutional type), as carried out in a continuous voltage supply block connected on the 60 cycles sector. A second function is to suppress the influence of the phase on the envelope value and relates also to an envelope extracted from a Hilbert transform. Finally, a third function is to allow a decimation without spectral aliasing. The filter must then cut off the signal beyond the half-decimation frequency.

The major problem with some low pass filters resides in the apparition of negative envelope values. Therefore a negative envelope value, like a negative power, is contrary to common sense and the physical laws. Only a filter using the convolution of a window formed of coefficients in all points positive, such as some spectral windows, ensures an all points positive envelope.

Figure 15A:
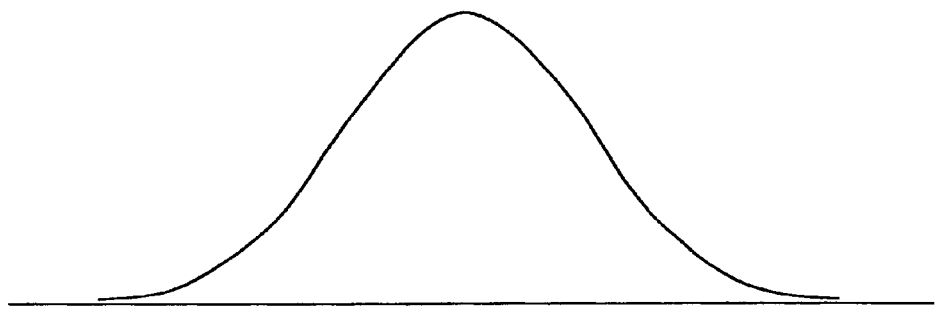
FIGS. 15A and 15B are graphs illustrating coefficient distributions for a spectral window and a FIR filter, respectively.
Figure 15B:
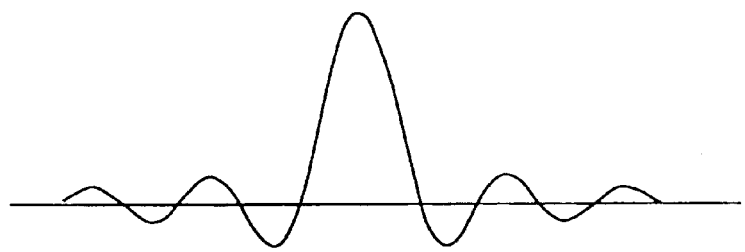

Referring to FIGS. 15A and 15B, there is shown coefficient distributions for a 3-term Blackman-Harris spectral window and a FIR ("Finite Impulse Response") filter, respectively. At the convolution output, the negative values of a FIR filter generates negative envelope values in the presence of sudden transients.

The Gaussian shape is the one that corresponds to the smallest time frequency object and the Blackman-Harris window is a compromise between a Gaussian and a finite duration window. The latter window results from the addition of three to seven cosinus that come close to a Gaussian shape. Compared to the convolution of this spectral window, many filters of the FIR and IIR types have much superior characteristics for the rejection level, the gained uniformity in the band pass and the transition width.

Figure 16:
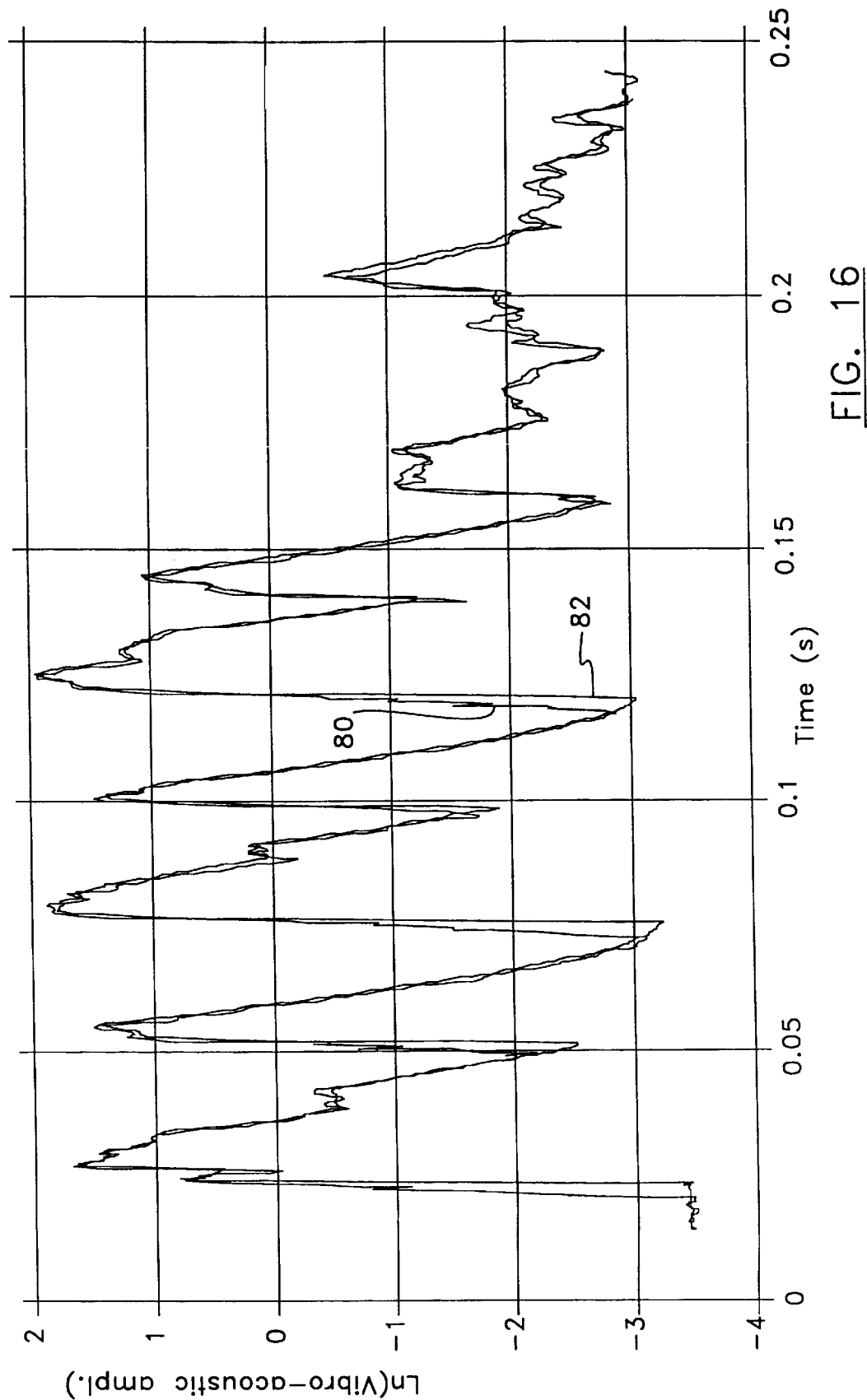
FIG. 16 is a comparative graph between a mean envelope filtered by a convolution with a spectral window and a FIR filter.

Referring to FIG. 16, there is shown a comparative graph between a mean envelope 80 filtered by a convolution with the coefficients of a FIR filter and a mean envelope 82 filtered by a convolution with the coefficients of a (3-term) Blackman-Harris type spectral window. The envelope 80 derived from a FIR filter has a more detailed relief with, however, a slower rising on transient attacks. Here, the reality has been somewhat masked by placing an absolute value function at the output of the filter to have no negative envelope values (the logarithm of a negative value is a bit difficult to display . . . ). The resolution gain is interesting, for sure, but when the value of the filtered envelope passes close to zero, an important negative impulse appears on a log scale presentation. Since it is precisely this scale that is chosen to perform the comparisons between the envelopes for some equipments to monitor, it is not possible to implement a FIR or IIR filter that allows the envelope to pass by zero. Thus there remains the low performance filter that consists in performing a convolution of a normalized spectral window with the signal. The normalization consists simply in dividing each coefficient of the window by the sum of the coefficients so that a constant signal will remain unchanged by the application of the window.

Figure 17:
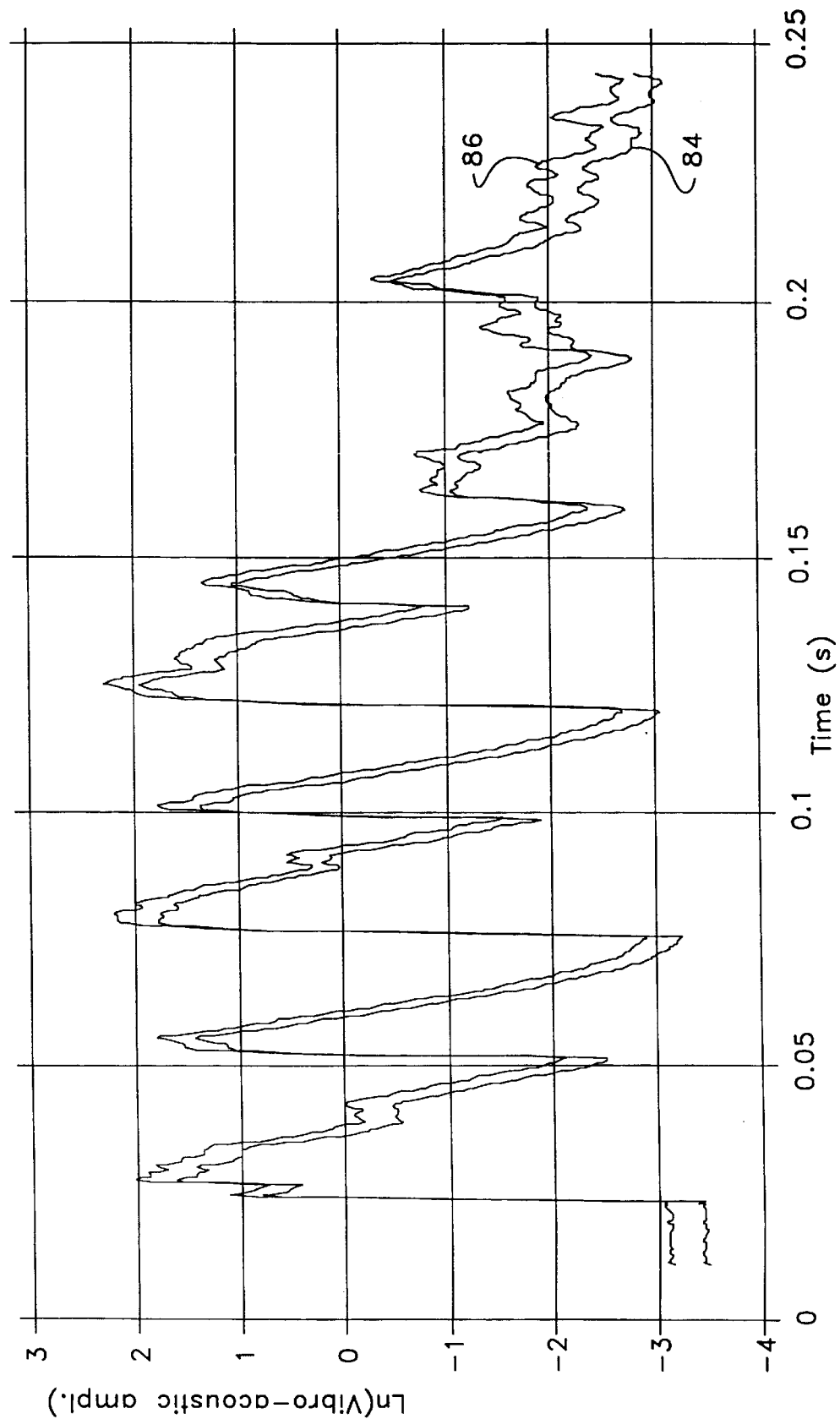
FIG. 17 is a comparative graph between a mean envelope obtained by square raising operation and smoothed by convolution with a spectral window, and a mean envelope obtained by Hilbert transform.

Referring to FIG. 17, there is shown a comparative graph between an average envelope 84 obtained by a simple square raising operation, smoothed by the convolution of a spectral window, and a mean envelope 86 obtained using a convolutional Hilbert transform.

As to the matter of choosing between a simple rectifier, i.e. a square raising operation, and a convolutional Hilbert transform, FIG. 17 shows that the latter exhibits a bit more details on the signature. The amplitudes are distinct by a square root of two factor since a RMS amplitude is compared with a peak amplitude. Here, it is the low ripple on the instantaneous amplitude calculated with the Hilbert transform that allows the use of a low pass filter narrower in time, thereby allowing a larger spectral bandwidth, thus more details.

Figure 18:
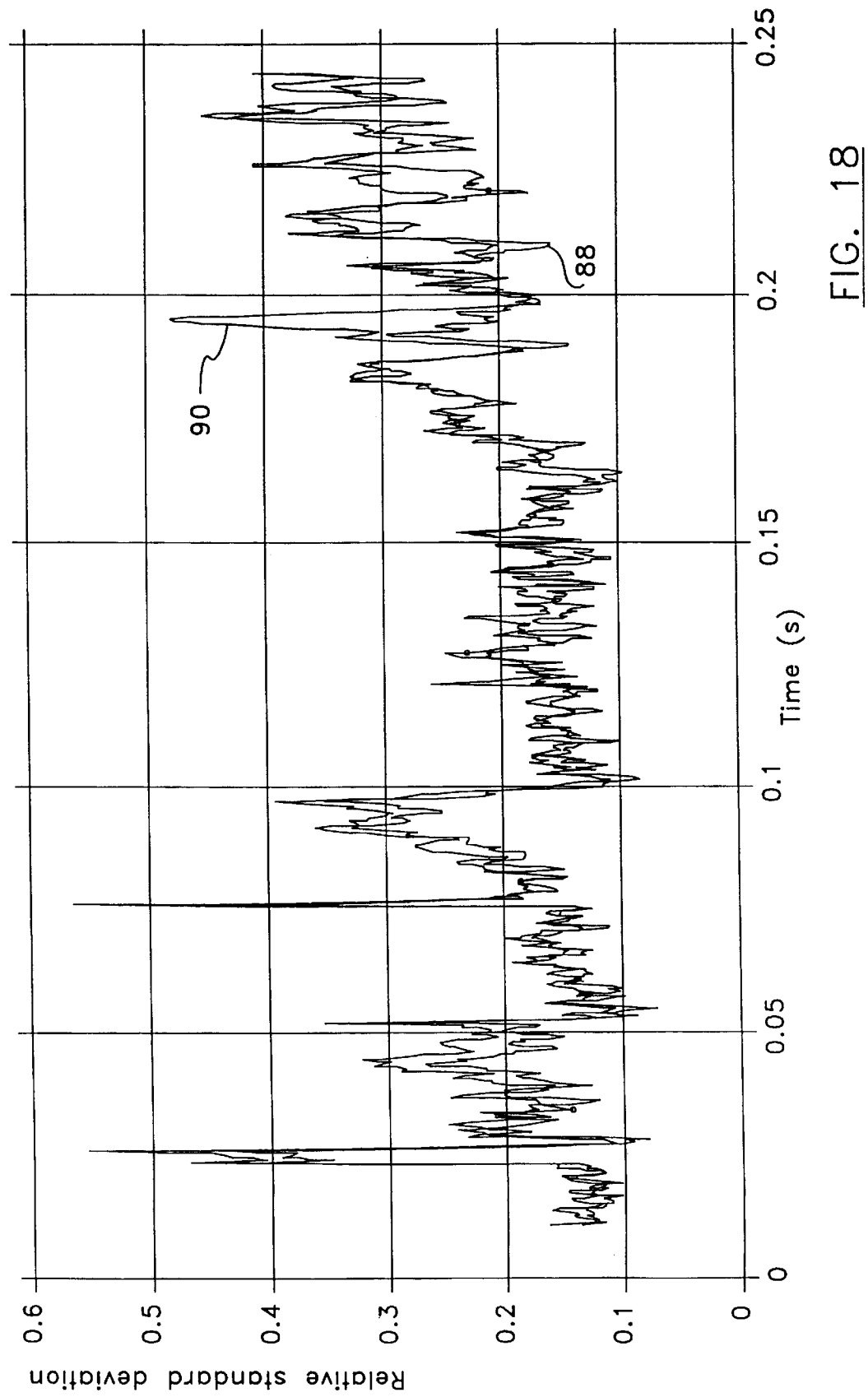
FIG. 18 is a comparative graph of the relative standard deviations of the mean envelopes illustrated in FIG. 17.

Despite this increase of details, FIG. 18, which shows a graph of the relative standard deviations of the average envelopes 84, 86 illustrated in FIG. 17, exhibits a standard deviation 88 slightly reduced for the envelope 86 obtained with the Hilbert transform in comparison with the standard deviation 90 for the envelope 84 obtained with the square raising operation. Furthermore, if the same low pass filter width had been kept for this comparison, the resolution would have been almost identical with, however, an additional reduction of the standard deviation 88 for the envelope 86 resulting from the Hilbert transform.

These results mark the algorithm using the Hilbert transform as being the best wideband envelope detector for the present application.

Figure 19A:
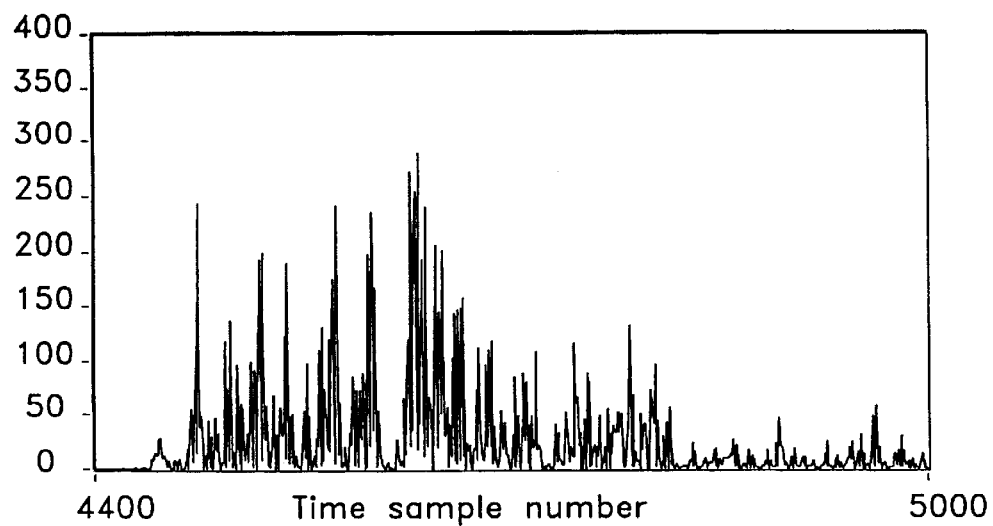
FIGS. 19A, 19B and 19C are graphs of the real power, the instantaneous power and the resulting envelope of a lone transient signal in a Hilbert transform envelope calculation, respectively.
Figure 19B:
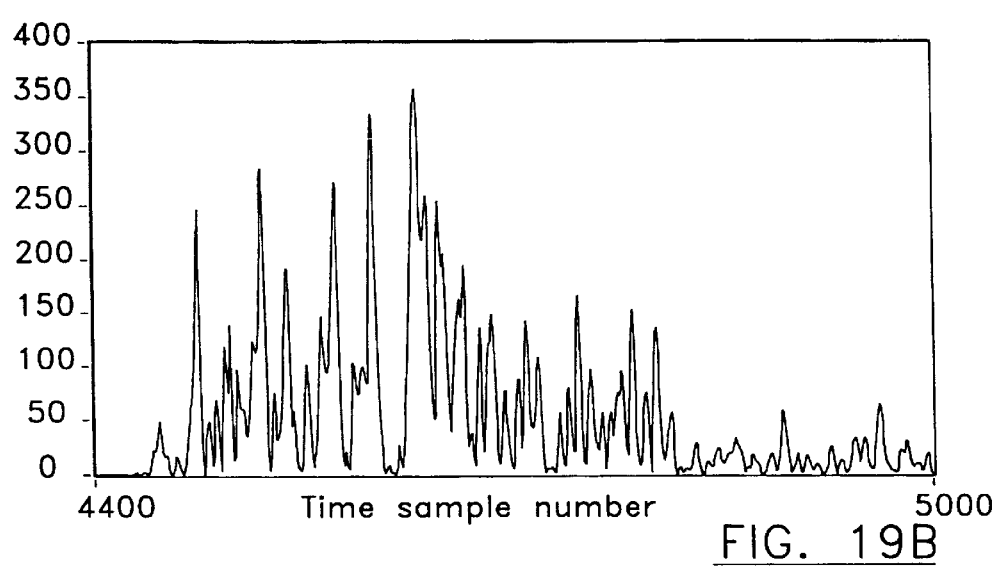
Figure 19C:
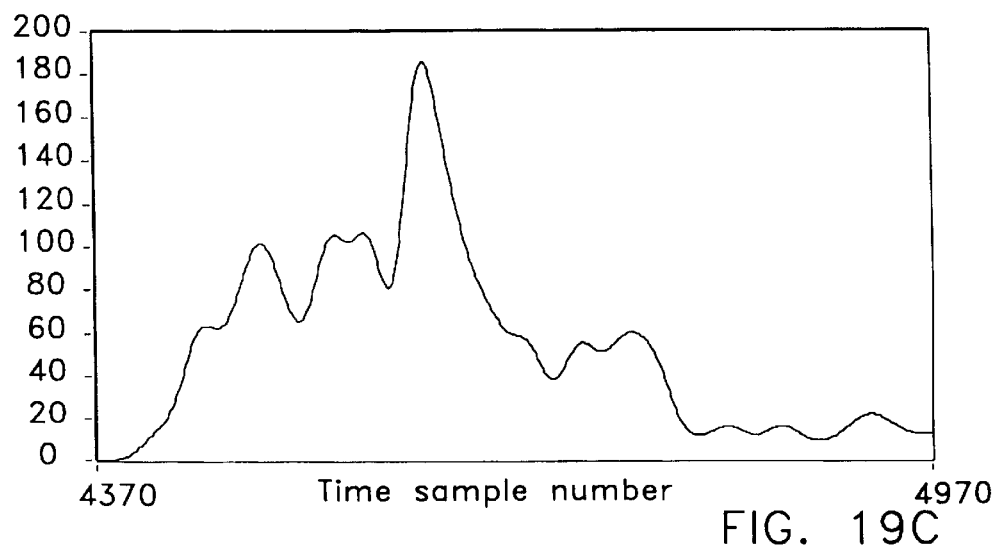
Figure 20A:
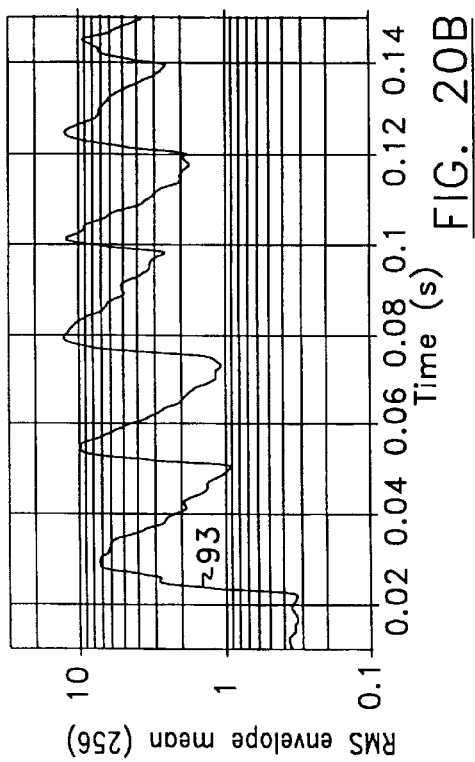
FIG. 20 is a comparative graph of envelopes for different ranges of low pass filters.
Figure 20B:
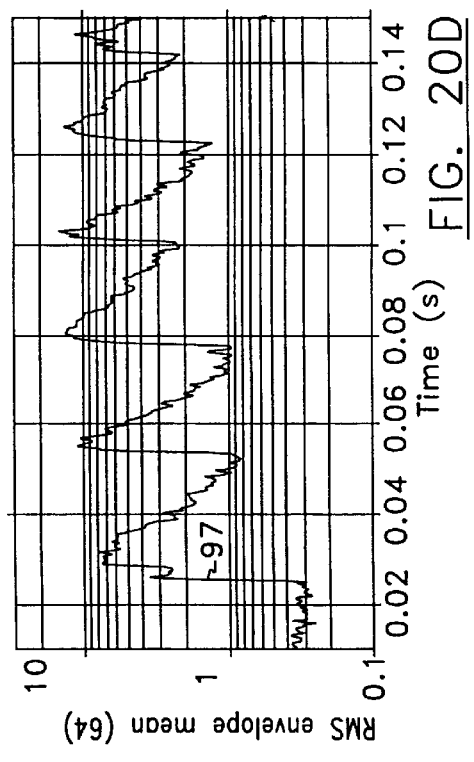
Figure 20C:
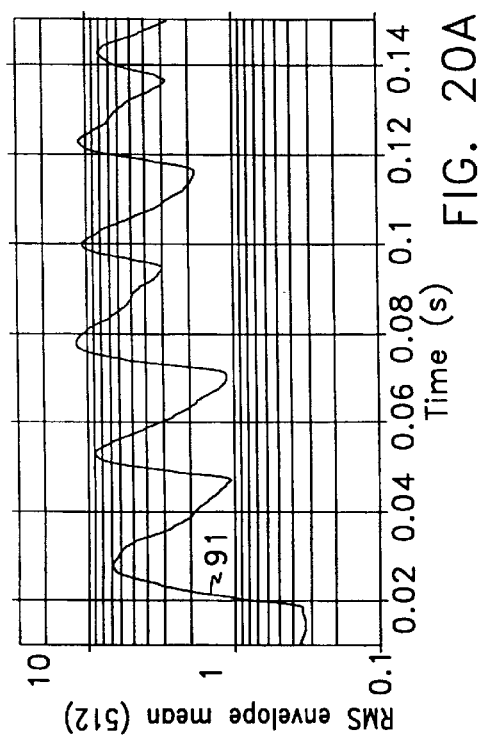
Figure 20D:
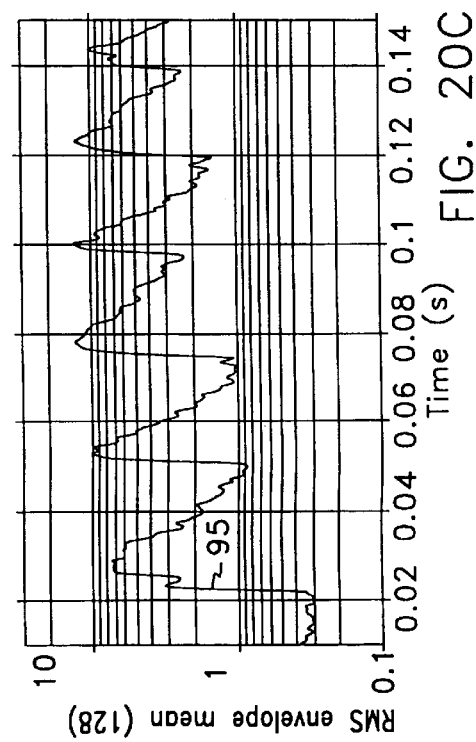

FIGS. 19A, 19B and 19C exhibit the evolution of a signal at different stages in the envelope calculation using the Hilbert transform. FIG. 19A shows the signal square (indicative of the real power), as subjected to the low pass filter 6 by the rectifier 4 in the RMS envelope calculation without Hilbert transform. FIG. 19B shows clearly the gain obtained by adding the square of the imaginary part of the signal (signal then indicative of the instantaneous power): the rectification of the obtained wave allows the application of a filter that will let pass more details and/or less noise. FIG. 19C shows the resulting envelope at the output of the low pass filter 6.

Referring to FIG. 10, two factors must be considered in the construction of the decimator 8, i.e. the decimation factor and the time resolution loss.

A first issue is associated to the time resolution required to monitor tap changers. An answer could be "the best possible!", but to what cost? However, this price is not an increase of the calculation time but an increase of noise, or, in statistical terms, of the signature dispersion. The resolution has also an important impact on the decimation factor applied on the envelope, thus on the magnitude of the vectors that will be processed by the monitoring system, calling for the memory dimension and the calculation power.

The mechanical time repeatability (power off and off-load) of a tap changer is in the order of a fraction of millisecond ($\approx$0.2 ms or 5 kHz) for consecutive changes. It is thus not very useful to look for a better definition. However, it will be seen hereinafter that filtering the envelope below 1 kHz causes a resolution loss that appears to be significative to the eye on a graph. Furthermore, a defect standing out by a short appearance would likely be smoothed by a filter having a cut-off frequency too low. The envelope must therefore be preferably decimated in order to provide a final sampling rate comprised between 100 samples/s and 100 k samples/s and preferably between 1 k samples/s and 10 k samples/s.

Moreover, it would be useful to have an ergonomic value for the sampling period, or yet, for the frequency band supporting the decimated envelope. A frequency band of slightly less than 1 kHz, requiring a 2 k samples/s sampling rate would constitute a practical compromise for the display and the data transfer into another environment. Thereby setting these values would simplify the programmation of the user interfaces and the system configuration. However, a decimation adjusted to the context, such as the duration of the tap changing operation, would optimize the memory space and the time resolution.

To quantize the time resolution and the dispersion as a function of the decimation, a comparative test directed on the cut-off frequency of the low pass filter 6 can be performed knowing that the decimation is practiced at a bit more than the double of the cut-off frequency of this filter 6. For this comparison, the convolution of a spectral window has been used for the low pass filter 6 after the rectifier 4. It is the square raising rectifier, rather than the Hilbert transform, that has been used in these tests. The cut-off frequency corresponds to about 2.5/(L·T) where L·T is the product of the number of samples L times the sampling period T, i.e. the duration of the window. In these tests, the original sampling frequency, i.e. before decimation, is of 65,536 samples/s. A decimation factor of 20 sets the new sampling rate close to 3.25 k samples/s. This sampling rate corresponds to a theoretically accessible bandwidth of 1.6 kHz.

Figure 21:
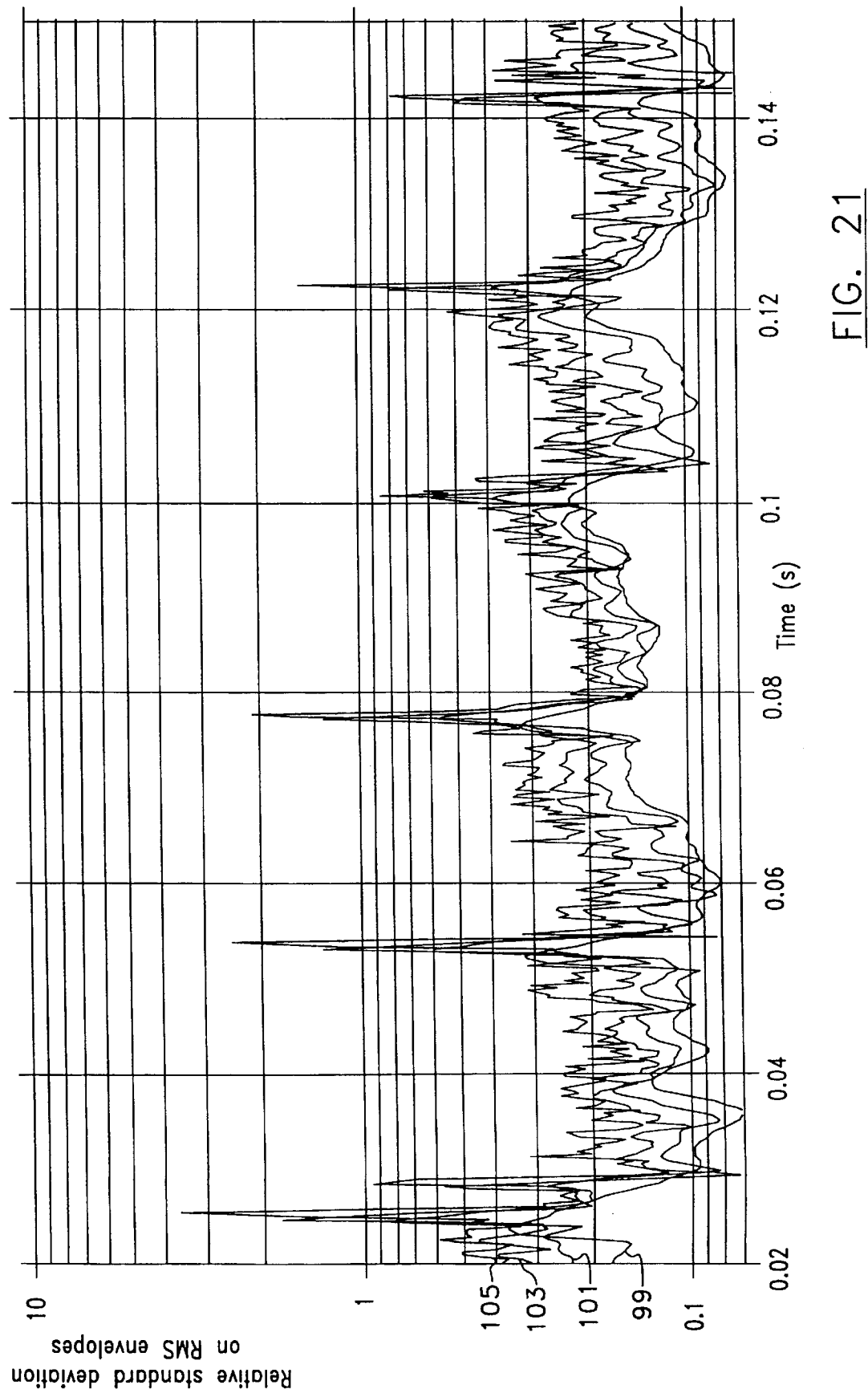
FIG. 21 is a comparative graph of standard deviations for different ranges of low pass filters.

On FIGS. 20 and 21, showing respectively comparative graphs of envelopes 91, 93, 95, 97 and relative standard deviations 99, 101, 103, 105 for different lengths of low pass filters 6, the width of the tested spectral windows, 512 samples (traces 91, 99), 256 samples (traces 93, 101), 128 samples (traces 95, 103) and 64 samples (traces 97, 105) correspond respectively to low pass filters 6 of 312, 625, 1250 and 2500 Hz. A 64 samples window does not filter the signal enough, thereby allowing a spectral aliasing, i.e., a foldback of the frequencies located between 1.6 kHz and 2.5 kHz. The time resolution, like the dispersion level (standard deviation) increases gradually with the decrease of L in FIGS. 20 and 21. The presence of spectral aliasing is thus wrongfully perceived in part as an increase of the resolution for the 64 samples window.

Figure 22:
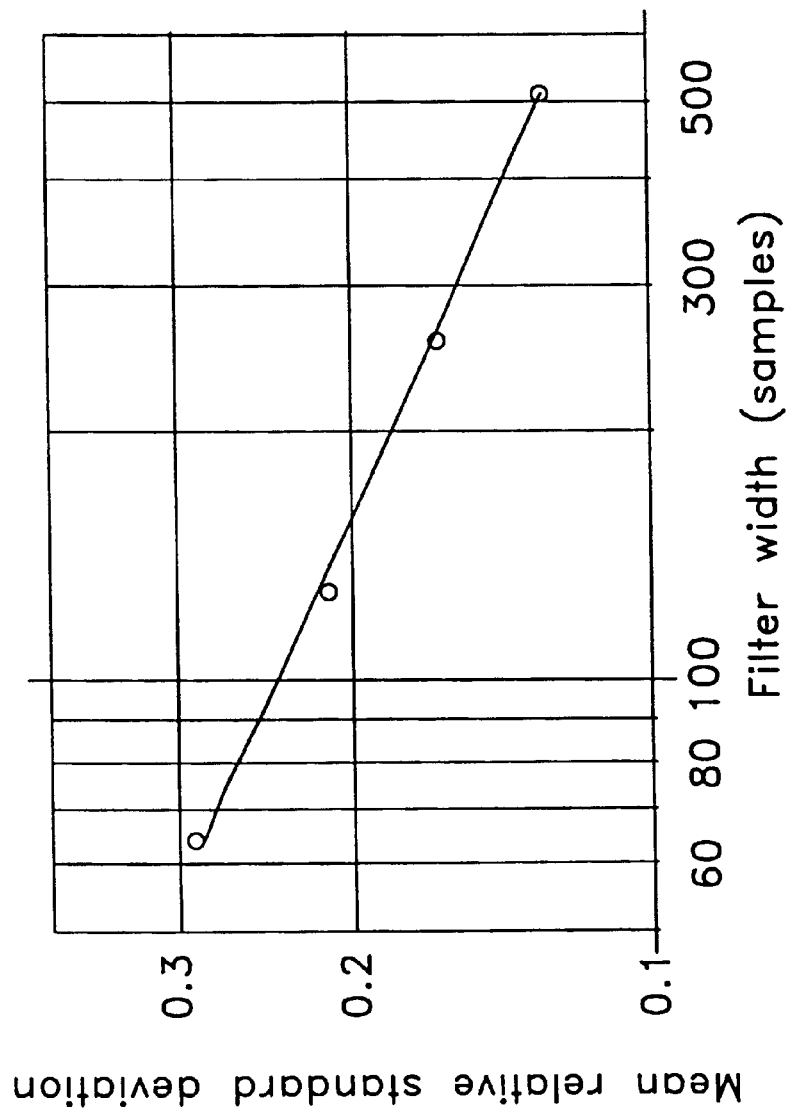
FIG. 22 is a graph illustrating a reduction of the dispersion as a function of the range of the filter applied at the output of the rectifier illustrated in FIG. 10.

FIG. 22 exhibits the relation between the length L of the spectral window and the dispersion mean level observed on the traces in FIG. 20. It is noticed, for the tap changer and the detector giving the results illustrated in FIGS. 20 and 21, that the dispersion level is a function of $L^{-0.388}$, where L is the length of the Blackman-Harris window. This relation means that for a twice larger window, the dispersion is reduced by 25%.

It is noticed that an increase of the decimation allows at the same time to reduce the memory space and to reduce the dispersion of the signature envelope. However, FIG. 20 shows clearly that a too high smoothing (512 samples filter) erases the details and attenuates the dynamic variation range of the signal. As it happens, here, a low pass filter 6 around 1 kHz with a 0.5 ms sampling period would be appropriate, which provides a bit more than 160 samples for the width of the window.

Referring to FIG. 1, the addition of a phase filter 92 allows to compensate the phase dispersion of the processed signal. Somewhat like light in an optical fiber, there is observed a dispersion of the vibration waves when the distance is great between the emission location and the reception point since the waves propagate at a speed depending on their own frequency. A phase dispersion compensation is intended to perform a time realignment of the various wave packets in the same alignment that they have at their emission. It thereby provides a way to get "virtually" closer to the emission source. A sampling of vibro-acoustic measurements on different tap changers allowed to conclude that it is apparently not relevant to correct the phase dispersion for the monitoring thereof. However, this compensation can be required in an eventual application of the monitoring apparatus according to the invention on circuit breakers in operation or other equipments. Indeed, the distance between the emission and the reception of the vibro-acoustic wave is of 2 to 5 times more important for the latter.

Figure 23:
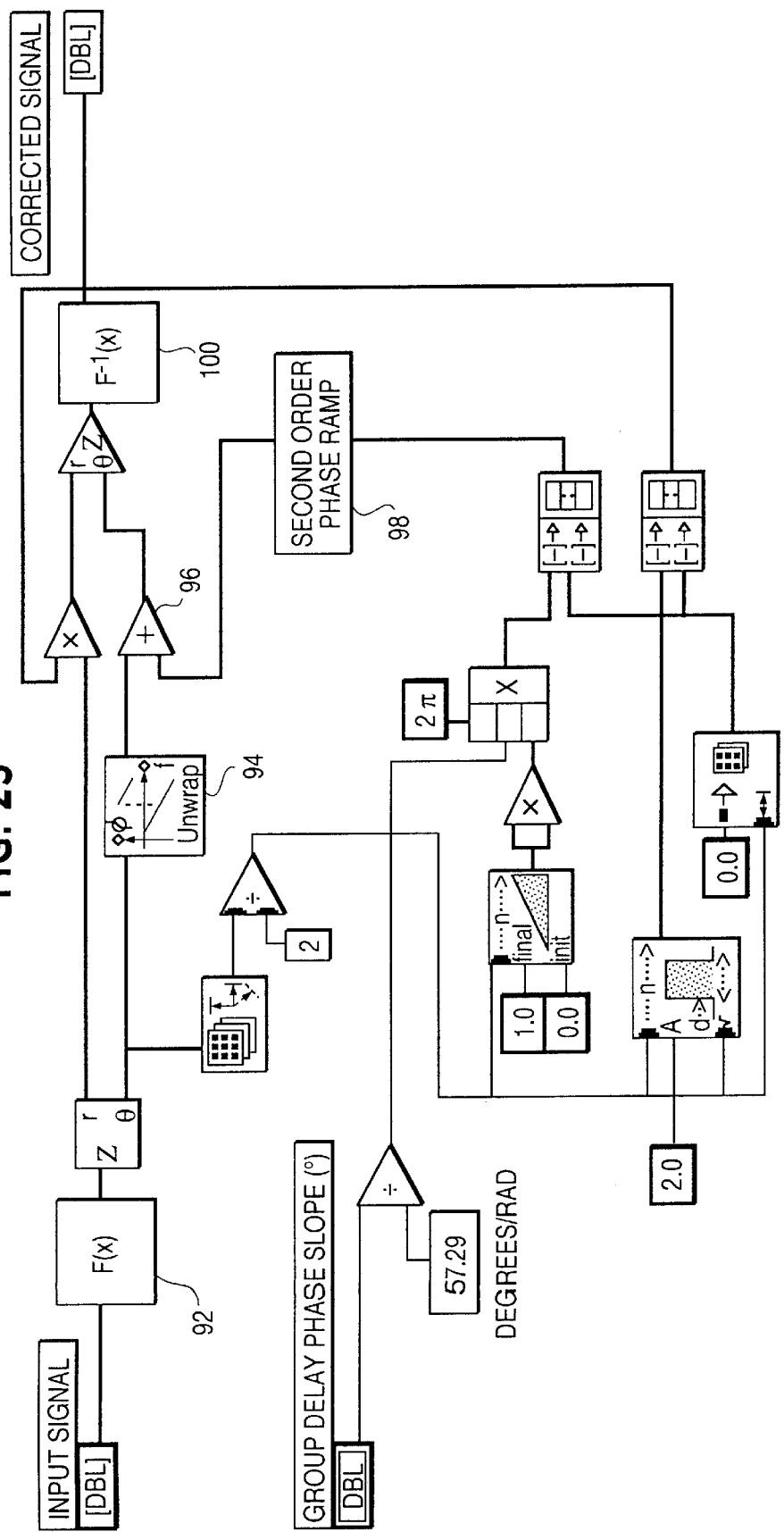
FIG. 23 is a block diagram illustrating a function carrying out a phase compensation, according to the invention.

Referring to FIG. 23, showing the v.i. of a phase compensation, a manner of carrying out a phase correction is to make this correction in the frequency domain. It is then a matter of performing a Fourier transform 92 of the signal and to retrieve the phase thereof. As this phase must be continuous on $\pm n\pi$, the phase must therefore be "unwrapped" 94 to suppress the transitions from $-\pi$ to $+\pi$. The addition 96 of a phase ramp having a $2\pi\tau$ slope amounts to creating a delay $\tau$ in the time. To modify the group delay as a function of the frequency, a second degree phase ramp 98 is added. The ramp 98 has an amplitude determined by the extent of the desired correction, the maximum of this ramp giving the angular correction of the highest frequency.

After the addition 96 of the second degree phase ramp 98, the reverse Fourier transform 100 is carried out on the result.

The above-mentioned processing has a mathematical justification.

Given the signal:

$$S(\omega,x)=A(\omega,x)e^{-j\theta(\omega,x)} \tag{1}$$

expressed as a function of the angular frequency $\omega$, in radians/s, and of the distance x to the source. In a non dispersive milieu, it can be expressed as:

$$\theta(\omega, x) = \theta(\omega, 0) + x \cdot \frac{\omega}{c} \tag{2}$$

where c is the propagation speed of the waves in the milieu. In a dispersive milieu, it is rather expressed as:

$$\theta(\omega, x) = \theta(\omega, 0) + x \cdot \frac{\omega}{c(\omega)} \tag{3}$$

since the speed of the wave becomes a function of its frequency. A simple modelisation of the speed function gives:

$$c(\omega) \cong (1.0+\beta \cdot \omega)c_0 \tag{4}$$

which, once inserted in equation (3), generates the expression:

$$\theta(\omega, x) \cong \theta(\omega, 0) + x \cdot \frac{\omega}{(1.0 + \beta \cdot \omega)c_0} \tag{5}$$

Since $\beta \cdot \omega << 1.0$, there can be expressed:

$$\theta(\omega, x) \cong \theta(\omega, 0) + x \cdot \frac{\omega}{c_0} - x \cdot \frac{\beta\omega^2}{c_0} \tag{6}$$

where it is noticed that the dispersion term is a second degree function of the frequency.

The phase compensation algorithm mentioned hereinabove uses the raw power of the digital processing by means of the Fourier transform 92 and the reverse transform 100 after phase correction. There exists a means potentially more simple and economical, as far as the coding and calculation power is concerned, which resides in carrying out a convolution of a chirp with the signal. The chirp is used to set the coefficients of a convolutional filter to perform the phase compensation.

Figure 24:
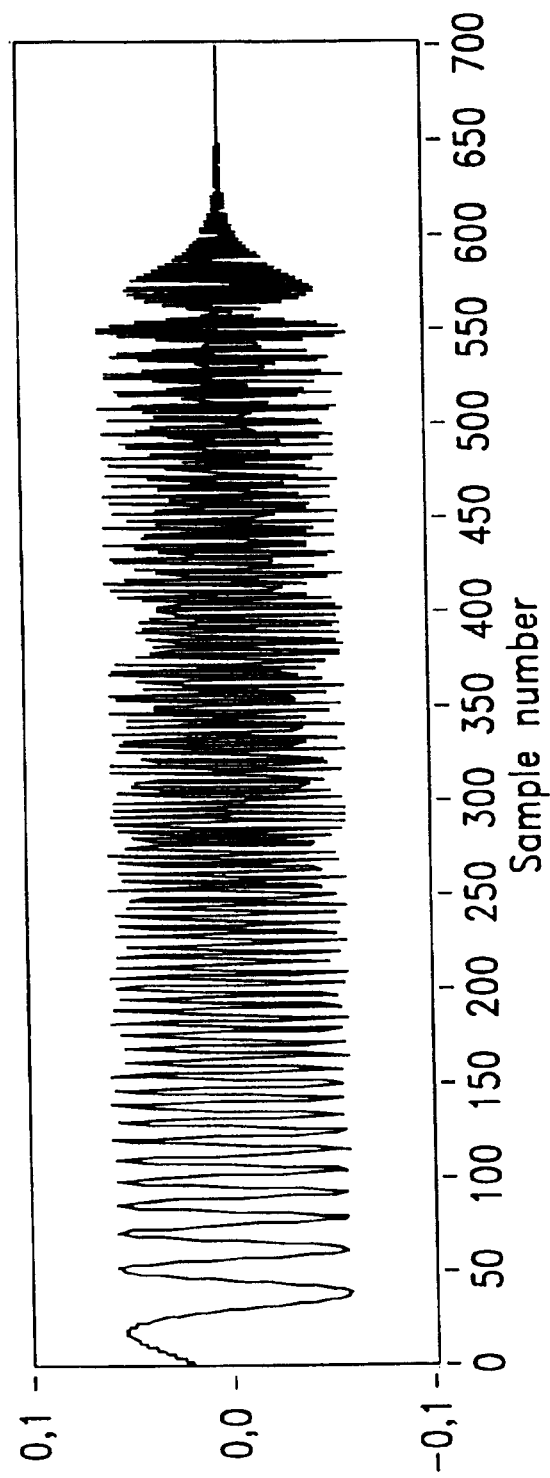
FIG. 24 is a graph illustrating a chirp that can be used to set the coefficients of a convolutional filter, according to the invention.

FIG. 24 illustrates such a chirp obtained by a reverse Fourier transform on a second degree phase ramp. Such a chirp is formed of a frequency sweeping from 0.0 to 0.5 bin (1 bin=sampling frequency). The broader the chirp is in the time, the more important is the correction. On a chirp, the spatial dispersion of the frequencies is obvious. Intuitively, it will be understood that the low frequencies will be correlated on the left whereas the high frequencies will be correlated on the right of the chirp.

The amplitude of the required phase correction can be determined by looking at the effects obtained for different phase compensation values applied on the vibro-acoustic signal, in time-frequency planes. The maximal resolution is then obtained when the attack of the transient appears at the vertical in the time-frequency plane. The vibro-acoustic signatures collected to date on different tap changers all exhibit a maximum of time definition on the envelope for a null or non significative compensation.

Referring to FIG. 1, it has been previously seen that it was dangerous to apply an anti-aliasing filter of the FIR or IIR type because the latter is likely to generate negative envelope values. The convolutional low pass filter 6, applied to the rectified wave by a square raising function or by Hilbert transform 4, must be deprived of any negative coefficients. As all the signatures are later processed on a logarithmic scale, a negative envelope value, or a value close to zero, cannot be tolerated. Yet, nothing prevents the application of a second filter 110 after the logarithm calculation 112, where the negative values are no longer dreaded.

The decimation 8 is performed on an envelope that has been shaped by a logarithm 112. If the logarithm is introduced before the decimation (as illustrated), there is obtained a signal having negative values prior to decimation. Indeed, when a value "x" of the envelope has an amplitude below 1 m/s$^2$, the log(x) is negative for x<1. So, a FIR or IIR type anti-aliasing filter such as the filter 110 can be applied on this signal prior to decimation.

Figure 25:
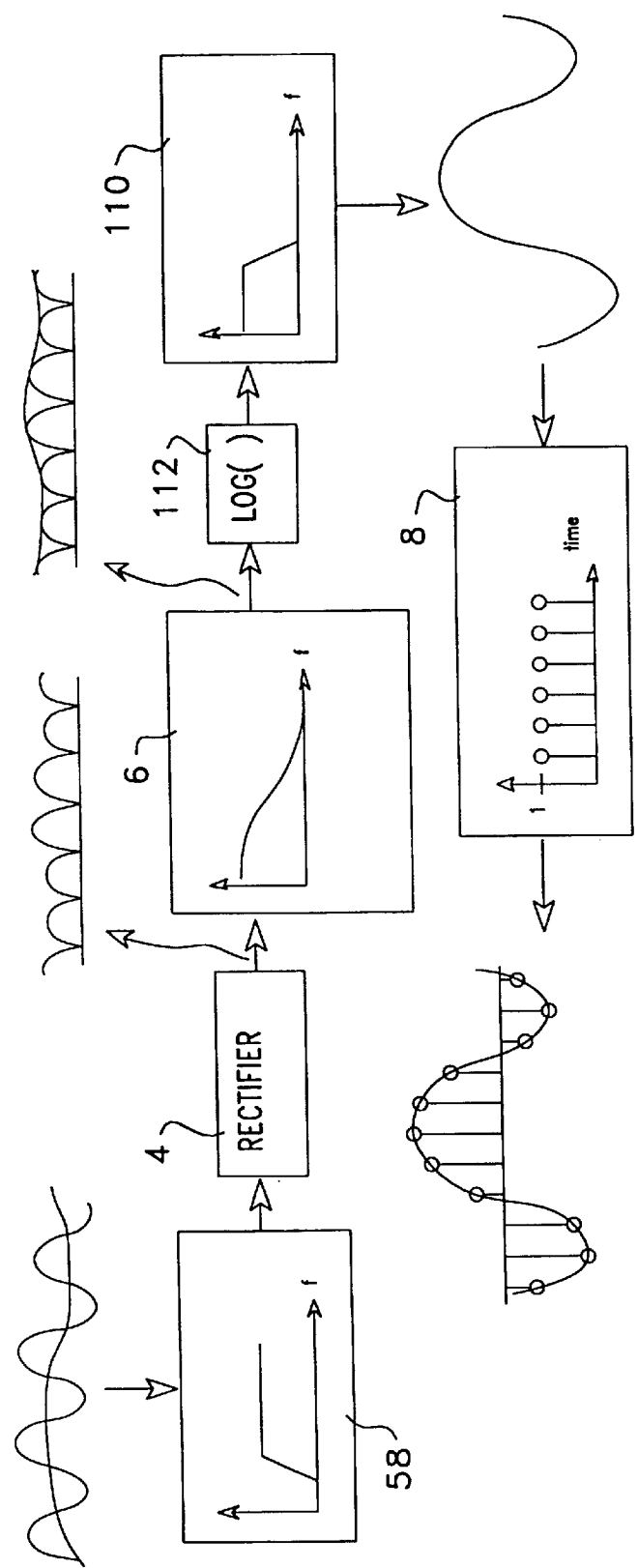
FIG. 25 is a schematic diagram illustrating a circuit for detecting the envelope of a signal, with double anti-aliasing filter, according to the invention.

FIG. 25 shows the schematic shapes of the signals at different points of an envelope detector with a logarithm 112 and a double anti-aliasing filter shaping, the first 6 carrying out a convolution of a spectral window in all points positive and the second 110 being a FIR or IIR filter.

Preferably, the second low pass filter 110 must not filter a too large portion of the signal, but only the low amplitude portion present at band end which is likely to contribute to spectral aliasing. To remove an important portion of the signal with the second filter 110 would create aberrations such as overswings and strange oscillations on the signal. If the envelope is re-expressed on a linear scale after this processing, any overswing or attenuation, even barely perceptible on the logarithmic scale at the top of a transient, will be amplified. The second filter 110 must be perceived as a spectral apodisation of the first.

The time warping or realignment 10 is one of the tools that characterizes the monitoring apparatus. Like for the envelope calculation, it is important to optimize this portion of the process. It is also important to quantize the gain obtained with this tool; the implementation effort of the algorithm related thereto must be rewarded by a true gain.

Before considering this subject in more detail, it is important to point out the difference between time warping and time realignment. In the time warping, there can be a modification in the arrival order of the events or, worst, a time flow inversion (a local and finite duration temporal object $f(t-t_0)$ appears as $f(t_1-t)$ on another trace). If a time warping algorithm can carry out a time realignment, a time realignment algorithm cannot, conversely, correct a time warping. The time realignment algorithm cannot reverse or cut the time flow of the traces that are submitted to it.

In many monitoring applications, it is required to compare time vibratory signatures resulting from a same mechanical action measured at various times. By time signatures, it is meant an envelope of the vibration signal, envelopes distributed on several spectral bands or a time frequency distribution; the time dimension must be present. On the other hand, the reproduction of a mechanical action is never perfect and, in addition, the operating conditions (e.g. the temperature) and the aging of the equipment will introduce additional deviations. These deviations can appear as being a new presence or absence of a mechanical event, a modification of the amplitude of an event or of the time sequencing of events. But, a variation of the time frame can yield to mistaking the apparition of a new event or an amplitude change with a simple acceleration or deceleration of the sequencing of the events; prior to any comparison, it is important to separate the signature changes that derive from a fluctuation of the time frame flow from other changes.

The time realignment allows to juxtapose each event with its respective one in the other signature without being influenced by untimely delays. The amplitudes of the modifications carried over the time frame during the realignment provide also a worthy diagnostic indicia. Time realignment algorithms exist for more than a decade in the speech processing domain and some use them for the monitoring of high power circuit breakers in transformer stations. However, these algorithms are inadequate for monitoring applications away from the speech signal. A multiscale correlation can be used as an estimation tool for the time frame. In opposition to the algorithms used in speech processing, the multiscale correlation allows to correct the time sequencing and not only the alignment of the traces.

However, the multiscale correlation is complex and requires a higher calculation power. Since the observed signatures do not show modification in the arrival order of the events or inversion of the time flow, the time warping will not be thoroughly relied upon. However, the multiscale correlation could nevertheless be used for this task with suitable adjustment of the weighting factor P such as described in the document entitled "Vibro-acoustic signature comparison and time warping correction with multiscale correlation" of F. Léonard, printed out from the third conference entitled "Méthodes de surveillance et techniques de diagnostic acoustiques et vibratoires", Société Francaise des Mécaniciens—Société Francaise d'Acoustique—International Measurement Conference, held at CETIM (Senlis) France on Oct. 13 to 15, 1998. In fact, a simple time realignment algorithm is more suitable in the present context, since an adjustment of only the two first drifts of the time frame is desired, namely the delay $D_0$ and the time flow speed $D_1$. The adjustment of the signature according to these drifts allows to correct the observed effects of the oil temperature on the speed of the tap change, thereby reducing the dispersion of the signature mean and allowing a comparison deprived of the effect of the temperature between this mean and the new signature.

Figure 26:
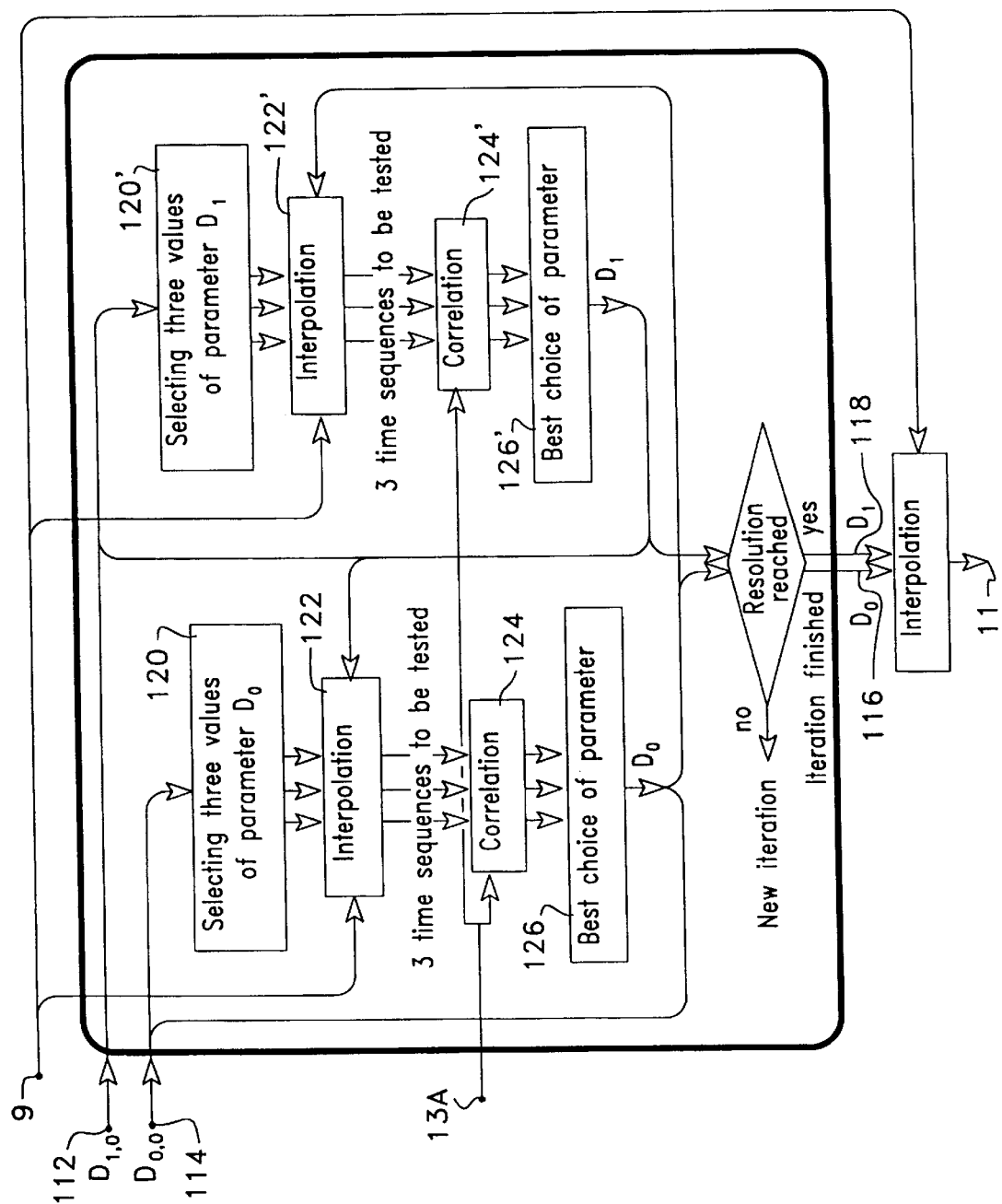
FIG. 26 is a flow chart illustrating the operation of an iteration loop to perform a time realignment, according to the invention.

Referring to FIG. 26, there is shown a flow chart illustrating the operation of an iteration loop to perform a time realignment, according to the invention. The functionality is simple: the algorithm is provided with an envelope subjected to evaluation such as formed for example by the decimated signal 9 and the reference envelope 13A, usually a mean of envelopes. At the output, there is provided the first interpolated envelope 11 so that its time frame corresponds to the one of the reference envelope 13A. The values of the drift coefficients 116, 118 found by the algorithm can also be used for diagnostic purposes. The operation of the algorithms is controlled by parameters such as:

the initial values of the time drifts $D_{0,0}$ (112) and $D_{1,0}$ (114);

the width of the starting range of each one of the time drifts, and the resolution limit to be reached with the iteration, limit that is determined by the number of iterations.

Based on the maximum correlation search between an envelope and the reference envelope, the proposed algorithm progresses by trial and error in an interative procedure. At each iteration, two choices are made, namely one for the drift of zero order $D_0$ (the delay) and the other one for the drift of first order $D_1$ (the time flow speed).

The iteration is performed in two blocks, the first one for the drift of zero order and the second one for the drift of first order. In the order of execution of one of these blocks, there is found a selector of values 120, 120', an interpolator 122, 122', a correlator 124, 124', a selector for choosing the best drift value and a search range reducer 126, 126'. The selector of values to be tested 120, 120' only takes the last carry over value $D_{x,i}$, or the initial value $D_{x,0}$ at the first iteration, calculates the values $D_{x,i} \pm \frac{1}{2}$ search range for $D_{0,i}$ and $D_{1,i}$. For each drift, three values are tested at each iteration. The interpolator 122 samples the envelope according to a starting point set by the drift of zero order and with a period equal to the drift of first order. The interpolation is carried out by the reconstruction function "sinc" (i.e. sin(x)/x) to which a Blackman-Harris type spectral window is applied to limit the width. Three envelopes are thereby calculated and submitted to the correlator 124. The highest correlation value, or the lowest square deviation, determines the choice of the best drift value, achieved by the selector 126. As the iteration is done in two blocks, the best value of drift of zero order is thus transmitted to the interpolator 122' associated to the selection of the best drift of first order. Once the two drift values are provided after the iteration cycle, the search range of each drift is divided by $\sqrt{2}$. If these ranges have a lower dimension than the desired resolution, the iteration is stopped, or else a new iteration is carried out returning to the selector of values 120, 120'.

Figure 27A:
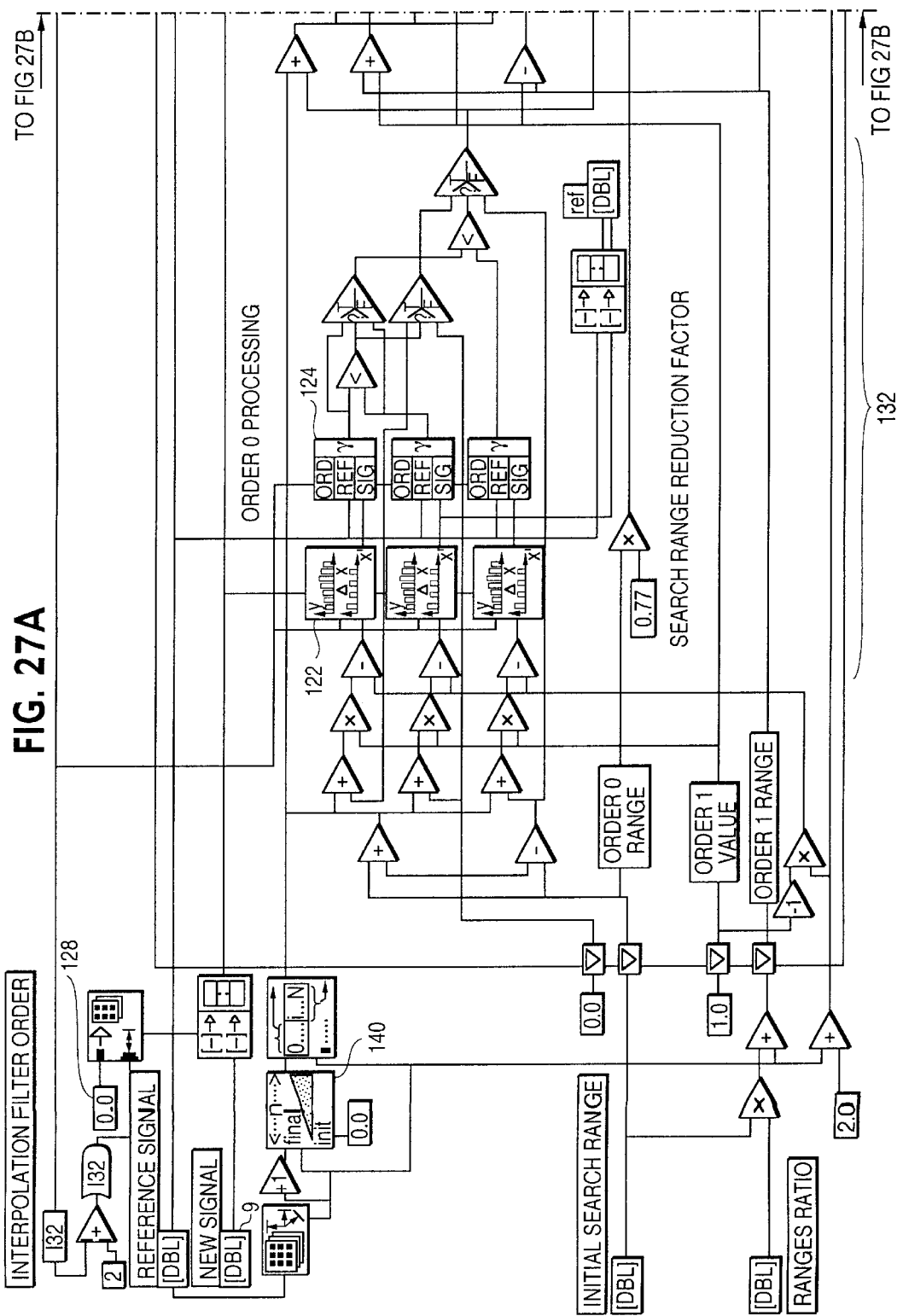
FIG. 27 is a block diagram illustrating a time realignment function, according to the invention.
Figure 27B:
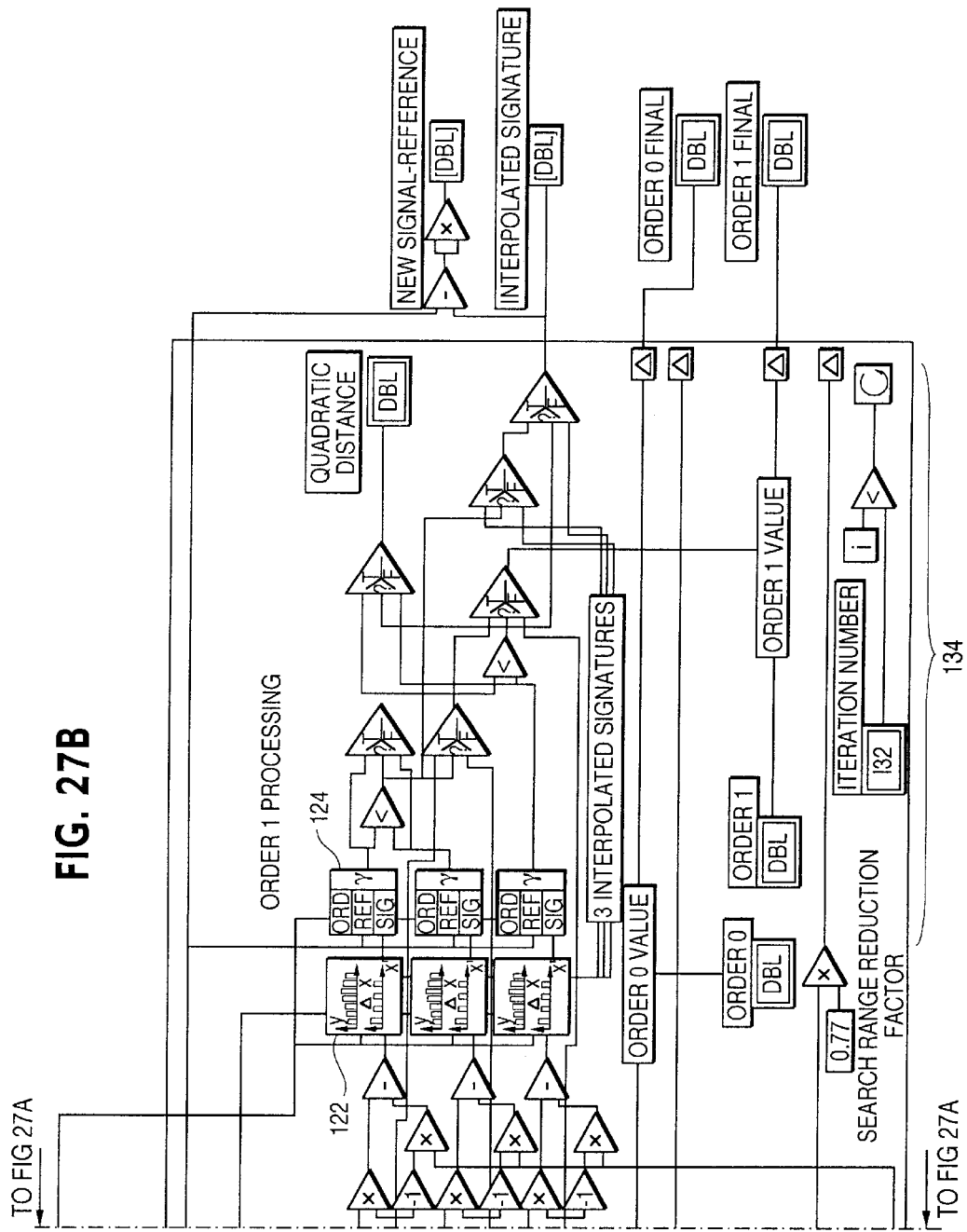

FIG. 27 shows the LabView™ diagram of the algorithm implemented for the showing of the time realignment. The two iteration sequences 132, 134 each corresponding to a drift order (zero and one in the order), are present in a same loop. On top-left, a null value buffer 128, of half the width of the interpolation filter 122, 122', is added at the beginning of the signature vector to be adjusted 110: it is assumed here that the first transient occurs further in the time frame and that the signal is null before it. Still on left, there is found the generation of a ramp $\{x=i|i=0,I\}$ 140 starting from 0.0 and ending with the value of the number of samples minus the length of the interpolation filter 122, 122'. This ramp is used for the calculation of the interpolation positions such as:

$$x_{pos} = (x+D_0) \cdot D_1 - (D_1 - 1.0) \cdot I/2 \qquad (7)$$

with $D_0$ and $D_1$ for drift values. The expression $(D_1-1.0) \cdot I/2$ allows to decouple, or uncorrelate, the parameters $D_0$ et $D_1$. Indeed, in the iterative process, an adjustment of slope $D_1$ will not introduce at the same time a change of zero $D_0$. The expression $D_0+(x-I/2) \cdot D_1+I/2$ could have equally be used instead of the previous one, without any significative effect on the conversion of the iteration. The initial values of $D_0$ and $D_1$ are respectively set to 0.0 and 1.0. Let $s_n$, the signature to be adjusted on the reference such as:

$$s_{n\_i} = s(t)|_{t=nT} \qquad (8)$$

where T is the sampling period. The interpolation consists of providing the signature:

$$s'_n = s(t)|_{t=((x+D_0)D_1-(D_1-1.0) \cdot I/2)T} \qquad (9)$$

Figure 28:
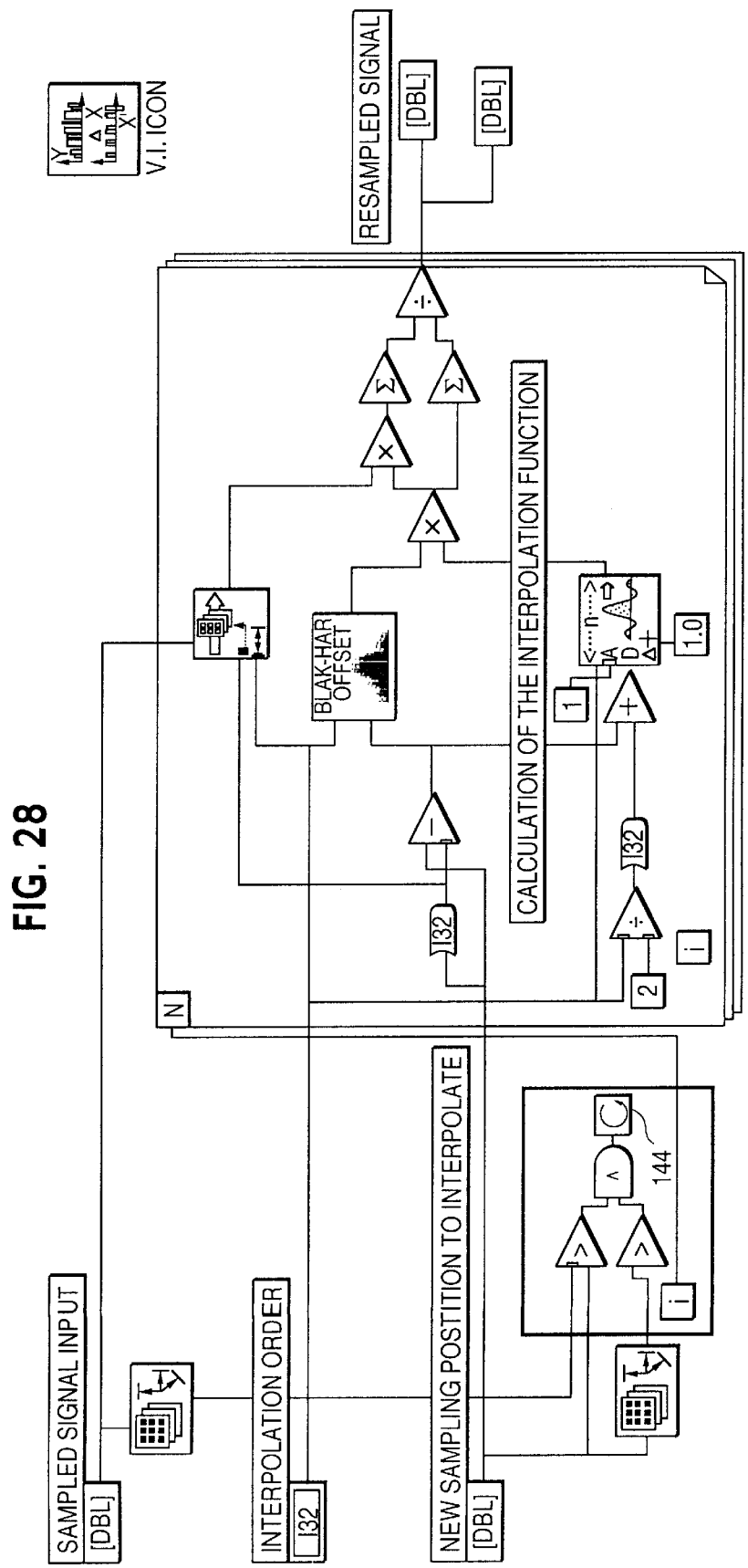
FIGS. 28, 29A and 29B are block diagrams illustrating respectively interpolation, correlation and truncation functions used in the time realignment function of FIG. 27, according to the invention.
Figure 29A:
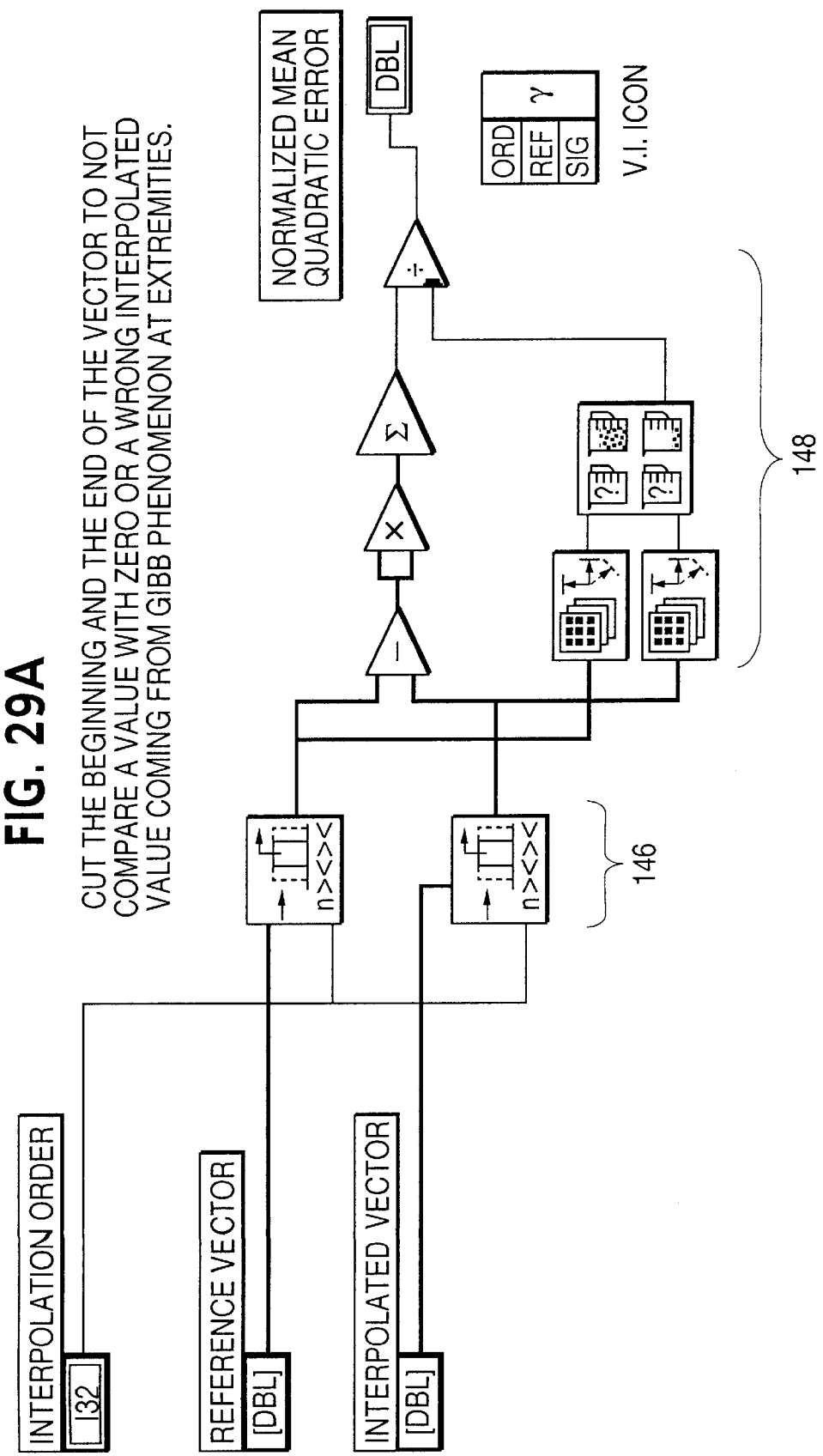
Figure 29B:
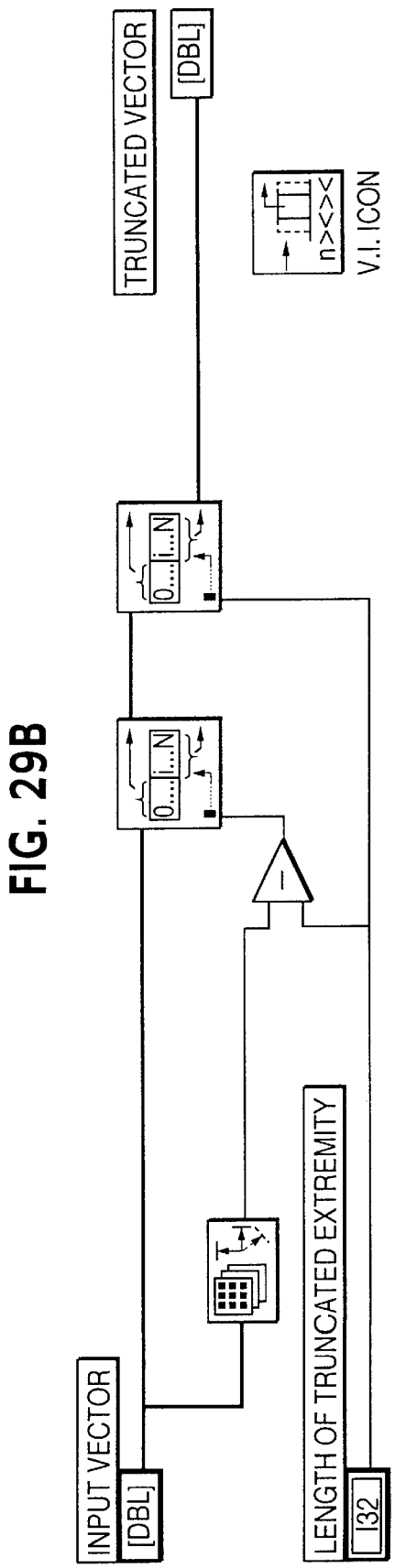

FIG. 28 shows the v.i. of the interpolation 122, 122' prior to the one of the correlation 124, 124', the latter being shown in FIG. 29A. FIG. 29B shows the v.i. of the truncation 146 used in the v.i. of the correlation of FIG. 29A. The left small loop 144 in FIG. 28 determines the number of points that will be interpolated: there should be no interpolation outside the known samples $s_n$ (i.e. no extrapolation). In a same order of idea, the truncation 146 carried out prior to the calculation of the square deviation 148 illustrated in FIG. 29A allows to ensure comparison of non null values among the two vectors. It is not really a correlation that is carried out here, but a simple square error calculation. As the maximum of correlation is obtained when the square error is the lowest, maximizing one or minimizing the other gives the same. The link between the correlation and the square error (or standard deviation) is discussed in more details hereinafter.

Referring to FIG. 27, for a unidimensional iterative search space, the search range is divided by two at each iteration. For a K-dimensional search, this range is typically divided by $2^{1/K}$ if a reduction of the K-dimensional hypersurface per two is desired at each simultaneous iteration on K dimensions. K=2 in the algorithm.

At each iteration, 6 interpolations 122, 122' and correlations 124, 124' are carried out. It is the interpolations 122, 122' that require the greatest calculation power. For clarity sakes, the code has not been optimized. An experienced programmer will have no doubt noticed that it is possible to substantially reduce the iteration and correlation numbers. For example, it is a matter of carrying over the last maximal correlation, its value and the corresponding interpolated envelope for the next iteration. Furthermore, in the absence of local minimums, it is useless to test both possibilities, the one on the left and the one on the right of the last maximum, if the first tested possibility provides a correlation value superior to the central value. There exist other algorithms having faster convergence, such as the Newton method. However, the presence of local minimums and other irregularities possibly affecting the convergence is suspected. The multiplicity of tests and executed iterations by the above-mentioned algorithm avoids that the latter converges toward the wrong solution. This extra-calculation is the cost for robustness.

Tests have been performed with the active time realignment for the zero order $D_0$ and inactive for the first order $D_1$. A sensible improvement of the alignment of the envelopes has been noticed. In fact, a first raw alignment of the envelope is carried out before the passage in the time realignment. A simple correlation between the two envelopes is then carried out, the maximum of correlation pointing the delay attributable to the raw realignment, and this, in integer number of samples. The obtained resolution is of course of more or less a half sampling period. That is, with the time realignment iterative algorithm, the interpolation between two samples improves noticeably the correlation between the envelopes by aligning them at more or less a small fraction of the sampling period.

Of course, the correlation is yet higher for the time realignment with the two drifts in action.

Figure 30:
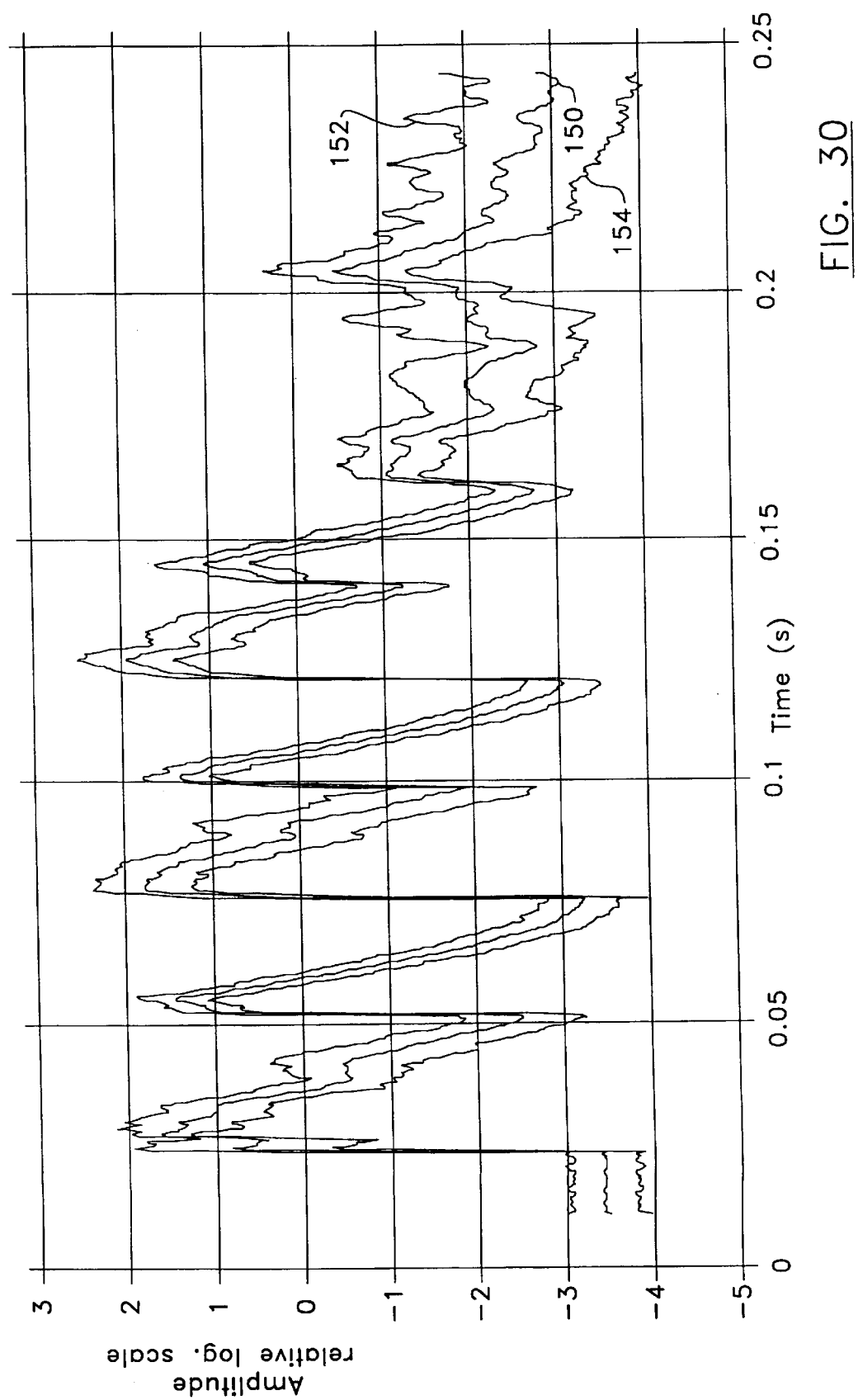
FIG. 30 is a graph of envelope means obtained using a time realignment, according to the invention.
Figure 31:
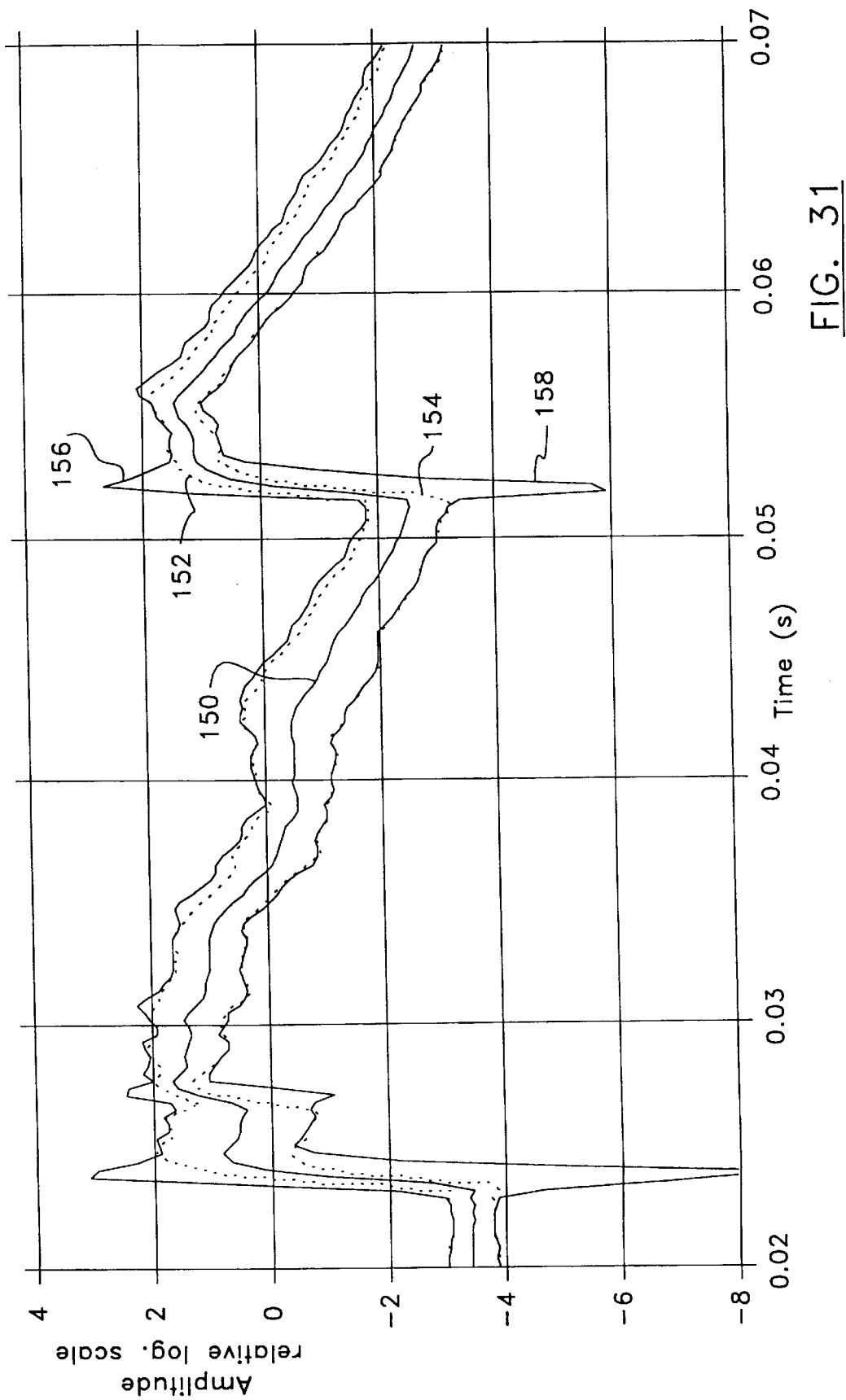
FIG. 31 is a zoom on a portion of the graph illustrated in FIG. 30.

FIG. 30 shows an example of a mean of 100 envelopes 150 with curves at ±3 times the characteristic standard deviation (±3 sigma) 152, 154 of these envelopes 150. With the time realignment, the dispersion is no longer systematically amplified at the transient attacks. FIG. 31 depicts a zoom in FIG. 30, to which curves ±3 sigma 156, 158 obtained in the absence of a time realignment have been added. It appears that the time realignment, by properly aligning the transient attacks, reduces considerably the dispersion on the straights of these attacks. Furthermore, a slight diminution of the dispersion elsewhere than at the transient attacks is observed. Despite its moderated complexity, the time realignment algorithm is more than desirable in a monitoring system.

Figure 32:
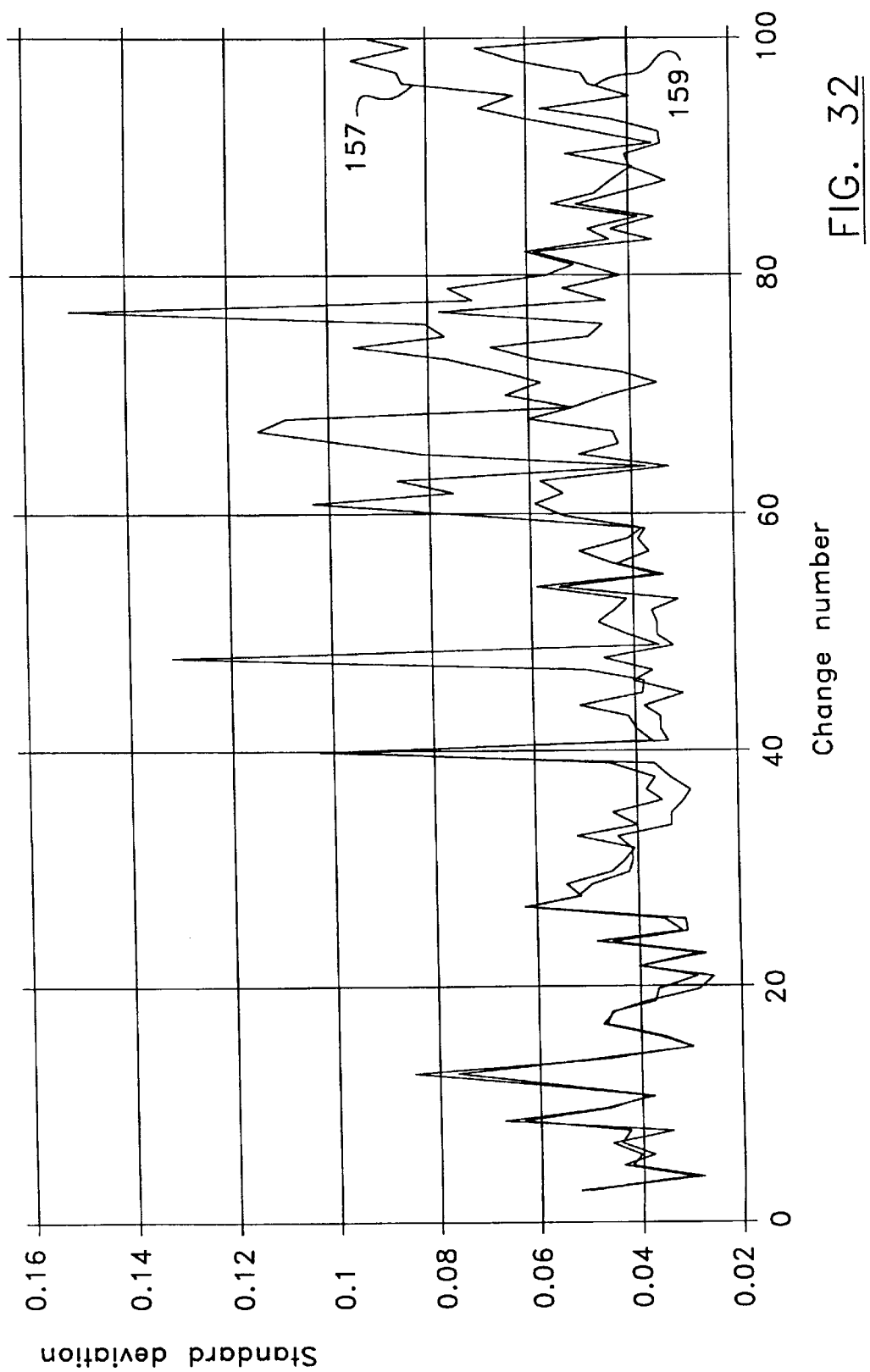
FIG. 32 is a graph of standard deviations before and after successive tap changes of a tap changer, showing the evolution of time drifts of zero and first orders respectively for 100 tap changes of a tap changer.

The time realignment can be used to examine more carefully the evolution of the time frame of the signature. FIG. 32 shows a typical time evolution of the reduction of the square deviation with the first envelope by the application of the time realignment 159 and without the application of the time realignment 157, for 100 tap changes of a tap changer. There is noticed that the reduction is minor at the beginning since the operating conditions are similar. Gradually, the operating conditions become different, thereby increasing the difference with the initial time frame (set by the change n° 1).

Figure 33B:
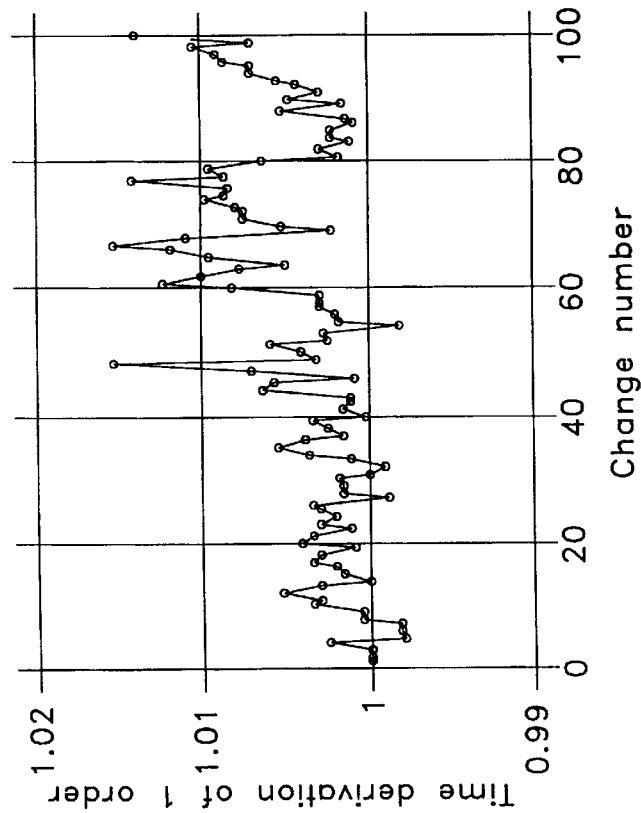
FIGS. 33A and 33B are graphs showing the evolution of time drifts of zero and first orders respectively for 100 tap changes of a tap changer.
Figure 33A:
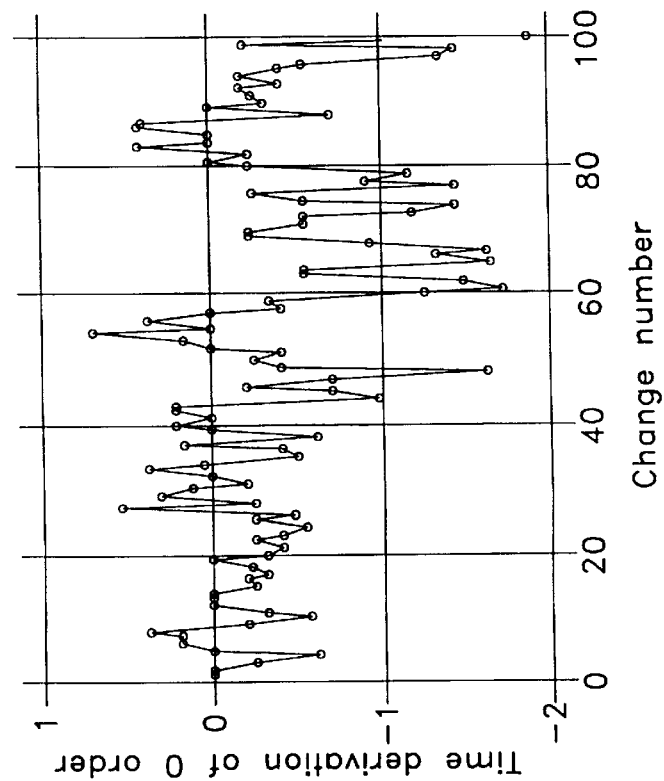

This increase of the distance between a start-up signature and the current signature is also visible on the drifts of zero and first orders $D_0$, $D_1$ as shown in FIGS. 33A and 33B respectively. It is also noted that sometimes, the drift of zero order exceeds the unity when the drift of first order is high. A more exhaustive study would have taken the temperature and the load into consideration to show the influence of these operating conditions on $D_0$ and $D_1$. Finally, other statistics can be accumulated to set the optimal values of the start-up deviations of $D_0$ and $D_1$ as well as the final required resolution on these drift values, namely the iteration number in the realignment algorithm. A start-up deviation set to 1.5 for $D_0$ has proven to be, during a confidential test, too large and the deviation of 3/N for the start-up deviation of $D_1$ seems too small or at the tripping limit of the range. Indeed, with N=469 samples on the signature, there is obtained 3/N=3/469=0.0064 for start-up deviation for $D_1$, and since the multiple iterations give:

$$\frac{1}{\sqrt{2}} + \frac{1}{\sqrt{2}\sqrt{2}} + \frac{1}{\sqrt{2}\sqrt{2}\sqrt{2}} + \frac{1}{\sqrt{2}\sqrt{2}\sqrt{2}\sqrt{2}} + \ldots = 2.4 \quad (10)$$

the maximal tripping range on $D_1$ is limited to 1±(2.4·0.0064), thus 1±(0.0154). That is, the limit of this range has been reached twice in FIGS. 33A and 33B. In this example and for this equipment, it appears that this range limit must be increased. Experience has shown that the start-up range widths depended on the type of equipment to be monitored.

In the above algorithm, it is the first recorded signature that determines the time frame of the reference. All the successive signatures will be time adjusted to correspond to the time frame thereof. It is important that this first signature be representative of the other signatures. Preferably, this signature should especially be not taken in power-off or in extreme operating conditions. A solution would consist in beginning with a time adjustment in the first order for the first signatures and process with a first and second order time realignment afterwards.

The use of means is unavoidable in a context where the signature comprises an important random portion. It is the reason why the use of means is found in many prior art monitoring algorithms.

Here, two running means are used in the monitoring of tap changers and this, for each type of tap change operation (1 to 2, 2 to 3, . . . , 3 to 2, 2 to 1). A first mean will be associated to the signature at the starting up, whereas the second mean is that of the last measured signatures. The first, called original or reference mean, is based on the remote past whereas the second, called actualized mean, is based on the recent past and the present. FIGS. 34A, 34B and 34C illustrate an example of the evolution of respective weightings of the reference 160 (original) and actualized 162 signatures.

Referring to FIG. 1, at each tap change measurement, the measurement 9 can be compared with the reference signature 13A (or actualized 13B) to detect a sudden appearing defect. This comparison is achieved by means of a correlator 149 producing a validation signal 151 that provides a validation indicia of the vibro-acoustic signal. In the absence of a defect, the calculation circuit 12 calculates a new actualized signature 13B and a new reference signature 13A from the last aligned measurement 11. Afterwards, these signatures 13A and 13B are compared by the comparator 14 to detect the appearance of a middle or long term behavior deviation. It is thus important to detail the problem of the running means calculation and the sensitivity of these means relative to white noise and to cyclic noise (year temperature and daily load). Furthermore, the dispersion diminution on the calculated mean must not result in an alarm triggered by a replacement of the sensor or a low instrumentation drift: the chosen alarm threshold, for example ±3.9 sigma (1 in 10000), must not be lower than two times the expected drift of the instrumentation, that is a 5% sudden deviation.

One of the algorithms proposed in the art uses a uniform weighting fixed mean to generate the original signature and a running mean for the actualized signature. By fixed mean, there is meant a simple sum on the N first envelopes, the number N being preset (from 3 to 30), the monitoring beginning when this number of signatures is reached for the tap change in question. Furthermore, the aforesaid algorithm calculates a peak envelope mean, whereas in the present invention, there is carried out a mean of envelopes obtained preferably by Hilbert transform (6) and reconstructed by time realignment (10).

The uniform mean of M envelopes is expressed as:

$$\overline{S}_m = \frac{1}{M}\sum_{m=1}^{M} S_m \quad (11)$$

where $S_m$ is a vector containing the envelope of indicia m such as $S_m = \{S_{1,m}, S_{2,m}, S_{3,m}, \ldots, S_{N,m}\}$. With the uniform mean, in order that there be no mean overlapping, the number M must be finite for the two types of means, namely the original mean and the actualized mean. Indeed, unlike what is illustrated in FIGS. 34A–C, the overlapping of means is not desirable between two uniform type means since the weighting is identical where there is overlapping. The addition of a same quantity to these means does not modify at all the difference between these means! The continuous calculation of the uniform type mean to carry out the original mean is simple and only requires the sum of the envelopes and the number of summed envelopes. However, for the actualized mean, all the envelopes must be memorized in order to subtract the M+1 most former one from the sum of envelopes. In this case, it is required to proceed like a buffer mean (with $c_m=1$).

The buffer mean is the one that offers the most number of possibilities in the choice of summed envelope weightings. Expressed as:

$$\overline{S}_m = \frac{\sum_{m=1}^{M} c_m S_m}{\sum_{m=1}^{M} c_m} \quad (12)$$

with the $c_m$ as weighting coefficients, the coefficients must simply be adjusted to obtain a fixed mean or one of the different recurring means presented hereinafter. The problem with the buffer mean is precisely the buffer, which requires the memorization of all the envelopes to be summed.

There is two manners of expressing a recurring mean calculation under the generalized form. The first one is:

$$\overline{S}_m = \begin{cases} S_0 & \text{for } m = 0 \\ (1 - f(m)) \cdot \overline{S}_{m-1} + f(m) \cdot S_m & \text{for } m = 1, 2, 3... \end{cases} \quad (13)$$

where f(m) is a weighting function solely depending on m. The second:

$$\overline{S}_m = \begin{cases} P(0)S_0 & \text{for } m = 0 \\ \left(\left(\overline{S}_{m-1} \cdot \sum_{i=0}^{m-1} P(i)\right) + P(m)S_m\right) \Big/ \left(\sum_{i=0}^{m} P(i)\right) & \text{for } m = 1, 2, 3... \end{cases} \quad (14)$$

relies upon a weighting function P(i) where the sum $$\sum_{i=0}^{m} P(i)$$

represents the cumulated population on m+1 cumulative envelopes. Worthy of note, a uniform mean is obtained for P(i)=1.0.

The recurring mean requires only to know the value of the last mean and the number m. It must be emphasized that, in the case of a great number of means, the number m must not exceed the maximal value granted by the compiler used for the dimension assigned to this unsigned integer variable (usually, 32768 for 2 bytes or 4.2 billion for 4 bytes). With the second expression, namely equation 14, it is also necessary that the sum of the weights does not exceed the compiler's floating point limit value. In practice, a tap changer can perform more than 500000 operations on the same tap pair during its lifetime. It would be surprising that a tap changer exceeds 10 billion of operations on the same tap (an operation at each 5 minutes during 95 years). The integer and floating point values can thus be allotted on 4 bytes without overflow of the variable.

As an example, let us take the original signature as being the mean:

$$\overline{R}_m = \begin{cases} S_0 & \text{for } m = 0 \\ \left(\overline{R}_{m-1} + \left(\frac{1}{m}\right)^\alpha S_m\right) \Big/ \left(1 + \left(\frac{1}{m}\right)^\alpha\right) & \text{for } m = 1, 2, 3..., \end{cases} \quad (15)$$

for $\alpha \geq 1$, which is equivalent to take equation (13) with:

$$f(m) = \left(\frac{1}{m}\right)^\alpha \Big/ 1 + \left(\frac{1}{m}\right)^\alpha = \frac{1}{1 + m^\alpha} \quad (16)$$

For $\alpha=1$, a uniform weighting mean is found. With $\alpha>1$, the weighting reduces the importance of the recent measurements with respect to the prior measurements. It is this latter characteristic which is searched for in the original mean.

Being usable as an original mean, there also exists the running mean expressed such that:

$$\overline{R}_m = \quad (17)$$

$$\begin{cases} S_0 & \text{for } m = 0 \\ \left(\overline{R}_{m-1} + \sum_{i=0}^{m-1} \frac{1}{i+1} + \frac{1}{m+1} S_m\right) \Big/ \left(\sum_{i=0}^{m} \frac{1}{i+1}\right) & \text{for } m = 1, 2, 3... \end{cases}$$

which is equivalent to take the equation (14) with the weight:

$$P(i) = \frac{1}{i+1} \quad (18)$$

Still as an example, the actualized signature can be expressed as being:

$$\overline{A}_m = \begin{cases} S_0 & \text{for } m = 0 \\ (1 - \eta) \cdot \overline{A}_{m-1} + \eta \cdot S_m & \text{for } m = 1, 2, 3... \end{cases} \quad (19)$$

with $\eta<<1$ and $\eta>0$, a constant representing the weight of the new measurement. It is easy to deduce that $f(m)=\eta$ in the equation (13) for this mean. Here, unlike to the original mean, the weight of the last measurement is the most important for m sufficiently high, hence when $\eta>(1-\eta)^m$. The initial condition imposed when m=0, thus that $\overline{A}_m=S_0$, disrupts a while the actualized signature. It is the problem associated with the use of the expression (13) for a relative weight that must decrease with m; there is a sudden passage of $(1-\eta)^m S_0$ to $\eta(1-\eta)^{m-1}S_1$ for the passage of the weighting of the first to the second envelope, that is a ratio of $(1-\eta)/\eta$ instead of $(1-\eta)$ for the other signatures. In fact, the transient response has a duration, in number of summed envelopes, depending on $\eta$. Since this transient response brings a systematic noise that dims with the sum of the envelopes, it can apparently be tolerated.

In view of the above, the use of running means has been chosen for the calculation of the original (reference) signature and the actualized signature carried out by the calculation circuit 12. The choice of the type of running mean is based at the same time on the dispersion reduction gain and on the transient response of the mean. These two criteria being in conflict, it is important to well detail these topics to reach a compromise.

Despite the fact that the uniform weighting mean is not retained, it is useful to present the dispersion on this mean since it constitutes a lower boundary. Indeed, the uniform weighting is the one that reduces the most the dispersion on the mean for a given number of summed envelopes. The dispersion of a uniform mean on M envelopes is expressed by the variance:

$$\text{Var}\{\overline{S}\} = \frac{\sigma^2}{M} \quad (20)$$

for a noise following the Laplace-Gauss distribution law, $\sigma$ being the standard deviation representative of the dispersion on each envelope. All the other types of means will have a higher variance for a Gaussian noise. But, the presence of cyclic noise (daily loads, season loads . . . ) that does not correspond at all to the definition of the Laplace-Gauss distribution law must be considered. Since the uniform weighting mean has a great sensitivity to cyclic phenomena, it must be replaced by a mean presenting a suitable compromise. Furthermore, supposing the existence of an erroneous envelope, the uniform mean gives a weight of 1/M if this envelope is added and a null weight if this envelope occurs within the summation range of a width fixed by the number M: it is all or nothing!

Typically, the width of the window must be three times higher than the period of the cyclic noise in order that the latter be attenuated. Then, a three year observation window is required before all the coefficients of the filter be used in order that the filter meets these specifications. This delay is unacceptable. In practice, a weighting starting from the unity and gradually decreasing is equal at the beginning of the summation to the carrying out of a uniform mean, minimizing quickly the dispersion on the mean. When the mean is more advanced, the weight of the new samples (for the original mean) or the weight of the former (for the actualized mean) will become substantially scaled down and will be used to stabilize the oscillatory response of the mean to cyclic noise. The latter mean is usable after a few envelope summations and improves indefinitely with time (the standard deviation on the mean continuously decreases). Compared to digital filters, the Gaussian weighting would be a FIR filter whereas the weighting with gradual reduction would be more of the IIR type.

The weighting with gradual reduction is efficiently embodied with a recurring function such as expressed in equations (13) and (14). It is useful to compare the ultimate dispersion of these formulations, that is when the number of summed envelopes tends toward the infinity. In regard to the formulation given in equation (15), the calculation of the noise propagation, for $m \to \infty$, gives a null dispersion. Equally, with the formulation of the equation (16), the population tends toward the infinity for $m \to \infty$ so that the latter also leads to a null dispersion (i.e., the sum of $1/i$ tends toward the infinity for $i \to \infty$). Whatever the formulation chosen, the cyclic noise reduction must be considered as a function of the transient response of the filter. For the original mean, this response determines the stabilization time of the mean. Intuitively, it will be understood that if a reduction of the annual cycle is required, the stabilization of the original mean will take more than one year. The formulation in (15) allows to adjust the value a as a function of the number of summed envelopes for the stabilization. Knowing that:

$$\lim_{\epsilon \to 0}\{x^{1+\epsilon}\} = x + \epsilon \cdot x \cdot ln(x) \tag{21}$$

if $\alpha = 1 + \epsilon$ is taken, there is obtained that the stabilization starts when:

$$\epsilon \cdot \ln(m) > 1 \tag{22}$$

For example, if it is known that there are 500 tap changes from $7 \to 8$ in average during a year, $\alpha$ will be set such as $$\alpha = 1 + \frac{1}{\ln(m = 500)} = 1.16.$$

A question must be raised here: do the weighting must be set as a function of the number of operations m or would it be preferable to set it as a function of time? The setting of this weighting as a function of m appears simpler but less optimal regarding cyclic noise that depends on time. Should the same value $\alpha$ be applied for each type of tap change or would it be desirable to increase $\alpha$ for less frequent tap changes? Once again, for simplicity reasons, it would be advantageous to keep up with a unique value of $\alpha$. For a unique value of $\alpha$, the examination of the behavior of each tap change is necessarily detailed as a function of m and not as a function of time. Yet, many aging factors linked to the concerned operation $x \to y$ depend on $m_{x \to y}$, i.e. the number of operations and not the time. In summary, certain aging processes, the simplicity and the robustness require a weighting as a function of m with the same coefficient $\alpha$ for the different tap changes.

For the particular case of the actualized signature with $f(m) = \eta$, the calculation of the noise response of the filter defined in equation (13) is obtained by the examination of the impulse response of the mean calculation. Given a single non null signature such as:

$$S_i = \begin{cases} c & \text{for } i = k \\ 0 & \text{elsewhere} \end{cases} \tag{23}$$

then the resulting running mean is expressed as:

$$\overline{S}_{m,k} = c \cdot f(k) \cdot \prod_{j=k+1}^{m} (1 - f(j)), m > k \tag{24}$$

as a function of the m signature+1, for this precise case of signal. It is noted that the weight of $S_k$ dims with the sum of each new signature for a function $0 < f(j) < 1$. This weighting can be carried on the general case of a non null signature $S_m$. Let us call population the parameter:

$$P_m = f(m) + \sum_{k=0}^{m-1} f(k) \cdot \prod_{j=k+1}^{m} (1 - f(j)) \tag{25}$$

that represents the sum of the weights of m+1 signatures. The relative weight thus equals equation (24) divided by equation (25). More generally, there is deduced that the running mean expressed in a regressive fashion in (13) can also be expressed as:

$$\overline{S}_m = \frac{S_m f(m) + \sum_{k=0}^{m-1} S_k f(k) \cdot \prod_{j=k+1}^{m} (1 - f(j))}{f(m) + \sum_{k=0}^{m-1} f(k) \cdot \prod_{j=k+1}^{m} (1 - f(j))} \tag{26}$$

Supposing a Gaussian white noise on each signature such as:

$$\text{Var}\{\overline{S}\} = \sigma^2 \cdot \left. \frac{f^2(m) + \sum_{k=0}^{m-1} f^2(k) \cdot \prod_{j=k+1}^{m} (1 - f(j))^2}{\left(f(m) + \sum_{k=0}^{m-1} f(k) \cdot \prod_{j=k+1}^{m} (1 - f(j))\right)^2} \right|_{m \to \infty} \tag{27}$$

according to the error propagation theorem.

By introducing $f(m) = \eta$ in the latter equation, there is obtained:

$$\text{Var}\{\overline{S}\} = \sigma^2 \cdot \frac{1 - \frac{1}{2\log(1 - \eta)}}{\left(1 - \frac{1}{\log(1 - \eta)}\right)^2} \tag{28}$$

after a few manipulations and replacement of a sum by an integral such as:

$$\sum_{k=0}^{m-1} (1 - \eta)^{-k} \cong \int_{k=0}^{m-1} (1 - \eta)^{-k} dk \tag{29}$$

$$= \frac{1}{\log(1 - \eta)} (1 - (1 - \eta)^{-(m-1)})$$

Which finally provides:

$$\text{Var}\{\overline{S}\} \approx \sigma^2 \cdot \frac{\eta}{2} \tag{30}$$

when $\eta \ll 1$. The latter formulation allows to predict the standard deviation on the mean of signatures corresponding to the actualized signature. It is noted that, unlike the means close to four times the standard deviation while having a transient response of 15 means.

If it is important for the original mean to have a standard deviation that tends toward zero with the number of summed envelopes, though, for the actualized mean, a non null dispersion can be tolerated. Indeed, this second mean is compared with an isolated signature that has already an important dispersion. The mean dispersion must simply be three times lower so that it contributes only to 5% of the comparison error. The comparison error is equal to the square root of the sum of the errors squared, that is $1.054 = \sqrt{1+(1+(1/3)^2}$ for the latter example. Furthermore, as previously mentioned, the user must put up with a sudden deviation of 5% of the actualized mean with respect to the original mean, in the event of a replacement of one of the components of the measurement line. It is thus useless to seek out a reduction of the dispersion on the actualized signature lower than 5% full scale. Yet, the actual dispersion of an isolated signature is less than 20% of the amplitude of the signal, using a time realignment (10) and the envelope calculation by the Hilbert transform convolutional algorithm (4) and in the absence of arcs. It is thus useless to reduce this dispersion well under 5%. The setting of $\eta=0.1$ constitutes a sound compromise giving less than 5% of the full scale dispersion.

The standard deviation on the signatures must not be confused with the standard deviation on the mean of signatures. In the calculation of the dispersion on the signature, it is especially important to compare each measured envelope with a mean representative of the last envelopes. In the presence of a drift of the envelope, if the mean is not sufficiently fast to adjust therewith, then there will be a bias that will be added in this dispersion suggested for the calculation of the original signature, the variance does not tend toward zero with $m \to \infty$ but rather depends on $\eta$. For example, a factor reduction of 10 of the standard deviation requires that $\eta=0.02$. Of course, the smallest $\eta$ is, the greatest the number of signatures must be summed before reaching a stable actualized signature. This mean gets close to the stability when the weight of the new signature is of the magnitude order of the standard deviation on the mean, i.e. when:

$$(1-\eta)^m \approx \sqrt{\frac{\eta}{2}} \tag{31}$$

The number of summed signatures will then be higher than:

$$m = \ln\left(\sqrt{\frac{\eta}{2}}\right) / \ln(1-\eta) \tag{32}$$

in order that there be stabilization of the mean to claim to the validity of the equation (26) (i.e. m is considered to be the infinity for this equation).

A compromise will have to be made between the reduction of the standard deviation and the number of required signatures, or indirectly time, to reach the stability of the mean. On one hand, a low standard deviation mean is sought, whereas on the other hand, if a behavior change occurs, a mean that adjusts the most rapidly as possible to this change is desired. In other words, the quickness of the response of the mean algorithm is inversely proportional to the reduction of the dispersion on the signature.

FIG. 35, showing the reduction 153 of the standard deviation $\sigma_{mean}/\sigma_{signature}$ and the transient response 155 of the mean in number of signatures as a function of the weight $\eta$, exhibits a useful charter to make a compromise for the choice of $\eta$ in the actualized mean. Here, a $\eta=0.1$ reduces calculation. On the other hand, in the calculation of the dispersion of a mean, it is important to evaluate correctly the propagation of the dispersion of the signature on the mean and to take the low drifts of the envelope into consideration.

With the calculation of the signature dispersion, a biased means, but simple and efficient, consists in taking the sum of the squares of the deviations that each new signature has with the mean and to divide this sum by the number of summed deviations, that is:

$$\text{Var}\{S\} = \frac{1}{M-1} \sum_{m=2}^{M} (S_m - \overline{S}_{m-1})^2 \tag{33}$$

$$\text{with the mean } \overline{S}_{m-1} = \frac{1}{M-1} \sum_{m=1}^{M-1} S_m$$

Of course, at the beginning of the mean and when $\overline{S}_{m-1}$ is based only on one signature, the double of the variance (i.e. $2\sigma^2$) is statistically obtained. The dispersion is thus overestimated. Afterwards, this bias gradually decreases. This calculation has however the advantage of comparing an envelope with the running mean's last value; this calculation is thus less sensible to the presence of a signature drift if the running mean follows the drift. The other calculation is classical, i.e.:

$$\text{Var}\{S\} = \left(\frac{1}{M} \sum_{m=1}^{M} S_m^2\right) - \overline{S}_M^2 \tag{34}$$

where the difference between the energy contained in the envelopes and the energy of the final mean is calculated. Yet, if there has been fluctuations on the mean signature within the M signatures, this fluctuation will be interpreted as a source of dispersion. This dispersion calculation does not overestimate at the beginning the dispersion but, however, includes systematically all the slow drifts of the signature.

The calculation proposed in equation (33) can be useful for the comparison between the last acquired envelope and the actualized mean. Indeed, it is highly useful to overestimate at the beginning the dispersion so that the user is not warned unnecessarily while the mean calculation is not stabilized; this choice brings robustness. Furthermore, being less sensible to the slow drifts of the signature, the dispersion value provided by this calculation comes closer to the actualized dispersion value.

Conversely, the calculation of the dispersion proposed in equation (34) is more interesting to qualify a threshold in a comparison between the original mean and the actualized mean. The actualized mean will be disturbed by cyclic noise whereas the original mean will be gradually exempt therefrom with the cumulation of measurements.

Equations (33) and (34) do not take the weighting applied by the mean into account. In the case of a constant standard deviation, this weighting needs not be applied. But when it is not known if this standard deviation is indeed constant, there is no other choices than to develop a standard deviation estimation algorithm that will take this weighting into account. For the actualized mean, the following recurrent calculation is suggested:

$$\text{Var}\{S\} = \begin{cases} S_0 & \text{for } m = 0 \\ (1-\eta^2) \cdot \text{Var}\{S_{m-1}\} + \eta^2 \cdot (S_m - \overline{A}_m)^2 & \text{for } m = 1, 2, 3 \ldots \end{cases} \quad (35)$$

that will allow to adjust the variance as a function of the signature behavior. One of the advantages to weight the actualized mean consists in the gradual elimination of a variance increase caused by a very noisy tap change or different because of a unique operation condition (e.g. an off-load or power-off tap change). Several noisy or divergent tap changes are likely to be produced at the starting up of the monitoring system and during the maintenance of the tap changer. For $\eta=0.1$, the system's sensitivity will be lessen for a hundred of tap changes following the perturbation (the value corresponding to $\eta^2=0.01$ on FIG. 35 is looked for). The acquired signatures must thus correspond to the normal working conditions. The danger of using an actualized variance calculation is the apparition of a constant and important noise that would reduce the sensitivity of the monitoring. The choice of an actualized variance calculation must preferably be accompanied with a warning or a follow-up on the increase of the signature's dispersion. The signature's dispersion can constitute an important diagnostic information for the measurement line. A null dispersion is impossible, unless a defect of the monitoring system (defective channel, bug in the calculation algorithm . . . ), and an always high dispersion means random vibrations in the transformer or the tap changer, or yet an important noise providing from the instrumentation.

For the original signature mean, if the mean defined in (15) is carried out, the following calculation is suggested:

$$\text{Var}\{S_M\} = \left( \frac{\sum_{m=1}^{M} \left( \frac{1}{1+m^{\alpha-1}} \right) S_m^2}{\sum_{m=1}^{M} \left( \frac{1}{1+m^{\alpha-1}} \right)} \right) - \overline{R}_M^2 \quad (36)$$

which will allow to set the variance while including therein the low cyclic drifts of the signature. For $\alpha=1$, equation (34) is obtained as it should be.

The comparison between the two dispersion values given in equations (35) and (36) should allow to diagnose the actualized dispersion that changes in time.

In many applications, the accuracy required for the dispersion calculation is usually much less than for the mean calculation. However, since the dispersion value is used as a limit that must not be exceeded around the signature, the dispersion must be as accurate as the mean value of the signatures. It is a matter of an accuracy close to that of the mean.

The correlation is a simple tool which, in the presence of Gaussian noise, allows to reach the maximum likelihood in different optimisation algorithms. In the monitoring action, the correlation is intended for the following purposes:
roughly aligning the measured envelope with the actualized signature;
globally validating the correspondence between two signatures; and
giving a global indicia of the deviation between two signatures.

The correlation coefficient/factor, expressed vectorially, i.e.:

$$\gamma^2 = \frac{\vec{A} \cdot \vec{B}}{|\vec{A}| \cdot |\vec{B}|} \quad (37)$$

with $\vec{A} = \{A_1, A_2, \ldots, A_n\}$ et $\vec{B} = \{B_1, B_2, \ldots, B_n\}$ corresponds to the covariance of the vectors in question. In the centered correlation, the direct component is removed from the vectors, i.e. the mean value of each of them, which gives:

$$\gamma^2 = \frac{(\vec{A} - \vec{1} \cdot \overline{A}) \cdot (\vec{B} - \vec{1} \cdot \overline{B})}{|\vec{A} - \vec{1} \cdot \overline{A}| \cdot |\vec{B} - \vec{1} \cdot \overline{B}|} \quad (38)$$

with $\overline{A} = \frac{1}{N} \sum_{n=1}^{N} a_n$ and $\overline{B} = \frac{1}{N} \sum_{n=1}^{N} b_n$ These latter formulations are suitable when the signatures are aligned, i.e. after the time realignment 10. Among other things, the centered correlation carried out on a logarithmic scale can suppress the drifts of gain on the instrumentation. Indeed, on the logarithmic scale, a drift appears as an addition of a constant to the signal, constant which is suppressed with the centered correlation.

When the signatures are not aligned, a formulation giving the correlation value as a function of the delay applied between the signatures is used instead. For this, the analytical expression of the correlation function between two variables x and y is first used, i.e.:

$$\gamma^2(\tau) = \frac{\int x(t) \cdot y(t-\tau) dt}{\sqrt{\int x^2(t) dt} \cdot \sqrt{\int y^2(t) dt}} \quad (39)$$

where x and y can be centered functions or not (i.e. of null mean). The withdrawal of the direct component from the two vectors is useless if the goal is to locate the maximum of correlation, and not to find its value. Transcribed for discreet measurements limited to N samples, the correlation function:

$$\gamma^2(k) = \frac{\sum x_n \cdot y_{n-k}}{\sqrt{\sum x_n^2 \cdot \sum y_n^2}} \quad (40)$$

with $\{n \in [1, N] \mid (n-k > 0) \cap (n+k \leq N)\}$ will be maximal for the integer value k that will align the signatures to the maximum likelihood. The algorithm of certain prior art instruments is limited to such a time alignment providing a half sampling period resolution. In the present monitoring algorithm, it will be to the time realignment algorithm 10 to adjust the signatures below an integer value around the value k.

Let the scalar product:

$$\vec{A} \cdot \vec{B} = |\vec{A}| \cdot |\vec{B}| \cdot \cos(\theta) \quad (41)$$

between two vectors. The correlation depends on the angle between the vectors such as:

$$\gamma^2 = \cos(\theta) \quad (42)$$

Likewise, let us examine the square of the difference between these vectors, i.e.:

$$(\overline{A}-\overline{B})^2 = |\overline{A}|^2 + |\overline{B}|^2 - 2|\overline{A}| \cdot |\overline{B}| \cdot \cos(\theta) = |\overline{A}|^2 + |\overline{B}|^2 - 2|\overline{A}| \cdot |\overline{B}| \cdot \gamma^2 \quad (43)$$

which amounts, in the present application, to the square deviation between two signatures. The latter equation properly set forth the relation between the square deviation and the correlation value. It is clear that the deviation minimum is obtained when the correlation coefficient $\gamma$ is maximal.

The mean square deviation and the correlation, are both global values expressing respectively the distance and the relative moving closer between two signatures. In a practical point of view, to determine if an alarm threshold is exceeded, the mean square deviation will be preferably used since it is on a more concrete scale than the correlation. However, to judge the correspondence between signatures, the correlation allows the use of an adimensional criteria.

The recognition of signatures gives rise to two objectives: the confirmation of the presence of the expected tap change and the diagnosis. There exists many circumstances where the acquired signature does not correspond to the expected one, for example:

accidental triggering of the acquisition;

an erroneous measurement of the tap numbers;

an incomplete tap change (major defect);

the presence of a high amplitude unusual noise (e.g. defective fan, compressor or welding nearby).

The recognition of signatures must be apt to perform a first validation of the signature and to warn the presence, and even the importance, of any anomaly to the monitoring system. A low correlation means that the signature is unrecognized. If the correlation looks to be excellent with a tap change signature of a neighboring number, it possibly means an error on the measurement of the tap number. Incidentally, with the data collected during a test with the present invention, it has been shown that the recognition of the signatures was accurate enough to disuse the information of the tap number! Typically, the correlation value was close to unity (0.95 and more) for signatures coming from a same operation whereas it was going under 0.8, for signatures that did not correspond to the same operation. In the elaboration of the monitoring system algorithm, one of the task is to define correlation ranges or thresholds allowing to detect the circumstance(s) creating the low correlation. Different strategies must be implemented to recognize the different diagnostic symptoms that characterize a correlation loss. For example, a complementary measurement with the muted tap changer (prior to and after switching) would allow to confirm the presence of an abnormal noise that was already present or that occurred between two tap changes.

The correlation can also be used for targeted diagnostic purposes when the object of the search is precisely known. For example, if a type of defect manifests itself by a well determined frequency and envelope vibration, the correlation of the defect's signal allows to localize such a defect if it is present in the signal. However, this use of the correlation requires to have typical defect signatures that allows to implement such diagnostic mechanisms.

Referring to FIG. 1, the monitoring apparatus according to the invention can be provided with a band separator 170 coupled between the conversion stage 2 and the rectifier 4, to separate the digital signal 3 in distinct frequency bands processed separately by the circuits downstream from the separator 170 (the rectifier 4, the convolutional filter 6, etc.).

The multiband approach is a compromise between a unique envelope and a time frequency distribution of the signature. On one hand, the actual cost of the memory does not allow to store a time frequency signature for each type of operation of a tap changer. On the other hand, the acquired experience in the field does not allow the intelligible interpretation of time frequency signatures. Finally, the level of knowledge of the potential users and their concern are too further from the concept of time frequency signatures.

In the multiband analysis, it is preferable not to duplicate an information by placing it in more than one band. The frequency bands must contain a complementary and not redundant information. When this object is reached, the sum of the content of the frequency bands must then give the original signal. The trite subtraction:

$$Band_i(t) = signal(t) - \sum_{n \neq i} Band_n(t) \quad (44)$$

constitutes a simple means to guarantee the non-redundance. For a separation between two bands, it is expressed as:

$$Band_2(t) = signal(t) - Band_1(t) \quad (45)$$

which allows to apply a single convolutional filter to find the signal of the first band, the signal of the second band being calculated by a simple subtraction. Caution: an adequate truncation of the signals is required so that the time samples are properly aligned before subtraction.

The integration of an acceleration signal gives the speed. Yet, if the acceleration characterizes the peak amplitude of a shock (F=m·a), the speed, however, characterizes the vibratory energy or power involved (E=0.5 m·v²) and absorbed. It may be possible that there be a strong diagnostic interest for a combination of a speed envelope with a high frequency acceleration envelope. As illustrated in FIG. 1, an integrator 102 can then be inserted before the rectifier 4, in order to obtain a speed signal on one or many frequency bands depending on whether the frequency band separator 170 is used or not. The integration increases the amplitude of the low frequencies to the detriment of the high frequencies. An integration amounts to applying a low pass filter of 20 db/decade everywhere on the band, or yet, to divide the spectral amplitude by the frequency. The integration can thus be used as a low pass filter to preserve the low frequency content of the signal. Of course, here, there is no mutually exclusive separation between the two bands, unless the signal in a low frequency band is integrated and the high frequency band signal is not integrated, both of these bands being mutually exclusive.

It is important to emphasize that the localisation of the sensor has a prominent importance in the success of the signal integration. Indeed, if there is a dominant transmission mode, the obtained envelope will be similar except for a scale factor no matter if it is the speed or the acceleration that is taken. Ideally, the signal must have a uniform spectral distribution.

Figure 36:
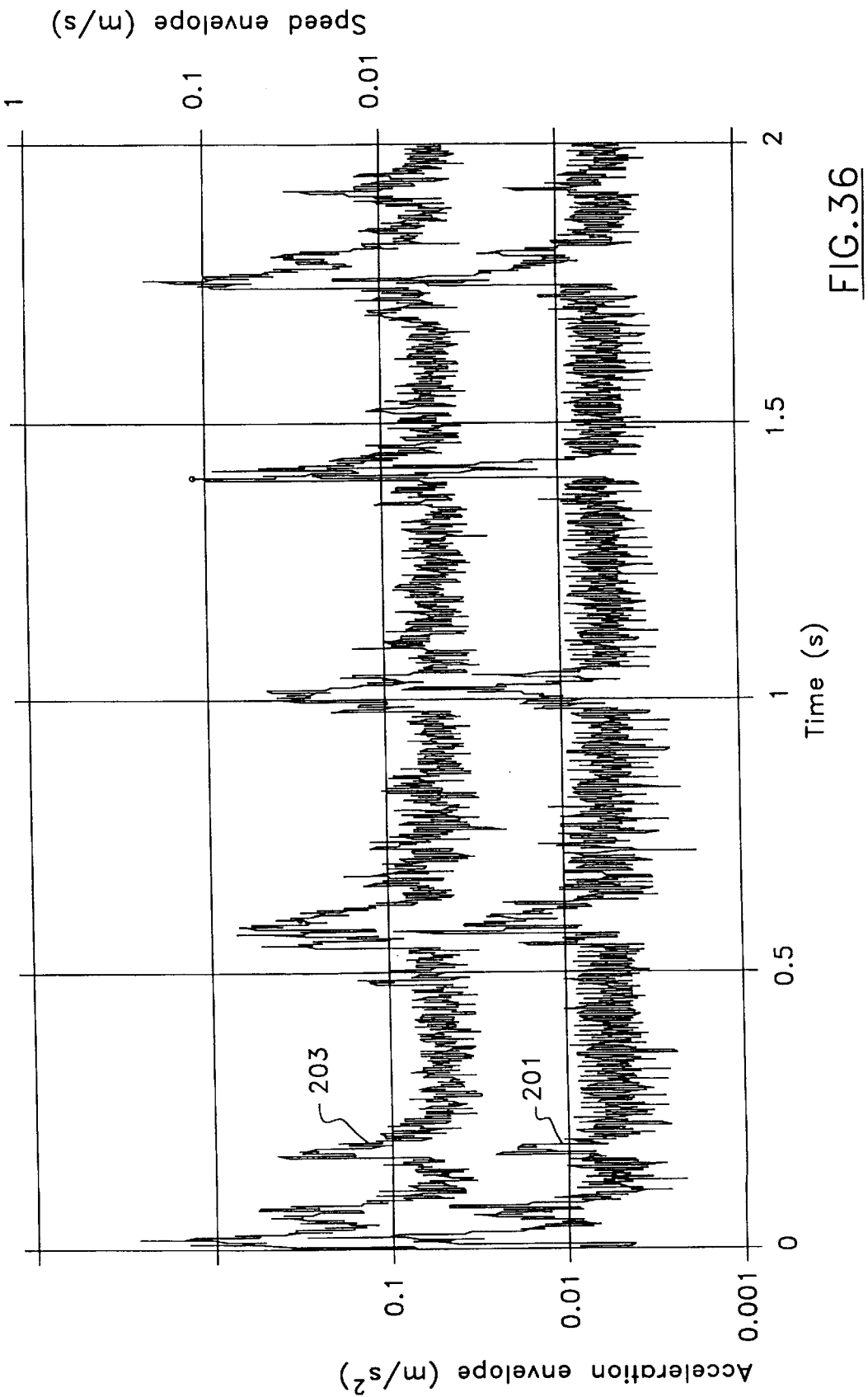
FIG. 36 is a comparative graph between acceleration and velocity envelopes in a 1–26 kHz band for a transformer on-load tap change, according to the invention.
Figure 37A:
FIGS. 37A–40B are comparative graphs of envelopes of four off-load and on-load tap changes, according to the invention.
Figure 37B:
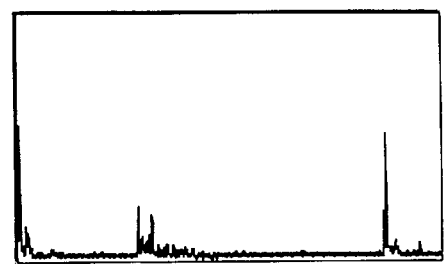
Figure 43:
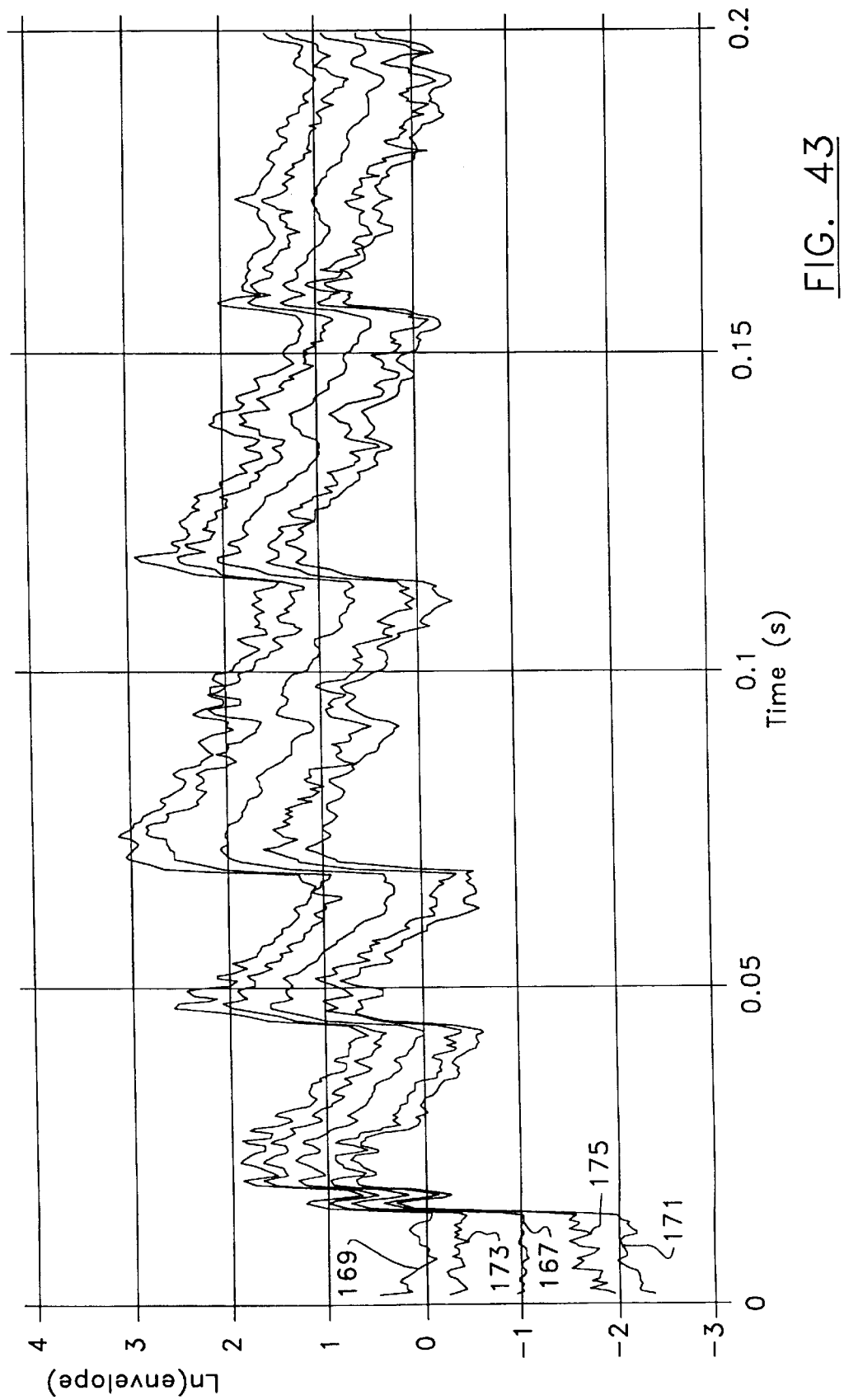

For example, FIG. 36 exhibits the acceleration envelope 201 and the speed envelope 203 in the 1000 Hz to 26 kHz band for a tap change where an arc defect is present. The time frequency distribution of the original signal showed the presence of low frequency modes and a dominant mode appearing at 19 kHz. The high pass filter 92 suppressing the signal of a frequency lower than 1000 Hz, there remains few information to separate these envelopes: the envelope of the signal transmitted by the dominant mode remains about the same after integration. However, separated in two distinct frequency bands of acceleration, one 205 going from 0 to 2.56 kHz and the other 207 going from 10 k to 25 kHz, the obtained envelopes are highly different as illustrated in FIG. 43. The arc appears at 1.44 s on the 10 k to 25 kHz envelope (207).

The integration of a constant gives an infinity value. Likewise, a very low frequency will be excessively amplified by the integration. Furthermore, the 120 Hz vibration, as well as the harmonics thereof, do not matter. It is why a high pass filter must be applied before or after integration, to eliminate these vibrations that are, fortunately, in good part devoid of relevant diagnostic information on the operation of a tap changer. Finally, the likelihood between the envelopes 201, 203 in FIG. 38 does not come from the suppression of the low frequency band but as it should from the presence of the same information providing from the 19 kHz vibration mode.

The envelope extracted from a signal restricted to one frequency band has a bandwidth equivalent to this band. It is thus possible to decimate the obtained envelope until obtention of a sampling rate equal to the double of the bandwidth of the signal prior to the envelope calculation. To further decimate would likely cause spectral aliasing, unless a low pass filter is applied after the envelope calculation as explained earlier.

It should be noted that an original signal sampled at X k samples/s, separated in N equidistant frequency bands, will require N·X/N k samples/s, i.e. X k samples/s, to carry the envelope information on all of these bands; the volume of the information carrier remains constant for a proper decimation.

The compression by decimation of the signature is preferably required to minimize the memory space and to avoid handling redundant information. The decompression by interpolation can be used to graphically present the envelope to a user. It is also possible to use the interpolation in order to detail a peak amplitude occurring between two samples of the compressed envelope. The compression and the decompression by scaling and rounding to obtain a 16 bytes integer, are essentially intended to provide a minimization of the memory space and constitute a suggestion made to the eventual persons in charge of the implementation of the monitoring algorithm according to the invention.

It is important not to mistake the number of samples per second with the time resolution. The time resolution depends directly of the frequency band allotted to the signal, considering, of course, the respect of the Nyquist-Shannon sampling theorem. This theorem specifies that the sampling frequency must be higher than the double of the highest frequency present in the signal, i.e., here, the bandwidth. The number of samples per second must thus respect this theorem, either if this number is the result of an acquisition, an interpolation, a decimation or any other digital processing. The number of samples per second can thus easily exceed the time resolution. As the minimization of the memory space requires a reduced number of samples, the latter will be set slightly over the highest present frequency. The reserve, qualified as "slightly over", has its importance, since certain digital processings affect the end of the band allotted to the signal. On a spectrum, the pass band of a signal must decrease in amplitude at the end of this band, this transition occupying less than 10% of the band. It is worth mentioning that during the acquisition, the transition of the antialiasing filter typically occupies 28% of the spectral band, on a commercial spectral analyser (400 lines displayed for a FFT of 512 spectral lines). In a digital processing, requiring 10% is not excessive and requires a filter length (or order) accordingly.

There can also be asked the question "could the compression or decimation be more important on the standard deviation vector?" On one hand, the required memory space is again a bit reduced, but conversely, the complexity of certain signature comparison algorithms is increased. Indeed, if the standard deviation vector is twice decimated, the same sample must be used twice, or yet it is required to interpolate between two standard deviation samples, to cover all the samples of the signature mean.

The decompression by interpolation is achieved with a technique similar to the interpolation used in the iterative algorithm of the time realignment 10. It is a matter of taking the ideal reconstruction function, the sinc ( ) function, to limit the time width thereof by multiplying it by a spectral window, taking care of normalizing with the sum of the coefficients, and, finally, to perform a convolution of it with the original envelope to which equidistant null samples have been intercalated. The convolution acts as a low pass filter filling the null samples with the interpolated value; the amplitude must be corrected with a scale factor corresponding to the interpolation ratio (i.e. for five times more samples, the amplitude is multiplied by five). An important detail must be emphasized: since the sinc ( ) function comprises negative values, the interpolation of the signature presented on a linear scale may yield to a negative value if there is spectral aliasing. But, as previously mentioned, a negative value has no sense and cannot be set in a logarithmic scale. However, the interpolation of the signature can be carried out without any risk on a logarithmic scale.

Arcing is one of the most typical defects that are observed in tap changers. It could be enough to observe whether there is an excess and indicate a defect, without detailing the nature. However, if arcing is present in a tap changer when the monitoring system is put into service, no excess will be ever observed since it will be present on the original signature. The ability of recognizing where there is arcing on a tap change signature, constitutes an important diagnostic progress, which, by means of the invention is possible.

The spectral characteristic of a unique arc is that it looks like pink noise. By pink noise, it is meant a random noise having no uniform spectrum. This non-uniformity will be intensified by the flow of the pressure signal generated by the arc up to the sensor. The resulting transfer function will color the arcing signal for good so that it will not be easily distinguished from the other high frequency mechanical noise.

Figure 38A:
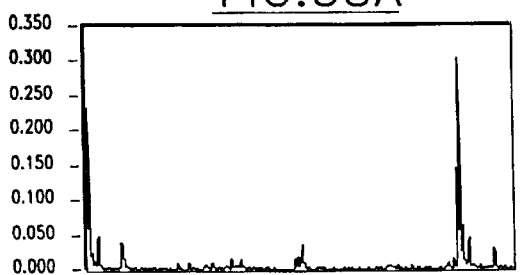
Figure 38B:
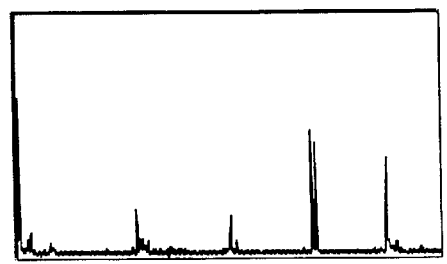
Figure 39A:
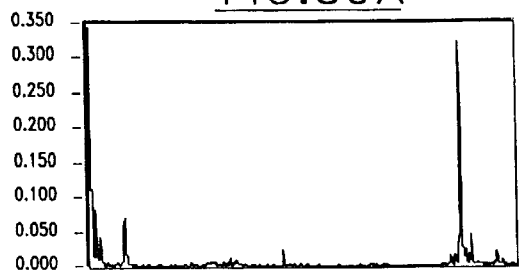
Figure 39B:
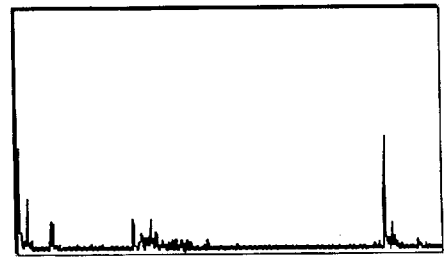
Figure 40A:
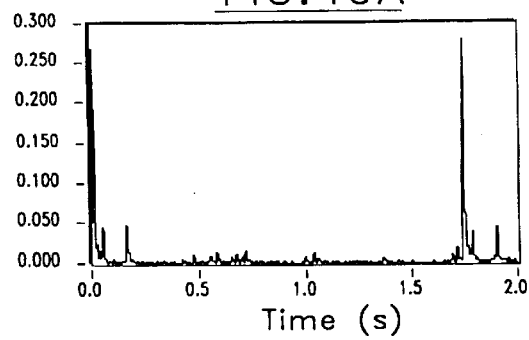
Figure 40B:
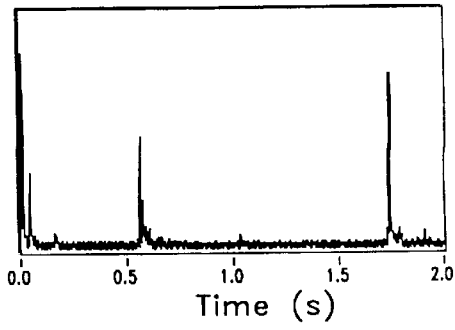
Figure 41:
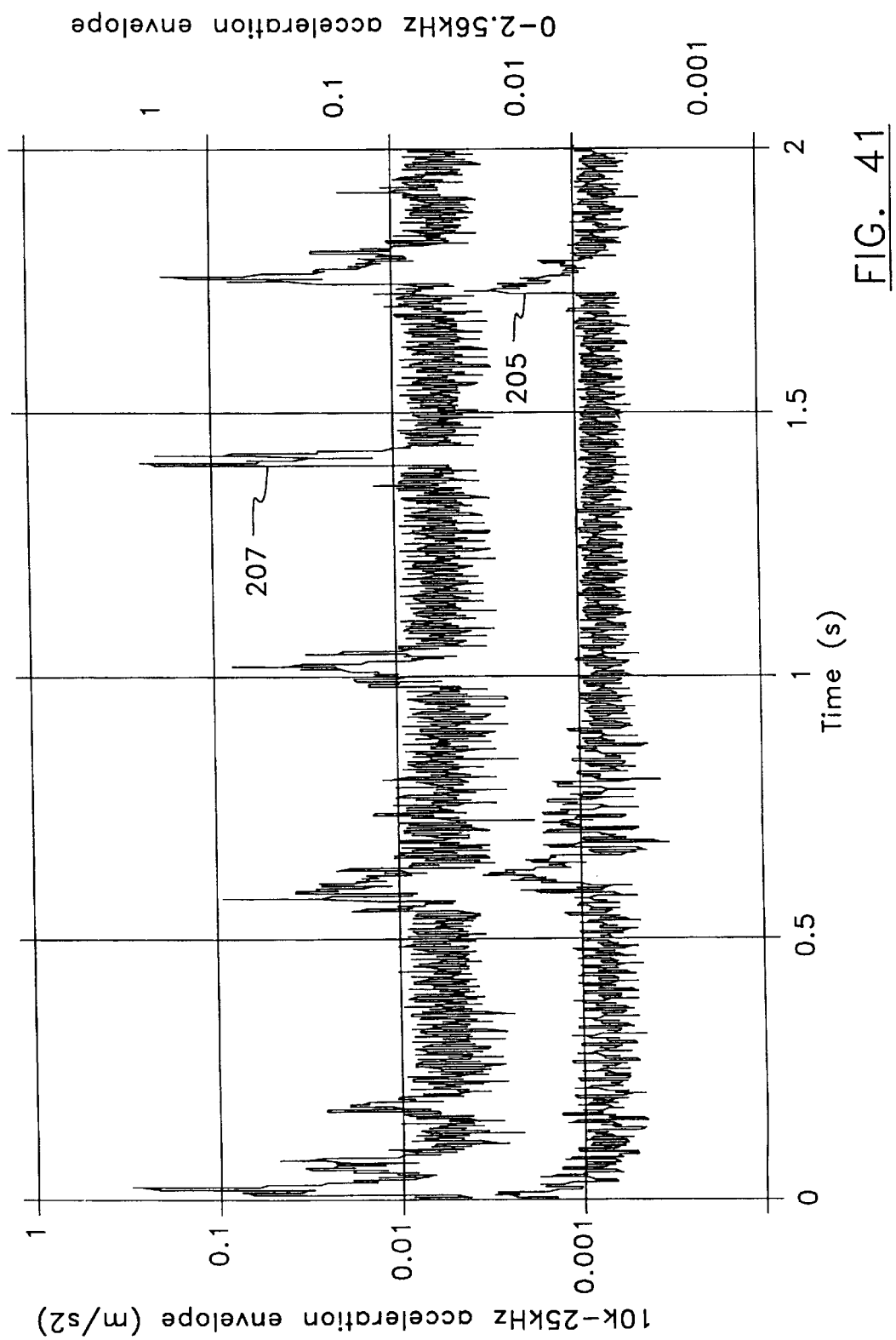
FIG. 41 is a graph of envelopes extracted from low and high frequency bands, according to the invention.

The comparison between the mechanical signature (power-off) and the on-load signature provides also a good idea of the electromechanical forces and the arcs that are present. FIGS. 37A to 40B exhibit such a comparison for envelopes of four types of tap change power-off 37A–40A and on-load 37B–40B. The selector is actuated until the load switching at 1.75 s. There is the apparition of an event at 0.6 s on these four envelopes with the on-load setting. This transient is apparently normal. However, the transient appearing at 1.44 s on the envelope of the tap change in FIG. 38B is abnormal and of a high amplitude. A low frequency signal envelope shows nothing at 1.44 s for this tap change (FIG. 38A). For that matter, if a high frequency envelope is compared with a low frequency envelope, as illustrated in FIG. 41, it is seen that the arcing is only visible on the envelope of the high frequency band 176. The utility of carrying out multiband envelopes is thereby evident.

The implementation of an arcing detector relies upon the possibility that the arcing comes with a spectral and time pattern which is specific and distinct from the other mechanical events. The comparison between the mechanical signature and the on-load signature brings a complementary information highly useful but makes the system's putting into service more difficult, as for the monitoring algorithm. The ability to store a particular signature should be designed among the functions of the monitoring system. of course, only a specialized user will be apt to carry out a manual comparison of the so-memorized signatures. The detection of an excess in multiband only allows to point toward an arcing possibility when the excess is present only on the envelope of the high frequency band. Here, it is a question of an absolute diagnostic possibility by the examination of a unique signature or a comparison between a signature and a common reference template for this type of equipment. The sensitivity is lessen, indeed, but it allows in the absence of background to detect misassembly and other defects when the new equipment is put into service.

Referring to FIG. 1, tests have been carried out with some tools of the monitoring system according to the invention, with the configuration parameters recommended to produce a signature mean with the extreme deviations on 100 signatures. The processed signatures are those of a month for a predetermined tap change, cumulated by the installed measurement system. The signal is separated in two mutually exclusive frequency bands with the cut-off frequency set at 0.1 bin, thus 6.4 kHz. Two envelopes are thus extracted for each signature. Each envelope is calculated with the convolutional algorithm performing the Hilbert transform (4), such as hereinabove described. The decimation rate (8) is 32 in order to cut down the sampling frequency from 65000 to ≈2000 samples/s. The low pass filter (100) on the envelope has a length of 192 samples, thus 6 times the decimation rate, which suppresses the spectral aliasing.

For this comparison, as the goal was to evaluate the statistical dispersion and the dynamic, the uniform mean calculation algorithm has been selected for the calculation of the envelope means (12) for each of the bands.

Figure 42:
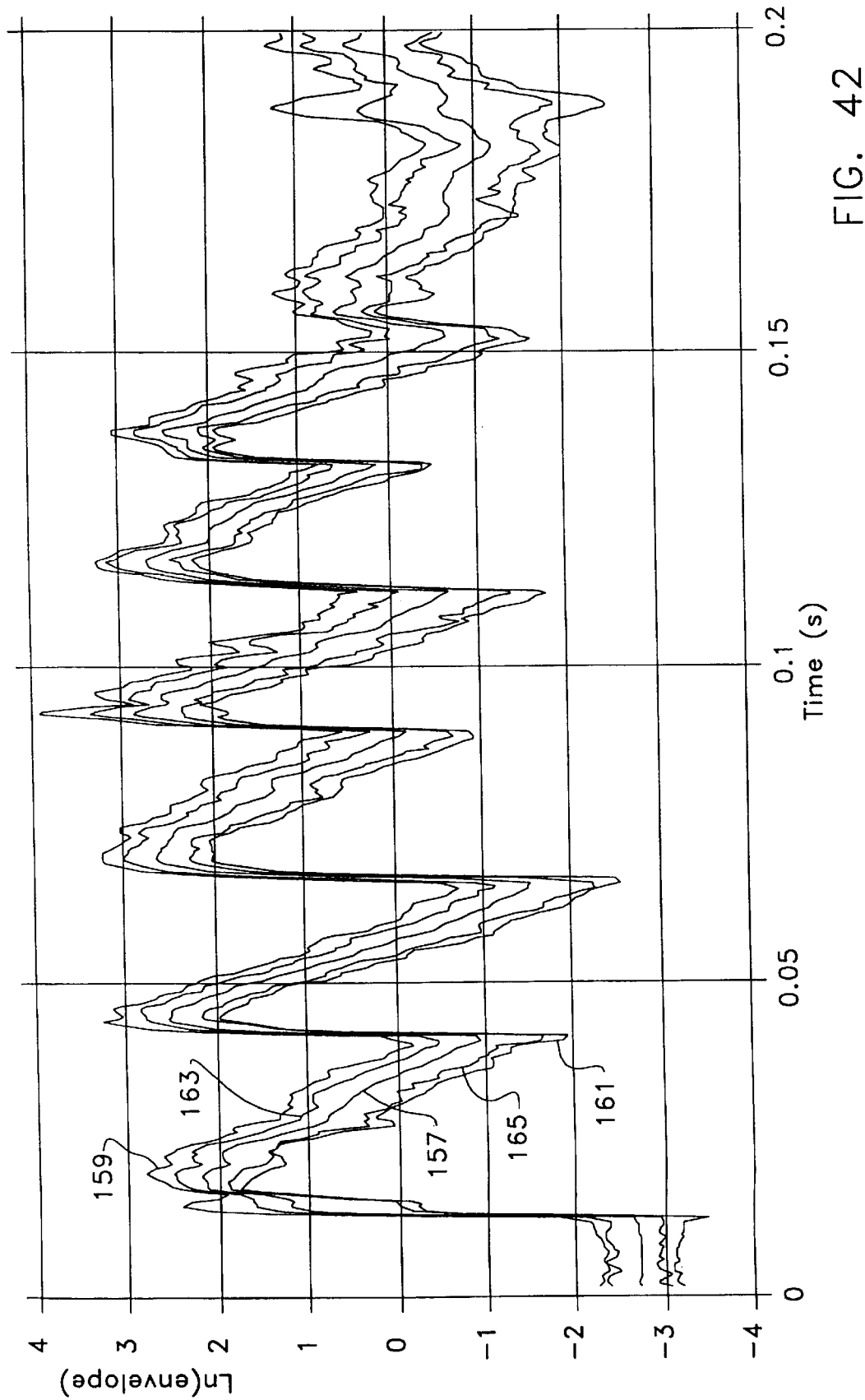
FIGS. 42 and 43 are graphs illustrating high and low frequency envelopes respectively supported by a 2 k samples/s sampling with deviations at ±3.9 σ and the extremums.
Figure 44:
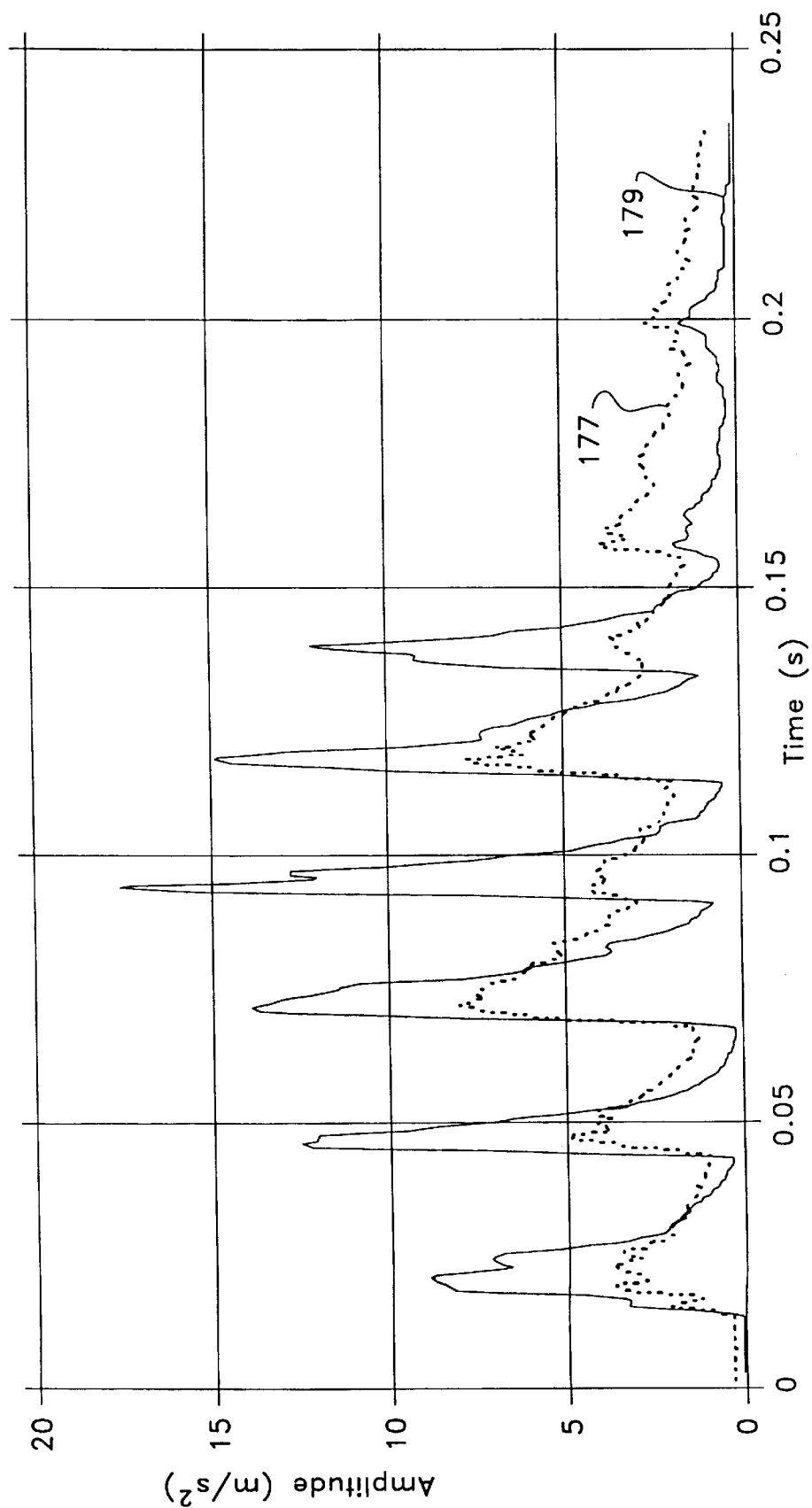
FIG. 44 is a comparative graph illustrating high and low frequency envelopes, according to the invention.

FIG. 42 shows the high frequency envelope 157 (6.4 kHz–32 kHz) supported by a sampling at 2 k samples/s with the deviations at ±3.9 sigma 159, 161 and the extremums 163, 165, whereas FIG. 43 shows the low frequency envelopes 167 (0–6.4 kHz) supported by a sampling at 2 k samples/s with the deviations at ±3.9 sigma 169, 171 and the extremums 173, 175. There appears a clear difference between these envelopes 157, 167. The high frequency signal envelope 157 exhibits a 40 dB dynamic, whereas the other envelope 167 reaches a 20 dB dynamic. Yet, a 20 dB difference means a dynamic deviation of 10, which is considerable. In fact, it could be asked whether it is required to keep the vibration signal at 120 Hz, as well as the 12 first harmonics of this signal, knowing that this contribution limits seriously the dynamic of the low frequency envelope 167. Furthermore, the operation of the tap change being not synchronous with the phase of these signals, a noise element is added, which perturbates the time realignment algorithm (10). If, in this example, the 120 Hz harmonics have not been filtered, it is because they were of low amplitudes. A high pass filter (92) can be arranged to eliminate these harmonics from the low frequency envelope calculation process. FIG. 44 shows the comparison of these envelope means on a linear scale; the low frequency envelope 177 is of a lower amplitude and of a lower absorption, in comparison with the high frequency envelope 179.

In the above-mentioned figures, the extreme deviations 163, 165, etc. observed for each envelope have been added. These extremes exceed in some places the limits ±3.9 sigma 159, 161, etc., the limit of 1:10000 for a Gaussian noise. In fact, a small number of signatures exceed this statistical limit. In the validation exercise of the monitoring algorithm, it will be observed if these excesses are repetitive and if they are time-located at the same place. The number of excesses is statistically justifiable since it concerns 40000 samples (100 signatures×400 samples/signature) regarding the ratio of 1:10000 associated to the limits ±3.9 sigma. The standard deviations of the high frequency and low frequency envelopes are almost identical (close to 6%): it is the dynamic of the high frequency envelope that makes it more sensible to a behavior deviation.

The realignment (10) of the time frame has been achieved independently for these two frequency bands. However, for the monitoring system, it is recommended to recover the result of the time realignment on the high frequency envelope and to apply it on the low frequency envelope, the high frequency envelope having a larger dynamic, allowing thereby a more accurate time realignment.

Finally, it appears that the richness of details present on the signatures at 2000 samples/s reaches or exceeds the need. Further filtration could be achieved by increasing the filter width, thus passing from a width of spectral window of 192 to 320 samples. A low pass filter (110) could then be applied on the logarithm (112) of the envelope to decimate it further. A decimation providing 1000 samples/s could be well appropriate for this signature. It is possible that it be the same for the signatures of the other tap changers.

The envelope proposed in the International application published under the number WO 97/34161 in the name of ABB Research Ltd. is a peak envelope extracted analogically. In the following comparison, an analog circuit with a RC constant set to 5 ms has been simulated (see FIG. 3) so that the decreasing exponential of this circuit is comparable to the mechanical damping present for the tested signature (optimal choice for this signal with the 0–10 kHz band). After extraction, the envelope is adjusted temporally at ±1 sample with respect to the reference signature to compensate an eventual delay between the signatures.

In addition, the envelope recommended here relies, according to the invention, upon the Hilbert transform (4) in its instantaneous power detector, this power being filtered with the convolution of a spectral window (6) and the filtered envelope is decimated (8). The width of the window is of 320 samples to simulate the same smoothing level than the RC filter, i.e. a time constant of 5 ms (320 samples/65000 samples/s). A time realignment algorithm (10) is then used to adjust the new envelope to the reference signature. The adjustment is carried out well under the distance between two samples, and this, for the delay and the slope difference of the time flow between signatures.

The envelopes have been calculated from the signal present in the 0–10 kHz band, according to the technique relative to the above-mentioned prior art circuit, though a 5–25 kHz or even a 10–30 kHz band would have been preferable in view of the studies associated to the present invention.

Figure 45:
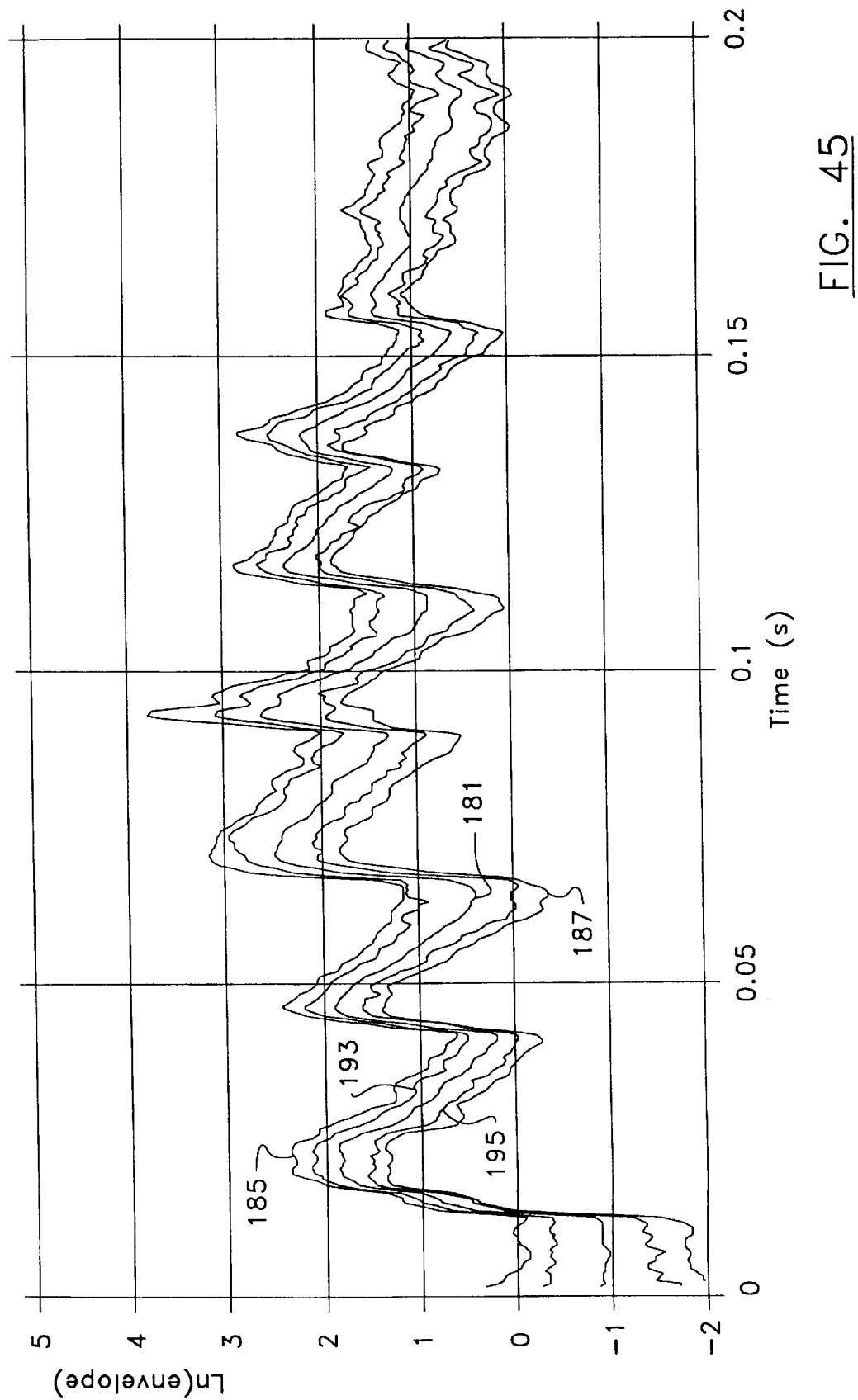
FIG. 45 is a graph illustrating envelopes in a 0–10 kHz band according to the calculation according to the invention, supported by a 2 k samples/s sampling with deviations at ±3.9 σ and the extremums.
Figure 46:
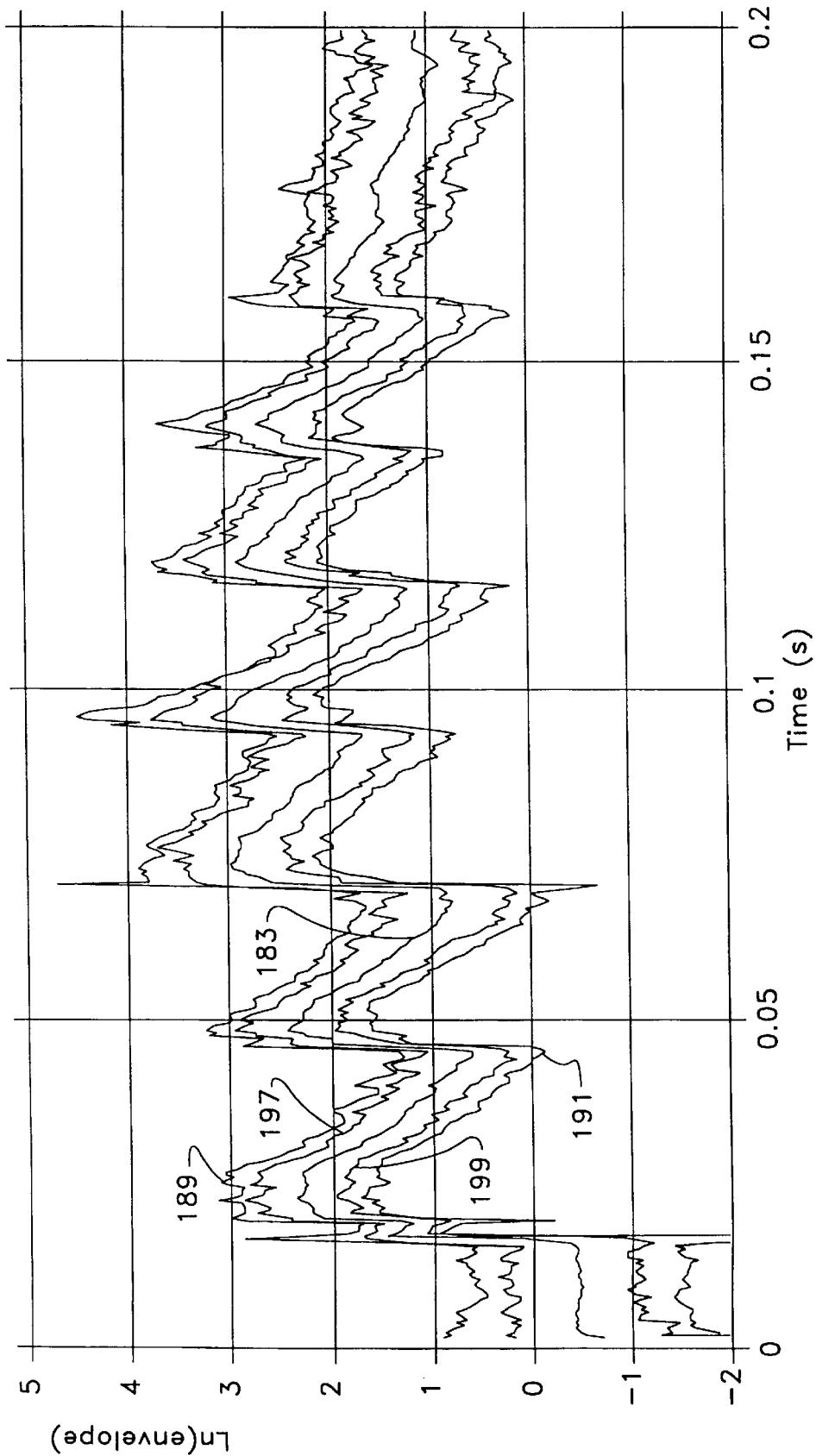
FIG. 46 is a graph illustrating envelopes in the 0–10 kHz band according to a simulation of a conventional detector, supported by a 2 k samples/s sampling with deviations at ±3.9 σ and the extremums.
Figure 47:
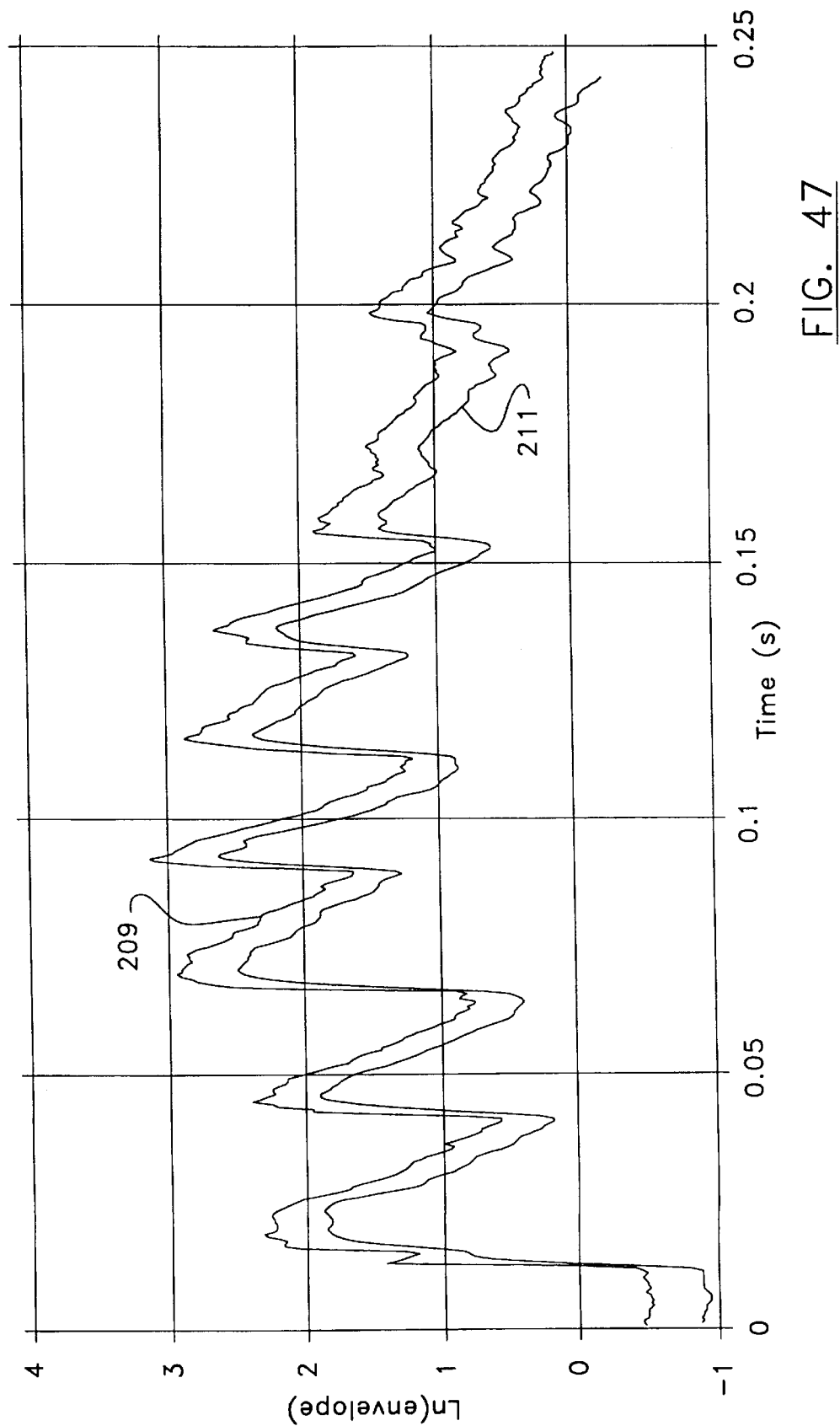
FIGS. 47 and 48 are comparative graphs between the means and the standard deviations of 0–10 kHz envelopes respectively, according to a simulation of a conventional detector and according to the present invention.
Figure 48:
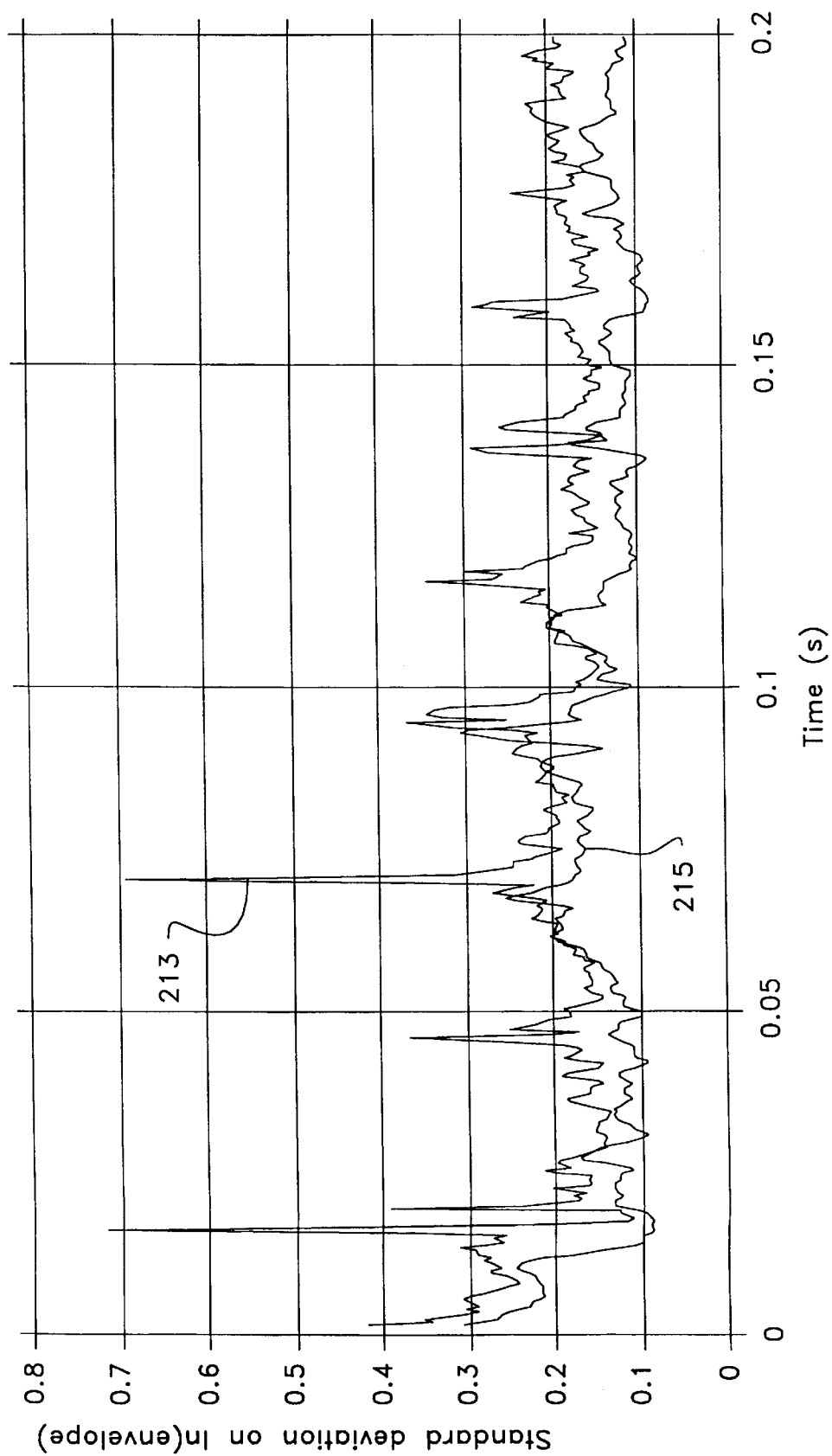

FIGS. 45 and 46 show the statistical results obtained for 100 tap changes. There is shown respectively the 0–10 kHz envelopes according to the recommended calculation 181 (FIG. 45) and according to a simulation of the prior art circuit 183 (FIG. 46), supported by a 2 k samples/s sampling with the deviations at ±3.9 sigma 185, 187, 189, 191 and the extremums 193, 195, 197, 199. The statistical dispersion with the recommended envelope 181 (FIG. 45) appears slightly reduced with respect to the envelope 183 of the prior art detector (FIG. 46). The level of details is similar on the envelope means derived from these two types of envelope calculation, as illustrated in FIG. 47 where there is shown the envelope means according to the simulation of the prior art detector 209 and according to the recommended calculation 211. It is especially the dispersion which is different as evidenced in FIG. 48, where are shown the standard deviations of 0–10 kHz envelopes according to a simulation of the prior art detector 213 and according to the recommended calculation 215. The mean difference between these standard deviations is of 38% on a logarithmic scale and of 42% on a linear scale.

The proposed approach, to carry out a sampling of the raw signal and to carry out an envelope calculation by digital processing, thus allows a flexible multiband monitoring while offering a significatively lower dispersion.

The digital calculation of the envelope of the vibro-acoustic signature by a convolutional Hilbert transform (4) provides a precision gain and a dispersion reduction that are sufficiently important to show its interest. In comparison, the peak envelope obtained analogically in the art exhibits an over 30% higher dispersion.

The phase filter 92 proposed to correct the phase dispersion seems to be unrequired to correct the vibro-acoustic signatures of tap changes. However, it is possible that this tool be indispensable in applications where the vibration source is further away from the measurement point, such when monitoring circuit breakers.

The time realignment process (10) reduces the dispersion at straights of the transient beginnings to the mean value. An important limitation of the system's algorithm disclosed in the above-mentioned PCT application is particularly the increase of the dispersion of the signature at the rises of the transients. This increase forces the user to add a filter that reduces the sensitivity of the algorithm.

Since the second order time realignment algorithm seems appropriate (constant+time slope), for the data collected actually, it has not been required to develop a third order algorithm. However, it will be possible to use a third order or higher order algorithm.

Different mean calculation algorithms have been presented, along with tools for estimating the dispersion on the signature envelope. These algorithms allow to reduce the dispersion below the stability of the measurement line; the comparisons between signatures will be even more accurate. The behavior of the signature dispersion seems in agreement with the Laplace-Gauss law and as a result, there remains only a few overflows at 3.9 times the standard deviation, thus about one for 10000 events. The monitoring algorithm must cope with these unavoidable and occasional overflows.

Different algorithms and means have been proposed to compress and decompress the signatures. It will be possible to use other means known in the art or yet to come as need be.

Referring to FIG. 1, in summary, in the working of the invention, there is achieved, using a sensor (not illustrated in the figures) such as an accelerometer, a recording of the vibro-acoustic signal emitted during the operation of the switching system under surveillance. In the case of a tap changer, a measurement of the position of the tap is achieved prior to and after the switching. For all the types of apparatus, one or many punctual noise measures, by means of the sensor, are carried out between the switching operations to quantify the noise. The interest of using an accelerometer for sensor is that it exhibits a recognized and undeniable long term stability and reliability (used for the vibration monitoring in line airplane's jet engines for more than 30 years). It is manufactured at a low cost and provides access, such as a microphone, to a variety of information at the same time close and remote, and this, from a single measure point.

According to a preferred embodiment of the invention, the vibro-acoustic signal 1 is subjected to an anti-aliasing filter 164, is sampled 166 and converted 168 digitally at a high speed with a rate varying preferably between 5000 and $10^6$ samples/s.

The dispersion of the digitized vibro-acoustic signal 3 can be corrected by means of a phase filter 92. This correction is appropriate when the source of vibration is remote from the sensor and when the signal is distorted by its path between the emission and the measurement.

Preferably, though optionally, the digitized vibro-acoustic signal 3 is separated through a band separator 170 into one or several frequency bands prior to the envelope calculation on each of these bands. If a single frequency band is used, a high pass or band pass filter 92 will then be preferably used.

The envelope is calculated, for each band, by carrying out a Hilbert transform by convolutional filter 4 to determine the instantaneous amplitude 5, and this instantaneous amplitude 5 is then filtered by convolution of an appropriate, all points positive spectral window, before finally decimating the envelope 7 by means of a decimator 8 in order to obtain a sampled envelope 9 of 100 to 100 k samples/s. A refinement consists in taking the logarithm 112 of the non-decimated envelope 7 and to apply an anti-aliasing filter 100 on this logarithm prior to decimation.

The post-processing is then carried out on the envelope or its logarithm 9.

Preferably, the envelope(s) 9 obtained after the last switching operation is/are validated by means of a correlation carried out with reference means 13A as performed by the correlator 149.

The obtained envelopes 9 are resampled by digital interpolation so that the transients found therein are aligned with the same transients in the corresponding reference envelope 13A. This action is carried out by a N order time realignment circuit 10, where N is comprised between one and the number of samples minus one. It should be noted that the zero order time realignment corresponds to an adjustment of the delay and is of common use.

By means of a calculation circuit 12, two running means are carried out from the envelopes 11. The envelopes of a mean correspond to a same switching operation. If the equipment is a tap changer (e.g. switching from the tap 6 to the tap 7), the update of each mean is calculated by recurrence by adding the last resampled envelope 11. The first running mean is called reference signature 13A and has a weight progressively decreasing with time or the number of switching operations. The second running mean is called actualized signature 13B and has a weight progressively increasing with time or the number of switching operations.

A reference standard deviation 15A on the envelope 11 and an actualized standard deviation 15B are calculated for each frequency band, and each type of switching for a tap changer.

Comparisons are carried out between the envelopes 11 of the last switching operation, the reference signatures 13A and the actualized signatures 13B in order to detect a gradual behavior change or a sudden defect, taking the noise measurements prior to and after switching as well as the standard deviation values 15A, 15B into consideration. Preferably, the observed deviations on $D_0$ and $D_1$ are also compared to detect if there is a timing defect. The comparisons can be carried out in an automatic manner by means of the comparator 14, or by visual examination by displaying the various parameters and relevant signals generated at various points in the apparatus circuit on any suitable display unit 104 provided that the user is capable to correctly interpret the information. Preferably, any defect that is likely to cause damages to the equipment under surveillance will be reported by means of a suitable alarm 104.

The parametrization of the various circuits and components of the apparatus according to the invention can be achieved through an interface provided by an appropriate software, that can process or not the display of the signals. and provide a variety of useful functions to the user, such as functions for debugging, analyzing, signal processing and storing, etc.

While embodiments of this invention have been illustrated in the accompanying drawings and described above, it will be evident to those skilled in the art that changes and modifications may be made therein without departing from the essence of this invention. All such modifications or variations are believed to be within the scope of the invention as defined by the claims appended hereto.

What is claimed is:

1. A method of processing a vibro-acoustic signal emitted by a high-voltage switching system, comprising the steps of:
   (a) converting the vibro-acoustic signal into a digital signal;
   (b) rectifying the digital signal to produce a rectified signal;
   (c) applying a convolutional filter with a spectral window on the rectified signal to produce a smoothed signal;
   (d) decimating the smoothed signal according to a predetermined decimation factor to produce a decimated signal representing an envelope of the vibro-acoustic signal;
   (e) carrying a time realignment of the decimated signal with respect to a reference signature to produce a realigned signal;
   (f) adding the realigned signal as a factor of a mean to produce the reference signature, the mean having a predetermined reference signal for initial factor;
   (g) adding the realigned signal as a factor of a mean to produce an actualized signature, the mean having the first realigned signal produced by the step (e) for initial factor;
   (h) calculating variances of the realigned signal with respect to the reference and actualized signatures; and
   (i) comparing the realigned signal with the actualized and reference signatures to detect a gradual behavior change or a sudden defect, taking the variances into consideration.

2. The method according to claim 1, wherein the step (a) comprises the steps of:
   sampling the vibro-acoustic signal to produce a sampled signal; and
   converting the sampled signal in digital values forming the digital signal.

3. The method according to claim 2, wherein the step (a) comprises the additional step of:
   passing the vibro-acoustic signal in an anti-aliasing filter prior to the sampling step.

4. The method according to claim 1, comprising the additional step of:
   passing the digital signal produced at the step (a) in a phase filter.

5. The method according to claim 4, wherein the phase filter performs a Fourier transform of the digital signal, a phase unwrapping, an angular correction by addition of a phase ramp and a reversed Fourier transform to provide a compensated digital signal.

6. The method according to claim 5, wherein the phase ramp is of a second degree.

7. The method according to claim 4, wherein the phase filter carries out a convolution of the digital signal with a chirp.

8. The method according to claim 1, comprising the additional step of:
   integrating the digital signal between the steps (a) and (b).

9. The method according to claim 1, comprising the additional step of:
   separating the digital signal produced at the step (a) in distinct frequency bands, the steps (b) to (i) being applied on each of the distinct frequency bands.

10. The method according to claim 9, comprising the additional step of:
    integrating the digital signal between the steps (a) and (b), on each of the distinct frequency bands.

11. The method according to claim 1, in which the step (b) is carried out by Hilbert transform.

12. The method according to claim 1, comprising the additional step of:
    shaping the smoothed signal produced at the step (c) by a logarithm.

13. The method according to claim 1, comprising the additional step of:
    passing the smoothed signal produced at the step (c) in an anti-aliasing filter.

14. The method according to claim 13, wherein the anti-aliasing filter carries out a filtration of a low amplitude portion at a band end of the smoothed signal.

15. The method according to claim 13, wherein the anti-aliasing filter is a low pass filter having a cut-off frequency between 50 Hz to 50 kHz with a sampling period between 10 ms to 10 $\mu$s.

16. The method according to claim 1, wherein the decimated signal produced at the step (d) has a final sampling rate comprised between 100 samples/s and 100 k samples/s.

17. The method according to claim 1, wherein the time realignment of the step (e) is carried out by an iterative process having an iterative cycle comprising the steps of:
    selecting three values of time drift of zero order and three values of time drift of first order taking, for each order of drift, an initial value and values corresponding to the initial value ±1/2 search range during a first iteration cycle, then a carry over value and values corresponding to the carry over value ±1/2 search range during next iteration cycles;
    sampling the decimated signal according to starting points set respectively by the values of drift of zero order and with a period equal to the initial value of drift of first order during the first iteration cycle then to the carry over value of drift of first order during the next iteration cycles, to produce three first sampled signals;
    interpolating the first sampled signals by a reconstruction function sin(x)/x to which a Blackman-Harris type spectral window is applied, to produce three first interpolated signals, x representing samples' positions from the first sampled signals;
    correlating the first interpolated signals with the reference signature, to produce three first correlated signals;
    determining which one of the first correlated signals has a highest correlation value of drift of zero order, the value of drift corresponding to the highest correlation value of drift of zero order becoming then the carry over value of drift of zero order for the next iteration cycle;

sampling the decimated signal according to starting points set respectively by the values of drift of first order and with a period equal to the carry over value of drift of zero order, to produce three second sampled signals;

interpolating the second sampled signals by a reconstruction function sin(x)/x to which a Blackman-Harris type spectral window is applied, to produce three second interpolated signals, x representing samples' positions from the second sampled signals;

correlating the second interpolated signals with the reference signature, to produce three second correlated signals;

determining which one of the second correlated signals has a highest correlation value of drift of first order, the value of drift corresponding to the highest correlation value of drift of first order becoming then the carry over value of drift of first order for the next iteration cycle; and dividing the search ranges of each order of drift by a predetermined factor;

if a predetermined stop criterion is reached, then resampling and interpolating the decimated signal using the carry over values of drift of zero and first order to produce the realigned signal, or else stepping back to the next iteration cycle.

18. The method according to claim 17, wherein the stop criterion is a maximum number of iterative cycles to be repeated.

19. The method according to claim 17, wherein the stop criterion is a dimension of search ranges corresponding to a desired resolution.

20. The method according to claim 17, wherein the correlating steps are carried out by simple square deviation calculation.

21. The method according to claim 17, comprising the additional step of:

separating the digital signal produced at the step (a) into distinct frequency bands, the steps (b), (c), (d), (f), (g), (h) and (i) being applied on each of the distinct frequency bands, and the iterative process of the step (e) being applied on the decimated signal. in one of the distinct frequency bands, the resampling and interpolating steps being carried out in each of the distinct frequency bands using the carry over values of drift of zero and first order obtained for said one of the distinct frequency bands.

22. The method according to claim 1, wherein the time realignment of the step (e) is carried out by multiscale correlation or by DTW.

23. The method according to claim 1, wherein the means of the steps (f) and (g) are running means.

24. The method according to claim 23, wherein the running means are updated by recurrence, the running means producing the reference and actualized signatures having respectively weight factors decreasing and increasing progressively with time or a number of realigned signals considered in the means.

25. The method according to claim 1, wherein the variances of the step (h) are updated by recurrence.

26. The method according to claim 1, wherein the step (i) comprises the steps of:

comparing the variances with each other; and generating an alarm if the variances have a deviation that exceeds a predetermined tolerance threshold.

27. The method according to claim 1, wherein the realigned signal is compared in the step (i) with the actualized and reference signatures by correlation.

28. The method according to claim 1, wherein the realigned signal is compared in the step (i) with the actualized and reference signatures by mean square deviation.

29. The method according to claim 1, comprising the additional step of:

correlating the decimated signal with one of the reference and actualized signatures, to produce a validation indicia of the vibro-acoustic signal.

30. The method according to claim 17, comprising the additional steps of:

adding-the carry over values of drift of zero and first order to respective means;

calculating standard deviations of the carry over values of drift of zero and first order with respect to the respective means;

comparing the carry over values of drift of zero and first order with the respective means, and generating an alarm as soon as one of the carry over values or one of the standard deviations exceeds a predetermined tolerance threshold.

31. The method according to claim 1, comprising the additional steps of:

decompressing the realigned signal by interpolation to produce an interpolated signal; and displaying the interpolated signal for visual analysis.

32. The method according to claim 1, comprising the additional step of:

comparing the decimated signal initially obtained with a typical signature particular to the switching system under surveillance, to detect setup and other defects when the switching system is put into service.

33. An apparatus for processing a vibro-acoustic signal emitted by a high-voltage switching system, comprising:

a converting means for converting the vibro-acoustic signal into a digital signal;

a rectifying means for rectifying the digital signal and producing a rectified signal;

a filtering means for applying a convolutional filter with a spectral window on the rectified signal and producing a smoothed signal;

a decimating means for decimating the smoothed signal according to a predetermined decimation factor and producing a decimated signal representing an envelope of the vibro-acoustic signal;

a realigning means for performing a time realignment of the decimated signal with respect to a reference signature and producing a realigned signal;

a first calculating means for adding the realigned signal as a factor of a mean to produce the reference signature, the mean having a predetermined reference signal for initial factor;

a second calculating means for adding the realigned signal as a factor of a mean to produce an actualized signature, the mean having the first realigned signal produced by the realigning means for initial factor;

a third calculating means for calculating variances of the realigned signal with respect to the reference and actualized signatures; and a comparing means for comparing the realigned signal with the actualized and reference signatures to detect a gradual behavior change or a sudden defect, taking the variances into consideration.

34. The apparatus according to claim 33, wherein the converting means comprises:
a sampler sampling the vibro-acoustic signal and producing a sampled signal; and
a converter converting the sampled signal into digital values forming the digital signal.

35. The apparatus according to claim 34, comprising:
an anti-aliasing filter through which the vibro-acoustic signal is passed, the anti-aliasing filter being coupled upstream of the sampler.

36. The apparatus according to claim 33, comprising:
a phase filter through which the digital signal is passed, the phase filter being coupled between the converting and rectifying means.

37. The apparatus according to claim 36, wherein the phase filter carries out a Fourier transform of the digital signal, a phase unwrapping, an angular correction by adding a phase ramp and a reversed Fourier transform to provide a compensated digital signal.

38. The apparatus according to claim 37, wherein the phase ramp is of a second degree.

39. The apparatus according to claim 36, wherein the phase filter carries out a convolution of the digital signal with a chirp.

40. The apparatus according to claim 33, comprising:
an integrator integrating the digital signal, the integrator being coupled between the converting and rectifying means.

41. The apparatus according to claim 33, comprising:
a separator separating the digital signal into distinct frequency bands, the separator being coupled between the converting and rectifying means, each of the distinct frequency bands being processed separately by the rectifying, filtering, decimating, realigning, calculating and comparing means.

42. The apparatus according to claim 41, comprising:
an integrator integrating the digital signal on each of the distinct frequency bands, the integrator being coupled between the separator and the rectifying means.

43. The apparatus according to claim 33, wherein the rectifying means comprises a Hilbert convolutional filter.

44. The apparatus according to claim 33, comprising:
a means coupled between the filtering and decimating means, for shaping the smoothed signal produced by the filtering means by a logarithm.

45. The apparatus according to claim 33, comprising:
an anti-aliasing filter through which the smoothed signal is passed, the anti-aliasing filter being coupled between the filtering and decimating means.

46. The apparatus according to claim 45, wherein the anti-aliasing filter carries out a filtration of a low amplitude portion at a band end of the smoothed signal.

47. The apparatus according to claim 45, wherein the anti-aliasing filter comprises a low pass filter having a cut-off frequency between 50 Hz to 50 kHz with a sampling period between 10 ms to 10 µs.

48. The apparatus according to claim 33, wherein the decimated signal produced by the decimating means has a final sampling rate comprised between 100 samples/s and 100 k samples/s.

49. The apparatus according to claim 33, wherein the realigning means carries out an iterative process having an iterative cycle and comprises:

first and second selecting means for selecting respectively three values of time drift of zero order and three values of time drift of first order taking, for each order of drift, an initial value and values corresponding to the initial value ±1/2 search range during a first iteration cycle, then a carry over value and values corresponding to the carry over value ±1/2 search range during next iteration cycles;

a sampling means for sampling the decimated signal according to starting points set respectively by the values of drift of zero order and with a period equal to the initial value of drift of first order during the first iteration cycle then to the carry over value of drift of first order during the next iteration cycles, to produce three first sampled signals;

an interpolating means for interpolating the first sampled signals by a reconstruction function sin(x)/x to which a Blackman-Harris type spectral window is applied, to produce three first interpolated signals, x representing samples' positions from the first sampled signals;

a correlating means for correlating the first interpolated signals with the reference signature, to produce three first correlated signals;

a determining means for determining which one of the first correlated signals has a highest correlation value of drift of zero order, the value of drift corresponding to the highest correlation value of drift of zero order becoming then the carry over value of drift of zero order for the next iteration cycle;

a sampling means for sampling the decimated signal according to starting points set respectively by the values of drift of first order and with a period equal to the carry over value of drift of zero order, to produce three second sampled signals;

an interpolating means for interpolating the second sampled signals by a reconstruction function sin(x)/x to which a Blackman-Harris type spectral window is applied, to produce three second interpolated signals, x representing samples' positions from the second sampled signals;

a correlating means for correlating the second interpolated signals with the reference signature, to produce three second correlated signals;

a determining means for determining which one of the second correlated signals has a highest correlation value of drift of first order, the value of drift corresponding to the highest correlation value of drift of first order becoming then the carry over value of drift of first order for the next iteration cycle;

a dividing means for dividing the search ranges of each order of drift by a predetermined factor;

an iterating means for stopping the iterative process if a stop criterion is reached, or else stepping back to the next iteration from the selecting means; and resampling and interpolating means for resampling and interpolating the decimated signal using the carry over values of drift of zero and first order to produce the realigned signal when the iterative process is stopped.

50. The apparatus according to claim 49, wherein the stop criterion is a maximum number of iterative cycles to be repeated.

51. The apparatus according to claim 49, wherein the stop criterion is a dimension of search ranges corresponding to a desired resolution.

52. The apparatus according to claim 49, wherein the correlating means performs simple square deviation calculations.

53. The apparatus according to claim 49, comprising:
a separator separating the digital signal into distinct frequency bands, the separator being coupled between the converting and rectifying means, each of the distinct frequency bands being processed separately by the rectifying, filtering, decimating, calculating and comparing means, the iterative process carried out by the realigning means being applied on the decimated signal in one of the distinct frequency bands, the resampling and interpolating means operating on each of the distinct frequency bands using the carry over values of drift of zero and first order obtained for said one of the distinct frequency bands.

54. The apparatus according to claim 33, wherein the realigning means realigns the decimated signal by a multi-scale correlation or by DTW.

55. The apparatus according to claim 33, wherein the means are running means.

56. The apparatus according to claim 55, wherein the first and second calculating means update the running means by recurrence, the running means producing the reference and actualized signatures having respectively weight factors decreasing and increasing progressively with time or a number of realigned signals considered in the means.

57. The apparatus according to claim 33, wherein the third calculating means updates the variances by recurrence.

58. The apparatus according to claim 33, wherein the comparing means compares the variances with each other and generates an alarm if the variances have a deviation that exceeds a predetermined tolerance threshold.

59. The apparatus according to claim 33, wherein the comparing means comprises a correlator that compares the realigned signal with the actualized and reference signatures.

60. The apparatus according to claim 33, wherein the comparing means compares the realigned signal with the actualized and reference signatures by mean square deviation.

61. The apparatus according to claim 33, comprising a correlator correlating the decimated signal with one of the reference and actualized signatures, the correlator being coupled between the decimating means and the first calculating means, to produce a validation indicia of the vibro-acoustic signal.

62. The apparatus according to claim 49, comprising:

a fourth calculating means for adding the carry over values of drift of zero and first order to respective means;

a fifth calculating means for calculating standard deviations of the carry over values of drift of zero and first order with respect to the respective means; and a comparing means for comparing the carry over values of drift of zero and first order with the respective means and generating an alarm as soon as one of the carry over values or one of the standard deviations exceeds a predetermined tolerance threshold.

63. The apparatus according to claim 33, comprising:

a means for decompressing the realigned signal by interpolation to produce an interpolated signal; and a means for displaying the interpolated signal for visual analysis.

64. The apparatus according to claim 33, comprising:

a means for comparing the decimated signal initially obtained with a typical signature particular to the switching system under surveillance, for detecting setup and other defects when the switching system is put into service.

* * * * *